(12) United States Patent
Laughton et al.

(10) Patent No.: US 11,902,375 B2
(45) Date of Patent: *Feb. 13, 2024

(54) SYSTEMS AND METHODS OF CONFIGURING A BUILDING MANAGEMENT SYSTEM

(71) Applicant: Johnson Controls Tyco IP Holdings LLP, Milwaukee, WI (US)

(72) Inventors: Terrill R. Laughton, Lake Forest, IL (US); Vineet Binodshanker Sinha, Brookfield, WI (US); Mike Sheffer, Milwaukee, WI (US); Todd A. Dishman, Milwaukee, WI (US); Karl F. Reichenberger, Mequon, WI (US)

(73) Assignee: JOHNSON CONTROLS TYCO IP HOLDINGS LLP, Milwaukee, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/688,048

(22) Filed: Mar. 7, 2022

(65) Prior Publication Data

US 2022/0303339 A1    Sep. 22, 2022

Related U.S. Application Data

(63) Continuation of application No. 17/324,966, filed on May 19, 2021, now Pat. No. 11,272,011.
(Continued)

(51) Int. Cl.
*H04L 29/08* (2006.01)
*H04L 67/12* (2022.01)
(Continued)

(52) U.S. Cl.
CPC .............. *H04L 67/12* (2013.01); *G05B 15/02* (2013.01); *G05B 17/02* (2013.01);
(Continued)

(58) Field of Classification Search
CPC ........ H04L 67/12; G16Y 30/00; G16Y 40/20; G16Y 40/35; G06K 9/6256; G06N 3/08
See application file for complete search history.

(56) References Cited

U.S. PATENT DOCUMENTS 5,301,109 A    4/1994 Landauer et al.
5,446,677 A    8/1995 Jensen et al.
(Continued)

FOREIGN PATENT DOCUMENTS

AU    2019226217 A1    11/2020
AU    2019226264 A1    11/2020
(Continued)

OTHER PUBLICATIONS

Huynh et al., "OpenRefine: A free, open source, powerful tool for working with messy data," URL: https://openrefine.org/, retrieved Feb. 11, 2021, 4 pages.
(Continued)

*Primary Examiner* — Kim T Nguyen
(74) *Attorney, Agent, or Firm* — Foley & Lardner LLP

(57) ABSTRACT

A system for commissioning a model, comprising one or more processing circuits configured to identify a first plurality of data points in the building, automatically tag at least a portion of the first plurality of data points with one or more first tags using context data extracted from and/or associated with the data points, the one or more entities comprising one or more of building equipment, building spaces, people, or events, identify at least one of the first plurality of data points for manual review and generate one or more suggested tags for the at least one data point, receive feedback from the manual review, and receive a second plurality of data points in the building and automatically tag at least a
(Continued)

portion of the second plurality of data points with one or more second tags using the feedback from the manual review.

20 Claims, 18 Drawing Sheets

Related U.S. Application Data

(60) Provisional application No. 63/108,137, filed on Oct. 30, 2020.

(51) Int. Cl.
| | |
|---|---|
| *G16Y 40/20* | (2020.01) |
| *G16Y 30/00* | (2020.01) |
| *G16Y 40/35* | (2020.01) |
| *G06N 3/08* | (2023.01) |
| *G06N 20/00* | (2019.01) |
| *G06F 16/28* | (2019.01) |
| *G06F 16/901* | (2019.01) |
| *G05B 15/02* | (2006.01) |
| *G06F 16/21* | (2019.01) |
| *G06F 30/13* | (2020.01) |
| *G06F 16/9038* | (2019.01) |
| *G05B 17/02* | (2006.01) |
| *G06F 3/04815* | (2022.01) |
| *G06F 18/23* | (2023.01) |
| *G06F 18/213* | (2023.01) |
| *G06F 18/214* | (2023.01) |

(52) U.S. Cl.
CPC ........ *G06F 3/04815* (2013.01); *G06F 16/219* (2019.01); *G06F 16/285* (2019.01); *G06F 16/9024* (2019.01); *G06F 16/9038* (2019.01); *G06F 18/213* (2023.01); *G06F 18/214* (2023.01); *G06F 18/23* (2023.01); *G06F 30/13* (2020.01); *G06N 3/08* (2013.01); *G06N 20/00* (2019.01); *G16Y 30/00* (2020.01); *G16Y 40/20* (2020.01); *G16Y 40/35* (2020.01)

(56) References Cited

U.S. PATENT DOCUMENTS

| | | | |
|---|---|---|---|
| 5,581,478 A | 12/1996 | Cruse et al. |
| 5,812,962 A | 9/1998 | Kovac |
| 5,960,381 A | 9/1999 | Singers et al. |
| 5,973,662 A | 10/1999 | Singers et al. |
| 6,014,612 A | 1/2000 | Larson et al. |
| 6,031,547 A | 2/2000 | Kennedy |
| 6,134,511 A | 10/2000 | Subbarao |
| 6,157,943 A | 12/2000 | Meyer |
| 6,285,966 B1 | 9/2001 | Brown et al. |
| 6,363,422 B1 | 3/2002 | Hunter et al. |
| 6,385,510 B1 | 5/2002 | Hoog et al. |
| 6,389,331 B1 | 5/2002 | Jensen et al. |
| 6,401,027 B1 | 6/2002 | Xu et al. |
| 6,437,691 B1 | 8/2002 | Sandelman et al. |
| 6,477,518 B1 | 11/2002 | Li et al. |
| 6,487,457 B1 | 11/2002 | Hull et al. |
| 6,493,755 B1 | 12/2002 | Hansen et al. |
| 6,577,323 B1 | 6/2003 | Jamieson et al. |
| 6,626,366 B2 | 9/2003 | Yahara et al. |
| 6,646,660 B1 | 11/2003 | Patty |
| 6,704,016 B1 | 3/2004 | Oliver et al. |
| 6,732,540 B2 | 5/2004 | Sugihara et al. |
| 6,764,019 B1 | 7/2004 | Kayahara et al. |
| 6,782,385 B2 | 8/2004 | Natsumeda et al. |
| 6,813,532 B2 | 11/2004 | Eryurek et al. |
| 6,816,811 B2 | 11/2004 | Seem |
| 6,823,680 B2 | 11/2004 | Jayanth |
| 6,826,454 B2 | 11/2004 | Sulfstede |
| 6,865,511 B2 | 3/2005 | Frerichs et al. |
| 6,925,338 B2 | 8/2005 | Eryurek et al. |
| 6,986,138 B1 | 1/2006 | Sakaguchi et al. |
| 7,031,880 B1 | 4/2006 | Seem et al. |
| 7,401,057 B2 | 7/2008 | Eder |
| 7,552,467 B2 | 6/2009 | Lindsay |
| 7,627,544 B2 | 12/2009 | Chkodrov et al. |
| 7,818,249 B2 | 10/2010 | Lovejoy et al. |
| 7,889,051 B1 | 2/2011 | Billig et al. |
| 7,996,488 B1 | 8/2011 | Casabella et al. |
| 8,078,330 B2 | 12/2011 | Brickfield et al. |
| 8,104,044 B1 | 1/2012 | Scofield et al. |
| 8,145,995 B2 | 3/2012 | Rohrabaugh et al. |
| 8,229,470 B1 | 7/2012 | Ranjan et al. |
| 8,401,991 B2 | 3/2013 | Wu et al. |
| 8,495,745 B1 | 7/2013 | Schrecker et al. |
| 8,516,016 B2 | 8/2013 | Park et al. |
| 8,525,828 B1 | 9/2013 | Bates |
| 8,532,808 B2 | 9/2013 | Drees et al. |
| 8,532,839 B2 | 9/2013 | Drees et al. |
| 8,600,556 B2 | 12/2013 | Nesler et al. |
| 8,635,182 B2 | 1/2014 | MacKay |
| 8,682,921 B2 | 3/2014 | Park et al. |
| 8,731,724 B2 | 5/2014 | Drees et al. |
| 8,737,334 B2 | 5/2014 | Ahn et al. |
| 8,738,334 B2 | 5/2014 | Jiang et al. |
| 8,751,487 B2 | 6/2014 | Byrne et al. |
| 8,788,097 B2 | 7/2014 | Drees et al. |
| 8,805,995 B1 | 8/2014 | Oliver |
| 8,843,238 B2 | 9/2014 | Wenzel et al. |
| 8,874,071 B2 | 10/2014 | Sherman et al. |
| 8,941,465 B2 | 1/2015 | Pineau et al. |
| 8,990,127 B2 | 3/2015 | Taylor |
| 9,070,113 B2 | 6/2015 | Shafiee et al. |
| 9,116,978 B2 | 8/2015 | Park et al. |
| 9,185,095 B1 | 11/2015 | Moritz et al. |
| 9,189,527 B2 | 11/2015 | Park et al. |
| 9,196,009 B2 | 11/2015 | Drees et al. |
| 9,229,966 B2 | 1/2016 | Aymeloglu et al. |
| 9,286,582 B2 | 3/2016 | Drees et al. |
| 9,311,807 B2 | 4/2016 | Schultz et al. |
| 9,344,751 B1 | 5/2016 | Ream et al. |
| 9,354,968 B2 | 5/2016 | Wenzel et al. |
| 9,447,985 B2 | 9/2016 | Johnson |
| 9,507,686 B2 | 11/2016 | Horn et al. |
| 9,524,594 B2 | 12/2016 | Ouyang et al. |
| 9,558,196 B2 | 1/2017 | Johnston et al. |
| 9,652,813 B2 | 5/2017 | Gifford et al. |
| 9,703,276 B2 | 7/2017 | Piaskowski et al. |
| 9,753,455 B2 | 9/2017 | Drees |
| 9,811,249 B2 | 11/2017 | Chen et al. |
| 9,838,844 B2 | 12/2017 | Emeis et al. |
| 9,886,478 B2 | 2/2018 | Mukherjee |
| 9,948,359 B2 | 4/2018 | Horton |
| 10,055,114 B2 | 8/2018 | Shah et al. |
| 10,055,206 B2 | 8/2018 | Park et al. |
| 10,116,461 B2 | 10/2018 | Fairweather et al. |
| 10,139,792 B2 | 11/2018 | Schmitt et al. |
| 10,149,141 B1 | 12/2018 | Stamatakis et al. |
| 10,169,454 B2 | 1/2019 | Ait-Mokhtar et al. |
| 10,171,297 B2 | 1/2019 | Stewart et al. |
| 10,171,586 B2 | 1/2019 | Shaashua et al. |
| 10,187,258 B2 | 1/2019 | Nagesh et al. |
| 10,345,772 B2 | 7/2019 | Piaskowski et al. |
| 10,514,963 B2 | 12/2019 | Shrivastava et al. |
| 10,515,098 B2 | 12/2019 | Park et al. |
| 10,527,306 B2 | 1/2020 | Boettcher et al. |
| 10,534,326 B2 | 1/2020 | Sridharan et al. |
| 10,536,295 B2 | 1/2020 | Fairweather et al. |
| 10,558,183 B2 | 2/2020 | Piaskowski et al. |
| 10,564,993 B2 | 2/2020 | Deutsch et al. |
| 10,649,419 B2 | 5/2020 | Asp et al. |
| 10,659,919 B1 | 5/2020 | Li et al. |
| 10,684,033 B2 | 6/2020 | Sinha et al. |
| 10,705,492 B2 | 7/2020 | Harvey |
| 10,708,078 B2 | 7/2020 | Harvey |
| 10,739,733 B1 | 8/2020 | Saxena et al. |
| 10,760,815 B2 | 9/2020 | Janakiraman et al. |

(56) References Cited

U.S. PATENT DOCUMENTS

| | | | |
|---|---|---|---|
| 10,762,475 B2 | 9/2020 | Song et al. |
| 10,775,988 B2 | 9/2020 | Narain et al. |
| 10,798,175 B1 * | 10/2020 | Knight | H04L 67/12 |
| 10,824,120 B2 | 11/2020 | Ahmed |
| 10,845,771 B2 | 11/2020 | Harvey |
| 10,853,717 B2 | 12/2020 | Abramson et al. |
| 10,854,194 B2 | 12/2020 | Park et al. |
| 10,862,928 B1 | 12/2020 | Badawy et al. |
| 10,871,756 B2 | 12/2020 | Johnson et al. |
| 10,908,578 B2 | 2/2021 | Johnson et al. |
| 10,921,760 B2 | 2/2021 | Harvey |
| 10,921,768 B2 | 2/2021 | Johnson et al. |
| 10,921,972 B2 | 2/2021 | Park et al. |
| 10,921,973 B2 | 2/2021 | Park et al. |
| 10,956,842 B2 | 3/2021 | Wenzel et al. |
| 10,969,133 B2 | 4/2021 | Harvey |
| 10,986,121 B2 | 4/2021 | Stockdale et al. |
| 11,016,998 B2 | 5/2021 | Park et al. |
| 11,024,292 B2 | 6/2021 | Park et al. |
| 11,038,709 B2 | 6/2021 | Park et al. |
| 11,041,650 B2 | 6/2021 | Li et al. |
| 11,049,317 B2 | 6/2021 | Besecker et al. |
| 11,054,796 B2 | 7/2021 | Holaso |
| 11,070,390 B2 | 7/2021 | Park et al. |
| 11,073,976 B2 | 7/2021 | Park et al. |
| 11,108,587 B2 | 8/2021 | Park et al. |
| 11,113,295 B2 | 9/2021 | Park et al. |
| 11,156,978 B2 | 10/2021 | Johnson et al. |
| 11,190,578 B2 | 11/2021 | Kitchen et al. |
| 11,221,601 B1 | 1/2022 | Chakraborty et al. |
| 11,229,138 B1 | 1/2022 | Harvey et al. |
| 11,272,011 B1 * | 3/2022 | Laughton | G06N 3/08 |
| 11,275,870 B2 | 3/2022 | Diguet et al. |
| 11,314,726 B2 | 4/2022 | Park et al. |
| 11,314,788 B2 | 4/2022 | Park et al. |
| 11,473,804 B2 | 10/2022 | Chen et al. |
| 11,499,738 B2 | 11/2022 | Ratakonda et al. |
| 11,556,105 B2 | 1/2023 | Cooley et al. |
| 11,561,522 B2 | 1/2023 | Cooley et al. |
| 11,561,523 B2 | 1/2023 | Cooley et al. |
| 11,573,551 B2 | 2/2023 | Cooley et al. |
| 11,586,167 B2 | 2/2023 | Cooley et al. |
| 2002/0010562 A1 | 1/2002 | Schleiss et al. |
| 2002/0016639 A1 | 2/2002 | Smith et al. |
| 2002/0059229 A1 | 5/2002 | Natsumeda et al. |
| 2002/0091738 A1 | 7/2002 | Rohrabaugh et al. |
| 2002/0123864 A1 | 9/2002 | Eryurek et al. |
| 2002/0147506 A1 | 10/2002 | Eryurek et al. |
| 2002/0177909 A1 | 11/2002 | Fu et al. |
| 2003/0005486 A1 | 1/2003 | Ridolfo et al. |
| 2003/0014130 A1 | 1/2003 | Grumelart |
| 2003/0073432 A1 | 4/2003 | Meade, II |
| 2003/0158704 A1 | 8/2003 | Triginai et al. |
| 2003/0171851 A1 | 9/2003 | Brickfield et al. |
| 2003/0200059 A1 | 10/2003 | Ignatowski et al. |
| 2004/0068390 A1 | 4/2004 | Saunders |
| 2004/0128314 A1 | 7/2004 | Katibah et al. |
| 2004/0133314 A1 | 7/2004 | Ehlers et al. |
| 2004/0199360 A1 | 10/2004 | Friman et al. |
| 2005/0055308 A1 | 3/2005 | Meyer et al. |
| 2005/0108262 A1 | 5/2005 | Fawcett et al. |
| 2005/0131657 A1 | 6/2005 | Sean Mei |
| 2005/0154494 A1 | 7/2005 | Ahmed |
| 2005/0278703 A1 | 12/2005 | Lo et al. |
| 2005/0283337 A1 | 12/2005 | Sayal |
| 2006/0095521 A1 | 5/2006 | Patinkin |
| 2006/0140207 A1 | 6/2006 | Eschbach et al. |
| 2006/0184479 A1 | 8/2006 | Levine |
| 2006/0200476 A1 | 9/2006 | Gottumukkala et al. |
| 2006/0265751 A1 | 11/2006 | Cosquer et al. |
| 2006/0271589 A1 | 11/2006 | Horowitz et al. |
| 2007/0028179 A1 | 2/2007 | Levin et al. |
| 2007/0203693 A1 | 8/2007 | Estes |
| 2007/0261062 A1 | 11/2007 | Bansal et al. |
| 2007/0273497 A1 | 11/2007 | Kuroda et al. |
| 2007/0273610 A1 | 11/2007 | Baillot |
| 2008/0034425 A1 | 2/2008 | Overcash et al. |
| 2008/0094230 A1 | 4/2008 | Mock et al. |
| 2008/0097816 A1 | 4/2008 | Freire et al. |
| 2008/0186160 A1 | 8/2008 | Kim et al. |
| 2008/0249756 A1 | 10/2008 | Chaisuparasmikul |
| 2008/0252723 A1 | 10/2008 | Park |
| 2008/0281472 A1 | 11/2008 | Podgorny et al. |
| 2009/0195349 A1 | 8/2009 | Frader-Thompson et al. |
| 2010/0045439 A1 | 2/2010 | Tak et al. |
| 2010/0058248 A1 | 3/2010 | Park |
| 2010/0131533 A1 | 5/2010 | Ortiz |
| 2010/0262313 A1 | 10/2010 | Chambers et al. |
| 2010/0274366 A1 | 10/2010 | Fata et al. |
| 2010/0281387 A1 | 11/2010 | Holland et al. |
| 2010/0286937 A1 | 11/2010 | Hedley et al. |
| 2010/0324962 A1 | 12/2010 | Nesler et al. |
| 2011/0015802 A1 | 1/2011 | Imes |
| 2011/0047418 A1 | 2/2011 | Drees et al. |
| 2011/0061015 A1 | 3/2011 | Drees et al. |
| 2011/0071685 A1 | 3/2011 | Huneycutt et al. |
| 2011/0077950 A1 | 3/2011 | Hughston |
| 2011/0087650 A1 | 4/2011 | MacKay et al. |
| 2011/0087988 A1 | 4/2011 | Ray et al. |
| 2011/0088000 A1 | 4/2011 | MacKay |
| 2011/0125737 A1 | 5/2011 | Pothering et al. |
| 2011/0137853 A1 | 6/2011 | MacKay |
| 2011/0153603 A1 | 6/2011 | Adiba et al. |
| 2011/0154363 A1 | 6/2011 | Karmarkar |
| 2011/0157357 A1 | 6/2011 | Weisensale et al. |
| 2011/0178977 A1 | 7/2011 | Drees |
| 2011/0191343 A1 | 8/2011 | Heaton et al. |
| 2011/0205022 A1 | 8/2011 | Cavallaro et al. |
| 2011/0218777 A1 | 9/2011 | Chen et al. |
| 2012/0011126 A1 | 1/2012 | Park et al. |
| 2012/0011141 A1 | 1/2012 | Park et al. |
| 2012/0022698 A1 | 1/2012 | MacKay |
| 2012/0062577 A1 | 3/2012 | Nixon |
| 2012/0064923 A1 | 3/2012 | Imes et al. |
| 2012/0083930 A1 | 4/2012 | Ilic et al. |
| 2012/0100825 A1 | 4/2012 | Sherman et al. |
| 2012/0101637 A1 | 4/2012 | Imes et al. |
| 2012/0135759 A1 | 5/2012 | Imes et al. |
| 2012/0136485 A1 | 5/2012 | Weber et al. |
| 2012/0143516 A1 | 6/2012 | Mezic et al. |
| 2012/0158633 A1 | 6/2012 | Eder |
| 2012/0259583 A1 | 10/2012 | Noboa et al. |
| 2012/0272228 A1 | 10/2012 | Marndi et al. |
| 2012/0278051 A1 | 11/2012 | Jiang et al. |
| 2012/0310602 A1 | 12/2012 | Jacobi et al. |
| 2013/0007063 A1 | 1/2013 | Kalra et al. |
| 2013/0038430 A1 | 2/2013 | Blower et al. |
| 2013/0038707 A1 | 2/2013 | Cunningham et al. |
| 2013/0060820 A1 | 3/2013 | Bulusu et al. |
| 2013/0086497 A1 | 4/2013 | Ambuhl et al. |
| 2013/0097706 A1 | 4/2013 | Titonis et al. |
| 2013/0103221 A1 | 4/2013 | Raman et al. |
| 2013/0167035 A1 | 6/2013 | Imes et al. |
| 2013/0170710 A1 | 7/2013 | Kuoch et al. |
| 2013/0204836 A1 | 8/2013 | Choi et al. |
| 2013/0246916 A1 | 9/2013 | Reimann et al. |
| 2013/0247205 A1 | 9/2013 | Schrecker et al. |
| 2013/0257850 A1 | 10/2013 | Chen et al. |
| 2013/0262035 A1 | 10/2013 | Mills |
| 2013/0275174 A1 | 10/2013 | Bennett et al. |
| 2013/0275908 A1 | 10/2013 | Reichard |
| 2013/0297050 A1 | 11/2013 | Reichard et al. |
| 2013/0298244 A1 | 11/2013 | Kumar et al. |
| 2013/0303193 A1 | 11/2013 | Dharwada et al. |
| 2013/0331995 A1 | 12/2013 | Rosen |
| 2013/0338970 A1 | 12/2013 | Reghetti |
| 2014/0018940 A1 * | 1/2014 | Casilli | G05B 13/048 |
| | | | 700/29 |
| 2014/0032506 A1 | 1/2014 | Hoey et al. |
| 2014/0035726 A1 | 2/2014 | Schoner et al. |
| 2014/0059483 A1 | 2/2014 | Mairs et al. |
| 2014/0081652 A1 | 3/2014 | Klindworth |
| 2014/0135952 A1 | 5/2014 | Maehara |
| 2014/0152651 A1 | 6/2014 | Chen et al. |

(56) References Cited

U.S. PATENT DOCUMENTS

| | | |
|---|---|---|
| 2014/0172184 A1 | 6/2014 | Schmidt et al. |
| 2014/0180646 A1 | 6/2014 | Diguet et al. |
| 2014/0189861 A1 | 7/2014 | Gupta et al. |
| 2014/0207282 A1 | 7/2014 | Angle et al. |
| 2014/0258052 A1 | 9/2014 | Khuti et al. |
| 2014/0269614 A1 | 9/2014 | Maguire et al. |
| 2014/0277765 A1 | 9/2014 | Karimi et al. |
| 2014/0278461 A1 | 9/2014 | Artz |
| 2014/0327555 A1 | 11/2014 | Sager et al. |
| 2014/0327670 A1 | 11/2014 | Chen et al. |
| 2015/0019174 A1 | 1/2015 | Kiff et al. |
| 2015/0042240 A1 | 2/2015 | Aggarwal et al. |
| 2015/0105917 A1 | 4/2015 | Sasaki et al. |
| 2015/0145468 A1 | 5/2015 | Ma et al. |
| 2015/0156031 A1 | 6/2015 | Fadell et al. |
| 2015/0168931 A1 | 6/2015 | Jin |
| 2015/0172300 A1 | 6/2015 | Cochenour |
| 2015/0178421 A1 | 6/2015 | Borrelli et al. |
| 2015/0185261 A1 | 7/2015 | Frader-Thompson et al. |
| 2015/0186777 A1 | 7/2015 | Lecue et al. |
| 2015/0202962 A1 | 7/2015 | Habashima et al. |
| 2015/0204563 A1 | 7/2015 | Imes et al. |
| 2015/0235267 A1 | 8/2015 | Steube et al. |
| 2015/0241895 A1 | 8/2015 | Lu et al. |
| 2015/0244730 A1 | 8/2015 | Vu et al. |
| 2015/0244732 A1 | 8/2015 | Golshan et al. |
| 2015/0261863 A1 | 9/2015 | Dey et al. |
| 2015/0263900 A1 | 9/2015 | Polyakov et al. |
| 2015/0286969 A1 | 10/2015 | Warner et al. |
| 2015/0295796 A1 | 10/2015 | Hsiao et al. |
| 2015/0304193 A1 | 10/2015 | Ishii et al. |
| 2015/0316918 A1 | 11/2015 | Schleiss et al. |
| 2015/0324422 A1 | 11/2015 | Elder |
| 2015/0341212 A1 | 11/2015 | Hsiao et al. |
| 2015/0348417 A1 | 12/2015 | Ignaczak et al. |
| 2015/0379080 A1 | 12/2015 | Jochimski |
| 2016/0011753 A1 | 1/2016 | McFarland et al. |
| 2016/0033946 A1 | 2/2016 | Zhu et al. |
| 2016/0035246 A1 | 2/2016 | Curtis |
| 2016/0065601 A1 | 3/2016 | Gong et al. |
| 2016/0070736 A1 | 3/2016 | Swan et al. |
| 2016/0078229 A1 | 3/2016 | Gong et al. |
| 2016/0090839 A1 | 3/2016 | Stolarczyk |
| 2016/0119434 A1 | 4/2016 | Dong et al. |
| 2016/0127712 A1 | 5/2016 | Alfredsson et al. |
| 2016/0139752 A1 | 5/2016 | Shim et al. |
| 2016/0163186 A1 | 6/2016 | Davidson et al. |
| 2016/0170390 A1 | 6/2016 | Xie et al. |
| 2016/0171862 A1 | 6/2016 | Das et al. |
| 2016/0173816 A1 | 6/2016 | Huenerfauth et al. |
| 2016/0179315 A1 | 6/2016 | Sarao et al. |
| 2016/0179342 A1 | 6/2016 | Sarao et al. |
| 2016/0179990 A1 | 6/2016 | Sarao et al. |
| 2016/0195856 A1 | 7/2016 | Spero |
| 2016/0212165 A1 | 7/2016 | Singla et al. |
| 2016/0239660 A1 | 8/2016 | Azvine et al. |
| 2016/0239756 A1 | 8/2016 | Aggour et al. |
| 2016/0247129 A1 | 8/2016 | Song et al. |
| 2016/0260063 A1 | 9/2016 | Harris et al. |
| 2016/0266771 A1 | 9/2016 | Kittredge et al. |
| 2016/0305678 A1 | 10/2016 | Pavlovski et al. |
| 2016/0313751 A1 | 10/2016 | Risbeck et al. |
| 2016/0313752 A1 | 10/2016 | Przybylski |
| 2016/0313902 A1 | 10/2016 | Hill et al. |
| 2016/0350364 A1 | 12/2016 | Anicic et al. |
| 2016/0357521 A1 | 12/2016 | Zhang et al. |
| 2016/0357828 A1 | 12/2016 | Tobin et al. |
| 2016/0358432 A1 | 12/2016 | Branscomb et al. |
| 2016/0363336 A1 | 12/2016 | Roth et al. |
| 2016/0370258 A1 | 12/2016 | Perez |
| 2016/0378306 A1 | 12/2016 | Kresl et al. |
| 2016/0379326 A1 | 12/2016 | Chan-Gove et al. |
| 2017/0006135 A1 | 1/2017 | Siebel |
| 2017/0011318 A1 | 1/2017 | Vigano et al. |
| 2017/0017221 A1 | 1/2017 | Lamparter et al. |
| 2017/0039255 A1 | 2/2017 | Raj et al. |
| 2017/0046012 A1 | 2/2017 | Han et al. |
| 2017/0052536 A1 | 2/2017 | Warner et al. |
| 2017/0053441 A1 | 2/2017 | Nadumane et al. |
| 2017/0063894 A1 | 3/2017 | Muddu et al. |
| 2017/0068409 A1 | 3/2017 | Nair |
| 2017/0070775 A1 | 3/2017 | Taxier et al. |
| 2017/0075984 A1 | 3/2017 | Deshpande et al. |
| 2017/0084168 A1 | 3/2017 | Janchookiat |
| 2017/0090437 A1 | 3/2017 | Veeramani et al. |
| 2017/0090441 A1 | 3/2017 | Schmitt et al. |
| 2017/0093700 A1 | 3/2017 | Gilley et al. |
| 2017/0098086 A1 | 4/2017 | Hoernecke et al. |
| 2017/0103327 A1 | 4/2017 | Penilla et al. |
| 2017/0103403 A1 | 4/2017 | Chu et al. |
| 2017/0115642 A1 | 4/2017 | Sridharan et al. |
| 2017/0123389 A1 | 5/2017 | Baez et al. |
| 2017/0134415 A1 | 5/2017 | Muddu et al. |
| 2017/0177715 A1 | 6/2017 | Chang et al. |
| 2017/0180147 A1 | 6/2017 | Brandman et al. |
| 2017/0188216 A1 | 6/2017 | Koskas et al. |
| 2017/0208151 A1 | 7/2017 | Gil et al. |
| 2017/0212482 A1 | 7/2017 | Boettcher et al. |
| 2017/0212668 A1 | 7/2017 | Shah et al. |
| 2017/0220641 A1 | 8/2017 | Chi et al. |
| 2017/0230930 A1 | 8/2017 | Frey |
| 2017/0235817 A1 | 8/2017 | Deodhar et al. |
| 2017/0251182 A1 | 8/2017 | Siminoff et al. |
| 2017/0270124 A1 | 9/2017 | Nagano et al. |
| 2017/0277769 A1 | 9/2017 | Pasupathy et al. |
| 2017/0278003 A1 | 9/2017 | Liu |
| 2017/0294132 A1 | 10/2017 | Colmenares |
| 2017/0300214 A1 | 10/2017 | Roundtree |
| 2017/0315522 A1 | 11/2017 | Kwon et al. |
| 2017/0315697 A1 | 11/2017 | Jacobson et al. |
| 2017/0322534 A1 | 11/2017 | Sinha et al. |
| 2017/0323389 A1 | 11/2017 | Vavrasek |
| 2017/0329289 A1 | 11/2017 | Kohn et al. |
| 2017/0329292 A1 | 11/2017 | Piaskowski et al. |
| 2017/0336770 A1 | 11/2017 | MacMillan |
| 2017/0345287 A1 | 11/2017 | Fuller et al. |
| 2017/0351957 A1 | 12/2017 | Lecue et al. |
| 2017/0357225 A1 | 12/2017 | Asp et al. |
| 2017/0357490 A1 | 12/2017 | Park et al. |
| 2017/0357738 A1 | 12/2017 | Garske et al. |
| 2017/0357908 A1 | 12/2017 | Cabadi et al. |
| 2018/0011620 A1 | 1/2018 | Troy et al. |
| 2018/0012159 A1 | 1/2018 | Kozloski et al. |
| 2018/0013579 A1 | 1/2018 | Fairweather et al. |
| 2018/0024520 A1 | 1/2018 | Sinha et al. |
| 2018/0039238 A1 | 2/2018 | Gartner et al. |
| 2018/0046173 A1 | 2/2018 | Ahmed |
| 2018/0048485 A1 | 2/2018 | Pelton et al. |
| 2018/0069932 A1 | 3/2018 | Tiwari et al. |
| 2018/0088789 A1 | 3/2018 | Han et al. |
| 2018/0114140 A1 | 4/2018 | Chen et al. |
| 2018/0137288 A1 | 5/2018 | Polyakov |
| 2018/0157930 A1 | 6/2018 | Rutschman et al. |
| 2018/0162400 A1 | 6/2018 | Abdar |
| 2018/0176241 A1 | 6/2018 | Manadhata et al. |
| 2018/0198627 A1 | 7/2018 | Mullins |
| 2018/0203961 A1 | 7/2018 | Aisu et al. |
| 2018/0218540 A1 | 8/2018 | Sridharan et al. |
| 2018/0239982 A1 | 8/2018 | Rutschman et al. |
| 2018/0259209 A1* | 9/2018 | Przybylski ............ H04L 41/22 |
| 2018/0259934 A1 | 9/2018 | Piaskowski et al. |
| 2018/0268319 A1 | 9/2018 | Guo et al. |
| 2018/0275625 A1 | 9/2018 | Park et al. |
| 2018/0276962 A1 | 9/2018 | Butler et al. |
| 2018/0292797 A1 | 10/2018 | Lamparter et al. |
| 2018/0336785 A1 | 11/2018 | Ghannam et al. |
| 2018/0356775 A1 | 12/2018 | Harvey |
| 2018/0359111 A1 | 12/2018 | Harvey |
| 2018/0364654 A1 | 12/2018 | Locke et al. |
| 2019/0005025 A1 | 1/2019 | Malabarba |
| 2019/0012728 A1 | 1/2019 | Horn |
| 2019/0013023 A1 | 1/2019 | Pourmohammad et al. |
| 2019/0025771 A1 | 1/2019 | Park et al. |
| 2019/0033799 A1 | 1/2019 | Billings |

(56) References Cited

U.S. PATENT DOCUMENTS

| | | |
|---|---|---|
| 2019/0037135 A1 | 1/2019 | Hedge |
| 2019/0042988 A1 | 2/2019 | Brown et al. |
| 2019/0088106 A1 | 3/2019 | Grundstrom |
| 2019/0094824 A1 | 3/2019 | Xie et al. |
| 2019/0096217 A1 | 3/2019 | Pourmohammad et al. |
| 2019/0102840 A1 | 4/2019 | Perl et al. |
| 2019/0121801 A1 | 4/2019 | Jethwa et al. |
| 2019/0138512 A1 | 5/2019 | Pourmohammad et al. |
| 2019/0147883 A1 | 5/2019 | Mellenthin et al. |
| 2019/0158309 A1 | 5/2019 | Park et al. |
| 2019/0163152 A1 | 5/2019 | Worrall et al. |
| 2019/0196784 A1 | 6/2019 | Sheffer |
| 2019/0208018 A1 | 7/2019 | Scanlin et al. |
| 2019/0265659 A1 | 8/2019 | Piaskowski et al. |
| 2019/0268178 A1 | 8/2019 | Fairweather et al. |
| 2019/0310979 A1 | 10/2019 | Masuzaki et al. |
| 2019/0369575 A1 | 12/2019 | Raina et al. |
| 2019/0377306 A1 | 12/2019 | Harvey |
| 2019/0384242 A1 | 12/2019 | Holaso |
| 2020/0026806 A1 | 1/2020 | Ullom |
| 2020/0044887 A1 | 2/2020 | Jayanath et al. |
| 2020/0047343 A1 | 2/2020 | Bal et al. |
| 2020/0090085 A1 | 3/2020 | Martinez Canedo et al. |
| 2020/0104530 A1 | 4/2020 | Park et al. |
| 2020/0106633 A1 | 4/2020 | Park et al. |
| 2020/0124466 A1 | 4/2020 | Lubas et al. |
| 2020/0125043 A1 | 4/2020 | Park |
| 2020/0159173 A1 | 5/2020 | Goyal |
| 2020/0159182 A1 | 5/2020 | Goyal |
| 2020/0159376 A1 | 5/2020 | Goyal |
| 2020/0159723 A1 | 5/2020 | Goyal |
| 2020/0162354 A1 | 5/2020 | Drees et al. |
| 2020/0188718 A1 | 6/2020 | Trivelpiece et al. |
| 2020/0202136 A1 | 6/2020 | Shrestha et al. |
| 2020/0225623 A1 | 7/2020 | Vass et al. |
| 2020/0226156 A1 | 7/2020 | Borra et al. |
| 2020/0226223 A1 | 7/2020 | Reichl |
| 2020/0233680 A1 | 7/2020 | Ma et al. |
| 2020/0272114 A1 | 8/2020 | Grabowski et al. |
| 2020/0285203 A1 | 9/2020 | Thakur et al. |
| 2020/0304375 A1 | 9/2020 | Chennai et al. |
| 2020/0336328 A1 | 10/2020 | Harvey |
| 2020/0348632 A1 | 11/2020 | Harvey |
| 2020/0379140 A1 | 12/2020 | Kostrun et al. |
| 2020/0387576 A1 | 12/2020 | Brett et al. |
| 2020/0387643 A1 | 12/2020 | Lee |
| 2020/0396208 A1 | 12/2020 | Brett et al. |
| 2021/0042299 A1 | 2/2021 | Migliori |
| 2021/0043221 A1 | 2/2021 | Yelchuru et al. |
| 2021/0055716 A1 | 2/2021 | Turner |
| 2021/0073449 A1 | 3/2021 | Segev et al. |
| 2021/0256583 A1 | 8/2021 | Jacobs et al. |
| 2021/0325070 A1 | 10/2021 | Endel et al. |
| 2021/0342961 A1 | 11/2021 | Winter et al. |
| 2021/0365602 A1 | 11/2021 | Gifford |
| 2021/0373510 A1 | 12/2021 | Borah et al. |
| 2021/0381711 A1 | 12/2021 | Harvey et al. |
| 2021/0381712 A1 | 12/2021 | Harvey et al. |
| 2021/0382445 A1 | 12/2021 | Harvey et al. |
| 2021/0382449 A1 | 12/2021 | Krishnan et al. |
| 2021/0382451 A1 | 12/2021 | Bharathi et al. |
| 2021/0382452 A1 | 12/2021 | Krishnan et al. |
| 2021/0382474 A1 | 12/2021 | Krishnan et al. |
| 2021/0383041 A1 | 12/2021 | Harvey et al. |
| 2021/0383042 A1 | 12/2021 | Harvey et al. |
| 2021/0383200 A1 | 12/2021 | Harvey et al. |
| 2021/0383219 A1 | 12/2021 | Harvey et al. |
| 2021/0383235 A1 | 12/2021 | Harvey et al. |
| 2021/0383236 A1 | 12/2021 | Harvey et al. |
| 2021/0389968 A1 | 12/2021 | Majewski et al. |
| 2022/0066402 A1 | 3/2022 | Harvey et al. |
| 2022/0066405 A1 | 3/2022 | Harvey |
| 2022/0066432 A1 | 3/2022 | Harvey et al. |
| 2022/0066434 A1 | 3/2022 | Harvey et al. |
| 2022/0066528 A1 | 3/2022 | Harvey et al. |
| 2022/0066722 A1 | 3/2022 | Harvey et al. |
| 2022/0066754 A1 | 3/2022 | Harvey et al. |
| 2022/0066761 A1 | 3/2022 | Harvey et al. |
| 2022/0067226 A1 | 3/2022 | Harvey et al. |
| 2022/0067227 A1 | 3/2022 | Harvey et al. |
| 2022/0067230 A1 | 3/2022 | Harvey et al. |
| 2022/0069863 A1 | 3/2022 | Harvey et al. |
| 2022/0070293 A1 | 3/2022 | Harvey et al. |
| 2022/0121965 A1 | 4/2022 | Chatterji et al. |
| 2022/0138684 A1 | 5/2022 | Harvey |
| 2022/0147000 A1 | 5/2022 | Cooley et al. |
| 2022/0150124 A1 | 5/2022 | Cooley et al. |
| 2022/0215264 A1 | 7/2022 | Harvey et al. |
| 2022/0268470 A1 | 8/2022 | Hriljac et al. |
| 2023/0010757 A1 | 1/2023 | Preciado |
| 2023/0071312 A1 | 3/2023 | Preciado et al. |
| 2023/0076011 A1 | 3/2023 | Preciado et al. |
| 2023/0083703 A1 | 3/2023 | Meiners |

FOREIGN PATENT DOCUMENTS

| | | |
|---|---|---|
| CA | 2957726 A1 | 3/2016 |
| CA | 3043996 A1 | 2/2018 |
| CN | 101415011 A | 4/2009 |
| CN | 102136099 A | 7/2011 |
| CN | 102136100 A | 7/2011 |
| CN | 102650876 A | 8/2012 |
| CN | 104040583 A | 9/2014 |
| CN | 104603832 A | 5/2015 |
| CN | 104919484 A | 9/2015 |
| CN | 106204392 A | 12/2016 |
| CN | 106406806 A | 2/2017 |
| CN | 106960269 A | 7/2017 |
| CN | 107147639 A1 | 9/2017 |
| CN | 107598928 A | 1/2018 |
| CN | 109824100 A | 5/2019 |
| EP | 2 528 033 A1 | 11/2012 |
| EP | 3 186 687 A4 | 7/2017 |
| EP | 3 268 821 B1 | 1/2018 |
| EP | 3 324 306 A1 | 5/2018 |
| EP | 3 497 377 A1 | 6/2019 |
| EP | 4 226 263 A1 | 8/2023 |
| JP | H10-049552 A | 2/1998 |
| JP | 2003-162573 A | 6/2003 |
| JP | 2007-018322 A | 1/2007 |
| JP | 4073946 B1 | 4/2008 |
| JP | 2008-107930 A | 5/2008 |
| JP | 2013-152618 A | 8/2013 |
| JP | 2014-044457 A | 3/2014 |
| KR | 2016/0102923 A | 8/2016 |
| WO | WO-2009/020158 A1 | 2/2009 |
| WO | WO-2011/100255 A2 | 8/2011 |
| WO | WO-2013/050333 A1 | 4/2013 |
| WO | WO-2015/106702 A1 | 7/2015 |
| WO | WO-2015/145648 A1 | 10/2015 |
| WO | WO-2017/035536 A1 | 3/2017 |
| WO | WO-2017/192422 A1 | 11/2017 |
| WO | WO-2017/194244 A1 | 11/2017 |
| WO | WO-2017/205330 A1 | 11/2017 |
| WO | WO-2017/213918 A1 | 12/2017 |
| WO | WO-2018/132112 A1 | 7/2018 |
| WO | WO-2020/061621 A1 | 4/2020 |
| WO | WO-2022/042925 A1 | 3/2022 |
| WO | WO-2022/103812 A1 | 5/2022 |
| WO | WO-2022/103813 A1 | 5/2022 |
| WO | WO-2022/103820 A1 | 5/2022 |
| WO | WO-2022/103822 A1 | 5/2022 |
| WO | WO-2022/103824 A1 | 5/2022 |
| WO | WO-2022/103829 A1 | 5/2022 |
| WO | WO-2022/103831 A1 | 5/2022 |

OTHER PUBLICATIONS

International Search Report and Written Opinion for PCT Appl. Ser. No. PCT/US2021/057360 dated Feb. 1, 2022 (14 pages).

CoolingLogic, "CoolingLogic: Up early, saving billions." URL: http://coolinglogic.com/documents/MarketingFlyer_FINAL_HiRes8.5x11.pdf, retrieved from internet Oct. 27, 2022 (1 page).

(56) References Cited

OTHER PUBLICATIONS

Incomplete File of Communication with Various Companies, etc. in 2016-2021, URL: http://coolinglogic.com/documents/22072101_Letters_and_Signature_Receipts.pdf, published, as one document, on: Jul. 21, 2022 (211 pages).

Johnson Heating and Cooling L.L.C., "Divine Grace Building Automation (Images)," URL: http://cooljohnson.com/Building-Automation-Systems-Michigan/Oakland-County-Michigan/Building-Automation-Images.html, retrieved from internet Oct. 27, 2022 (8 pages).

Johnson Heating and Cooling L.L.C., "Divine Grace Building Automation," URL: http://cooljohnson.com/Building-Automation-Systems-Michigan/Oakland-County-Michigan/Building-Automation-Divine-Grace.html, retrieved from internet Oct. 27, 2022 (3 pages).

Johnson Heating and Cooling L.L.C., "Excel Rehabilitation Building Automation," URL: http://cooljohnson.com/Building-Automation-Systems-Michigan/Waterford-Michigan/Building-Automation-System-Excel.html, retrieved from internet Oct. 27, 2022 (2 pages).

Johnson Heating and Cooling L.L.C., "Intertek Testing Services Building Automation," URL: http://cooljohnson.com/Building-Automation-Systems-Michigan/Plymouth-Michigan/Building-Automation-System-Plymouth-Michigan.html, retrieved from internet Oct. 27, 2022 (8 pages).

Johnson Heating and Cooling L.L.C., "Jla Medical Building Building Automation," URL: http://cooljohnson.com/Building-Automation-Systems-Michigan/Waterford-Michigan/Building-Automation-System-JLA.html, retrieved from internet Oct. 27, 2022 (3 pages).

Johnson Heating and Cooling L.L.C., "Mosaic Christian Building Automation (Images)," URL: http://cooljohnson.com/Building-Automation-Systems-Michigan/Detroit/Building-Automation-Images.html, retrieved from internet Oct. 27, 2022 (12 pages).

Johnson Heating and Cooling L.L.C., "Mosaic Christian Building Automation," URL: http://cooljohnson.com/Building-Automation-Systems-Michigan/Detroit/Mosaic-Christian.html, retrieved from internet Oct. 27, 2022 (5 pages).

Johnson Heating and Cooling L.L.C., "Shepherd's Gate Lutheran Church Building Automation," URL: http://cooljohnson.com/Building-Automation-Systems-Michigan/Shelby-Township-Michigan/Building-Automation-Systems-SG.html, retrieved from internet Oct. 27, 2022 (3 pages).

Johnson Heating and Cooling L.L.C., "St. Clair County Residence Building Automation," URL: http://cooljohnson.com/Building-Automation-Systems-Michigan/St-Clair-Michigan/Building-Automation-System-St-Clair-Michigan.html, retrieved from internet Oct. 27, 2022 (4 pages).

Johnson Heating and Cooling L.L.C., "St. Joseph Mercy Oakland U. C. Building Automation," URL: http://cooljohnson.com/Building-Automation-Systems-Michigan/Waterford-Michigan/Building-Automation-Systems-SJMO.html, retrieved from internet Oct. 27, 2022 (2 pages).

Johnson Heating and Cooling L.L.C., "Waterford Internal Medicine Building Automation," URL: http://cooljohnson.com/Building-Automation-Systems-Michigan/Waterford-Michigan/Building-Automation-Systems-WIM.html, retrieved from internet Oct. 27, 2022 (3 pages).

Johnson Heating and Cooling, LLC, "Building Automation Clawson Michigan 2.0," URL: http://cooljohnson.com/Building-Automation-Systems-Michigan/Clawson-Michigan/Building-Automation-Clawson-Manor-2.html, retrieved from the internet Oct. 27, 2022 (6 pages).

Johnson Heating and Cooling, LLC, "Building Automation Images Clawson Michigan 2.0," URL: http://cooljohnson.com/Building-Automation-Systems-Michigan/Clawson-Michigan/Building-Automation-Clawson-Manor-2-Images.html, retrieved from the internet Oct. 27, 2022 (14 pages).

Johnson Heating and Cooling, LLC, "Building Automation System Clawson Michigan Clawson Manor," URL: http://cooljohnson.com/Building-Automation-Systems-Michigan/Clawson-Michigan/Building-Automation-System-Clawson-Manor.html; retrieved from the internet Oct. 27, 2022 (3 pages).

Johnson Heating and Cooling, LLC, "Building Automation System in Michigan Images," URL: http://cooljohnson.com/Building-Automation-Systems-Michigan/Macomb-County-Michigan/Building-Automation-Images.html; retrieved from the internet Oct. 27, 2022 (13 pages).

Johnson Heating and Cooling, LLC, "Building Automation System in Michigan," URL: http://cooljohnson.com/Building-Automation-Systems-Michigan/Macomb-County-Michigan/Building-Automation-Confidential-Customer.html; retrieved from the internet, Oct. 27, 2022 (4 pages).

Johnson Solid State LLC, "Building Automation Equipment," URL: http://cooljohnson.com/Video/Building_Automation/Confidential_Customer_BLD_2/Building_Automation_Equipment.mp4, retrieved from internet Oct. 27, 2022 (35 pages).

Johnson Solid State LLC, "Building Automation GUI," URL: http://cooljohnson.com/Video/Building_Automation/Confidential_Customer_BLD_2/Building_Automation_GUI.mp4, retrieved from internet Oct. 27, 2022 (24 pages).

Johnson Solid State LLC, "Cooling Logic Overview," URL: http://coolinglogic.com/documents/CoolingLogic_Overview_High_Quality.mp4, retrieved from internet Oct. 27, 2022 (16 pages).

Johnson Solid State LLC, "So what is CoolingLogic™?" URL: http://coolinglogic.com/Coolinglogic-How-it-Works.html, retrieved from the internet Oct. 27, 2022 (3 pages).

Johnson, David, "A Method to Increase HVAC System Efficiency and Decrease Energy Consumption," White Paper: Johnson Solid State, LLC, URL: http://coolinglogic.com/documents/16102106_White_Paper_High_Resolution_Protected.pdf, Sep. 24, 2016 (51 pages).

Johnson, David, "CoolingLogic™: Changing the Way You Cool," Report: Johnson Solid State, LLC, URL: http://coolinglogic.com/documents/18111303_Changing_the_way_you_Cool.pdf, Nov. 7, 2018 (12 pages).

Johnson, David, "CoolingLogic™: Mosaic Christian Church a Case Study," Report: Johnson Solid State, LLC, URL: http://coolinglogic.com/documents/19020301_Mosaic_Christian_Coolinglogic_Case_Study.pdf, Feb. 2, 2019 (140 pages).

Johnson, David, "Excel Rehabilitation Building Automation: Building Automation System User Manual," URL: http://cooljohnson.com/Building-Automation-Systems-Michigan/Waterford-Michigan/Building-Automation-System-Excel-Manual.html, 2012 (10 pages).

Johnson, David, "Temperature Control System and Methods for Operating Same," Pre-Publication printout of U.S. Appl. No. 15/231,943, filed Aug. 9, 2016, URL: http://coolinglogic.com/documents/16080901_CIP_As_Filed.pdf (99 pages).

White et al., "Reduce building maintenance costs with AWS IoT TwinMaker Knowledge Graph," The Internet of Things on AWS—Official Blog, URL: https://aws.amazon.com/blogs/iot/reduce-building-maintenance-costs-with-aws-iot-twinmaker-knowledge-graph/, Nov. 18, 2022 (10 pages).

Balaji et al, "Brick: Metadata schema for portable smart building applications," Applied Energy, 2018 (20 pages).

Balaji et al, "Brick: Metadata schema for portable smart building applications," Applied Energy, Sep. 15, 2018, 3 pages, (Abstract).

Balaji et al, "Demo Abstract: Portable Queries Using the Brick Schema for Building Applications," BuildSys '16, Palo Alto, CA, USA, Nov. 16-17, 2016 (2 pages).

Balaji, B. et al., "Brick: Towards a Unified Metadata Schema for Buildings." BuildSys '16, Palo Alto, CA, USA, Nov. 16-17, 2016 (10 pages).

Bhattacharya et al., "Short Paper: Analyzing Metadata Schemas for Buildings—The Good, The Bad and The Ugly," BuildSys '15, Seoul, South Korea, Nov. 4-5, 2015 (4 pages).

Bhattacharya, A., "Enabling Scalable Smart-Building Analytics," Electrical Engineering and Computer Sciences, University of California at Berkeley, Technical Report No. UCB/EECS-2016-201, Dec. 15, 2016 (121 pages).

Brick, "Brick Schema: Building Blocks for Smart Buildings," URL: chrome-extension://efaidnbmnnnibpcajpcglclefindmkaj/https://www.memoori.com/wp-content/uploads/2016/06/Brick_Schema_Whitepaper.pdf, Mar. 2019 (17 pages).

Brick, "Brick: Towards a Unified Metadata Schema for Buildings," URL: chrome-extension://efaidnbmnnnibpcajpcglclefindmkaj/https://

(56) References Cited

OTHER PUBLICATIONS brickschema.org/papers/Brick_BuildSys_Presentation.pdf, Presented at BuildSys '16, Nov. 2016 (46 pages).
Brick, "Metadata Schema for Buildings," URL: https://brickschema.org/docs/Brick-Leaflet.pdf, retrieved from internet Dec. 24, 2019 (3 pages).
Chinese Office Action on CN Appl. No. 201780003995.9 dated Apr. 8, 2021 (21 pages with English language translation).
Chinese Office action on CN Appl. No. 201780043400.2 dated Apr. 25, 2021 (15 pages with English language translation).
Curry, E. et al., "Linking building data in the cloud: Integrating cross-domain building data using linked data." Advanced Engineering Informatics, 2013, 27 (pp. 206-219).
Digital Platform Litigation Documents Part 1, includes cover letter, dismissal of case DDE-1-21-cv-01796, IPR2023-00022 (documents filed Jan. 26, 2023-Oct. 7, 2022), and IPR2023-00085 (documents filed Jan. 26, 2023-Oct. 20, 2022) (748 pages total).
Digital Platform Litigation Documents Part 10, includes DDE-1-21-cv-01796 (documents filed Nov. 1, 2022-Dec. 22, 2021 (1795 pages total).
Digital Platform Litigation Documents Part 2, includes IPR2023-00085 (documents filed Oct. 20, 2022) (172 pages total).
Digital Platform Litigation Documents Part 3, includes IPR2023-00085 (documents filed Oct. 20, 2022) and IPR2023-00170 (documents filed Nov. 28, 2022-Nov. 7, 2022) (397 pages total).
Digital Platform Litigation Documents Part 4, includes IPR2023-00170 (documents filed Nov. 7, 2022) and IPR2023-00217 (documents filed Jan. 18, 2023-Nov. 15, 2022) (434 pages total).
Digital Platform Litigation Documents Part 5, includes IPR2023-00217 (documents filed Nov. 15, 2022) and IPR2023-00257 (documents filed Jan. 25, 2023-Nov. 23, 2022) (316 pages total).
Digital Platform Litigation Documents Part 6, includes IPR2023-00257 (documents filed Nov. 23, 2022) and IPR 2023-00346 (documents filed Jan. 3, 2023-Dec. 13, 2022) (295 pages total).
Digital Platform Litigation Documents Part 7, includes IPR 2023-00346 (documents filed Dec. 13, 2022) and IPR2023-00347 (documents filed Jan. 3, 2023-Dec. 13, 2022) (217 pages total).
Digital Platform Litigation Documents Part 8, includes IPR2023-00347 (documents filed Dec. 13, 2022), EDTX-2-22-cv-00243 (documents filed Sep. 20, 2022-Jun. 29, 2022), and DDE-1-21-cv-01796 (documents filed Feb. 3, 2023-Jan. 10, 2023 (480 pages total).
Digital Platform Litigation Documents Part 9, includes DDE-1-21-cv-01796 (documents filed Jan. 10, 2023-Nov. 1, 2022 (203 pages total).
El Kaed, C. et al., "Building management insights driven by a multi-system semantic representation approach," 2016 IEEE 3rd World Forum on Internet of Things (WF-IoT), Dec. 12-14, 2016, (pp. 520-525).
Ellis, C. et al., "Creating a room connectivity graph of a building from per-room sensor units." BuildSys '12, Toronto, ON, Canada, Nov. 6, 2012 (7 pages).
Extended European Search Report on EP Application No. 18196948.6 dated Apr. 10, 2019 (9 pages).
Fierro et al., "Beyond a House of Sticks: Formalizing Metadata Tags with Brick," BuildSys '19, New York, NY, USA, Nov. 13-14, 2019 (10 pages).
Fierro et al., "Dataset: An Open Dataset and Collection Tool for BMS Point Labels," Data'19, New York, NY, USA, Nov. 10, 2019 (3 pages).
Fierro et al., "Design and Analysis of a Query Processor for Brick," ACM Transactions on Sensor Networks, Jan. 2018, vol. 1, No. 1, art. 1 (25 pages).
Fierro et al., "Design and Analysis of a Query Processor for Brick," BuildSys '17, Delft, Netherlands, Nov. 8-9, 2017 (10 pages).
Fierro et al., "Mortar: An Open Testbed for Portable Building Analytics," BuildSys '18, Shenzhen, China, Nov. 7-8, 2018 (10 pages).
Fierro et al., "Why Brick is a Game Changer for Smart Buildings," URL: https://brickschema.org/papers/Brick_Memoori_Webinar_Presentation.pdf, Memoori Webinar, 2019 (67 pages).
Fierro, "Writing Portable Building Analytics with the Brick Metadata Schema," UC Berkeley, ACM E-Energy, 2019 (39 pages).
Fierro, G., "Design of an Effective Ontology and Query Processor Enabling Portable Building Applications," Electrical Engineering and Computer Sciences, University of California at Berkeley, Technical Report No. UCB/EECS-2019-106, Jun. 27, 2019 (118 pages).
File History for U.S. Appl. No. 12/776,159, filed May 7, 2010 (722 pages).
Final Conference Program, ACM BuildSys 2016, Stanford, CA, USA, Nov. 15-17, 2016 (7 pages).
Gao et al., "A large-scale evaluation of automated metadata inference approaches on sensors from air handling units," Advanced Engineering Informatics, 2018, 37 (pp. 14-30).
Harvey, T., "Quantum Part 3: The Tools of Autonomy, How PassiveLogic's Quantum Creator and Autonomy Studio software works," URL: https://www.automatedbuildings.com/news/jan22/articles/passive/211224010000passive.html, Jan. 2022 (7 pages).
Harvey, T., "Quantum: The Digital Twin Standard for Buildings," URL: https://www.automatedbuildings.com/news/feb21/articles/passivelogic/210127124501passivelogic.html, Feb. 2021 (6 pages).
Hu, S. et al., "Building performance optimisation: A hybrid architecture for the integration of contextual information and time-series data," Automation in Construction, 2016, 70 (pp. 51-61).
International Search Report and Written Opinion for PCT Appl. Ser. No. PCT/US2017/013831 dated Mar. 31, 2017 (14 pages).
International Search Report and Written Opinion for PCT Appl. Ser. No. PCT/US2017/035524 dated Jul. 24, 2017 (14 pages).
International Search Report and Written Opinion on PCT/US2017/052060, dated Oct. 5, 2017, 11 pages.
International Search Report and Written Opinion on PCT/US2017/052633, dated Oct. 23, 2017, 9 pages.
International Search Report and Written Opinion on PCT/US2017/052829, dated Nov. 27, 2017, 24 pages.
International Search Report and Written Opinion on PCT/US2018/024068, dated Jun. 15, 2018, 22 pages.
International Search Report and Written Opinion on PCT/US2018/052971, dated Mar. 1, 2019, 19 pages.
International Search Report and Written Opinion on PCT/US2018/052974, dated Dec. 19, 2018, 13 pages.
International Search Report and Written Opinion on PCT/US2018/052975, dated Jan. 2, 2019, 13 pages.
International Search Report and Written Opinion on PCT/US2018/052994, dated Jan. 7, 2019, 15 pages.
International Search Report and Written Opinion on PCT/US2019/015481, dated May 17, 2019, 78 pages.
International Search Report and Written Opinion on PCT/US2020/058381, dated Jan. 27, 2021, 30 pages.
Japanese Office Action on JP Appl. No. 2018-534963 dated May 11, 2021 (16 pages with English language translation).
Koh et al., "Plaster: An Integration, Benchmark, and Development Framework for Metadata Normalization Methods," BuildSys '18, Shenzhen, China, Nov. 7-8, 2018 (10 pages).
Koh et al., "Scrabble: Transferrable Semi-Automated Semantic Metadata Normalization using Intermediate Representation," BuildSys '18, Shenzhen, China, Nov. 7-8, 2018 (10 pages).
Koh et al., "Who can Access What, and When?" BuildSys '19, New York, NY, USA, Nov. 13-14, 2019 (4 pages).
Li et al., "Event Stream Processing with Out-of-Order Data Arrival," International Conferences on Distributed Computing Systems, 2007, (8 pages).
Nissin Electric Co., Ltd., "Smart power supply system (SPSS)," Outline of the scale verification plan, Nissin Electric Technical Report, Japan, Apr. 23, 2014, vol. 59, No. 1 (23 pages).
Passivelogic, "Explorer: Digital Twin Standard for Autonomous Systems. Made interactive." URL: https://passivelogic.com/software/quantum-explorer/, retrieved from internet Jan. 4, 2023 (13 pages).
Passivelogic, "Quantum: The Digital Twin Standard for Autonomous Systems, A physics-based ontology for next-generation con-

(56) References Cited

OTHER PUBLICATIONS trol and AI." URL: https://passivelogic.com/software/quantum-standard/, retrieved from internet Jan. 4, 2023 (20 pages).
Quantum Alliance, "Quantum Explorer Walkthrough," 2022, (7 pages) (screenshots from video).
Results of the Partial International Search for PCT/US2018/052971, dated Jan. 3, 2019, 3 pages.
Sinha, Sudhi and Al Huraimel, Khaled, "Reimagining Businesses with AI" John Wiley & Sons, Inc., Hoboken, NJ, USA, 2021 (156 pages).
Sinha, Sudhi R. and Park, Youngchoon, "Building an Effective IoT Ecosystem for Your Business," Johnson Controls International, Springer International Publishing, 2017 (286 pages).
Sinha, Sudhi, "Making Big Data Work for Your Business: A guide to effective Big Data analytics," Impackt Publishing Ltd., Birmingham, UK, Oct. 2014 (170 pages).
The Virtual Nuclear Tourist, "Calvert Cliffs Nuclear Power Plant," URL: http://www.nucleartourist.com/us/calvert.htm, Jan. 11, 2006 (2 pages).
University of California at Berkeley, EECS Department, "Enabling Scalable Smart-Building Analytics," URL: https://www2.eecs.berkeley.edu/Pubs/TechRpts/2016/EECS-2016-201.html, retrieved from internet Feb. 15, 2022 (7 pages).
Van Hoof, Bert, "Announcing Azure Digital Twins: Create digital replicas of spaces and infrastructure using cloud, AI and IoT," URL: https://azure.microsoft.com/en-us/blog/announcing-azure-digital-twins-create-digital-replicas-of-spaces-and-infrastructure-using-cloud-ai-and-iot/, Sep. 24, 2018 (11 pages).
W3C, "SPARQL: Query Language for RDF," located on The Wayback Machine, URL: https://web.archive.org/web/20161230061728/http://www.w3.org/TR/rdf-sparql-query/), retrieved from internet Nov. 15, 2022 (89 pages).
Wei et al., "Development and Implementation of Software Gateways of Fire Fighting Subsystem Running on EBI," Control, Automation and Systems Engineering, IITA International Conference on, IEEE, Jul. 2009 (pp. 9-12).
Zhou, Q. et al., "Knowledge-infused and Consistent Complex Event Processing over Real-time and Persistent Streams," Further Generation Computer Systems, 2017, 76 (pp. 391-406).
Sinha, Sudhi and Al Huraimel, Khaled, "Reimagining Businesses with AI" John Wiley & Sons, Inc., Hoboken, NJ, USA, First ed. published 2020 (156 pages).
U.S. Appl. No. 17/566,029, Unknown, Passivelogic, Inc.
U.S. Appl. No. 17/567,275, Unknown, Passivelogic, Inc.
U.S. Appl. No. 17/722,115, Unknown, Passivelogic, Inc.

\* cited by examiner

1100

"AH2089X-D20" appears to be a [thermostat ▼] in [room 2 ▼] of [building 4E ▼]
1110                              1120           1120        1120

Do you wish to label "AH2089X-D20" according
to this determination having 90% confidence?
                                  1130

1140 — [YES]    [NO] — 1140

Check one —1210

AH2089X-D20 is a: 1222  1224      1224    1224          1226
1220 { ☑  thermostat  in  room 2  of  building 4E    90% confidence
      ☐  thermostat  in  room 1  of  building 4E    20% confidence
      ☐  PM sensor   in  room 2  of  building 4E    15% confidence
      ☐  PM sensor   in  room 1  of  building 4E    5% confidence
      ☐  thermostat  in  room 2  of  building 3     5% confidence 1230
1230 — [Accept]  [Reanalyze]  [Skip] — 1230

SYSTEMS AND METHODS OF CONFIGURING A BUILDING MANAGEMENT SYSTEM

CROSS-REFERENCE TO RELATED PATENT APPLICATIONS

The present application is a continuation of U.S. patent application Ser. No. 17/324,966, filed May 19, 2021, and entitled "SYSTEMS AND METHODS OF CONFIGURING A BUILDING MANAGEMENT SYSTEM," which itself claims the benefit of and priority to U.S. Provisional Patent Application No. 63/108,137 filed on Oct. 30, 2020, the entire disclosures of each of which are incorporated by reference herein for all purposes.

BACKGROUND

The present disclosure relates generally to the field of building management platforms such as a building management system. Specifically, according to various illustrative implementations, the present disclosure relates to systems and methods for self-configuring and commissioning spaces such as buildings. Building management platforms may include entities such as controllers, sensors, or water heaters deployed within a space. Initial commissioning of new buildings and/or spaces thereof can be time-intensive and involve significant expense.

SUMMARY

One implementation of the present disclosure is a system for rapidly commissioning a data analytics model for a building, comprising one or more processing circuits each including one or more processors and memories, the memories having instructions stored thereon that, when executed by the one or more processors, cause the one or more processing circuits to identify a first plurality of data points in the building, automatically tag at least a portion of the first plurality of data points with one or more first tags using context data extracted from and/or associated with the data points, the one or more tags associating the data points with one or more entities, the one or more entities comprising one or more of building equipment, building spaces, people, or events, identify at least one of the first plurality of data points for manual review and generate one or more suggested tags for the at least one data point, receive feedback from the manual review, and receive a second plurality of data points in the building and automatically tag at least a portion of the second plurality of data points with one or more second tags using the feedback from the manual review.

In some embodiments, automatically tagging at least the portion of the first plurality of data points includes executing a machine learning model trained using historical information on the context data to generate at least one of the one or more first tags. In some embodiments, identifying the at least one of the first plurality of data points includes retrieving descriptive data describing an entity and analyzing the descriptive data to extract semantic information from the descriptive data describing one or more attributes of the entity. In some embodiments, identifying the at least one of the first plurality of data points includes performing signal analysis on operational data associated with a data point of the first plurality of data points to determine a validity of a tag associated with the data point. In some embodiments, the instructions further cause the one or more processing circuits to generate a confidence metric describing a likelihood that a suggested tag of the one or more suggested tags is valid and provide the confidence metric with the suggested tag for review. In some embodiments, the instructions further cause the one or more processing circuits to compare the confidence metric to a threshold and tag the at least one of the first plurality of data points based on the comparison. In some embodiments, identifying the at least one of the first plurality of data points for manual review includes comparing the confidence metric to a threshold and identifying the at least one of the first plurality of data points based on the comparison.

In some embodiments, the feedback includes a manual adjustment of information associated with the one or more suggested tags. In some embodiments, the feedback includes a user validation of a tag of the one or more suggested tags. In some embodiments, the instructions further cause the one or more processing circuits to increase a confidence metric describing a likelihood that the tag of the one or more suggested tags is valid based on the user validation. In some embodiments, instructions further cause the one or more processing circuits to generate the one or more suggested tags using a machine learning model and to update the machine learning model responsive to the feedback from the manual review. In some embodiments, generating the one or more suggested tags includes (i) dynamically controlling an environmental variable of the building, (ii) monitoring sensor measurements, and (iii) generating the one or more suggested tags based on the monitored sensor measurements. In some embodiments, the instructions further cause the one or more processing circuits to validate at least one of the one or more first tags by (i) dynamically controlling an environmental variable of the building, (ii) monitoring sensor measurements, and (iii) determining a validity of the at least one of the one or more first tags based on the monitored sensor measurements.

In some embodiments, the instructions further cause the one or more processing circuits to identify a first data point of at least one of the first or second plurality of data points as unreliable and identify a second data point of at least one of the first or second plurality of data points as a substitute for the first data point to control of a piece of building equipment or assess operation of at least a portion of the building. In some embodiments, the instructions further cause the one or more processing circuits to generate a data health metric describing a validity of at least a portion of the first or second plurality of data points, the data health metric determined based in part on identifying the first data point as unreliable. In some embodiments, the instructions further cause the one or more processing circuits to suppress an alarm relating to the unreliable first data point. In some embodiments, the instructions further cause the one or more processing circuits to identify an anomaly associated with a first data point of at least one of the first or second plurality of data points and determine a cause of the anomaly, the cause comprising at least one of an incorrect tag, a device fault, an unexpected configuration, or a change in at least one of a space of the building spaces or a use of the space.

In some embodiments, the instructions further cause the one or more processing circuits to at least one of (i) automatically update the incorrect tag or (ii) automatically update a device configuration of a device associated with the first data point to address the anomaly. In some embodiments, determining the cause of the anomaly includes prompting a user to review a tag associated with the first data point. In some embodiments, the instructions further cause the one or more processing circuits to identify, from the first plurality of data points, one or more devices that are correctly tagged, modify operation of the one or more devices, monitor sensor measurements associated with a data point that is effected by the modified operation of the one or more devices, and determine a new suggested tag for the data point based on the monitored sensor measurements. In some embodiments, the instructions further cause the one or more processing circuits to determine one or more confidence levels associated with the automatic tagging of the first and second pluralities of data points and generate a data health metric describing a validity of at least a portion of data relating to the building based in part on the one or more confidence levels. In some embodiments, the instructions further cause the one or more processing circuits to determine one or more missing data points or data sources impacting the data health metric and generate a suggestion to obtain the one or more missing data points or data sources. In some embodiments, the instructions further cause the one or more processing circuits to identify a drift condition for a first data point of at least one of the first or second plurality of data points in which a behavior of the first data point transitions from an expected behavior to an unexpected behavior based on a tag of the first data point.

In some embodiments, identifying the drift condition comprises computing a covariance between the first data point and a second data point and determining a change in the covariance. In some embodiments, the instructions further cause the one or more processing circuits to determine an anomaly associated with a first data point of at least one of the first or second pluralities of data points by comparing data associated with the first data point to historical data associated with at least one of the first data point or one or more related data points. In some embodiments, the instructions further cause the one or more processing circuits to identify a change in a trend associated with a first data point of at least one of the first or second pluralities of data points and analyze historical operating data from at least one of the building or a different building having a threshold of shared characteristics with the building to generate information describing a root cause of the change in the trend. In some embodiments, the instructions further cause the one or more processing circuits to generate a suggestion to change one or more attributes associated with a rule for triggering faults based on the information describing the root cause. In some embodiments, the change in the trend includes a change in a covariance between the first data point and a second data point associated with a related entity and wherein the instructions further cause the one or more processing circuits to updating a fault identification model using context data associated with at least one of the first data point or the second data point. In some embodiments, the instructions further cause the one or more processing circuits to at least one of generate or update one or more data points for a different building based on at least one of the first or second plurality of data points or the feedback from the manual review.

In some embodiments, the at least one of the first plurality of data points for manual review are associated with an entity of a first type and wherein the instructions further cause the one or more processing circuits to generate a template for integrating other entities of the first type into the data analytics model, the template including data describing a covariance between expected behavior of the other entities of the first type and expected behavior of the one or more entities within the building having the first type.

BRIEF DESCRIPTION OF THE DRAWINGS

The above and other aspects and features of the present disclosure will become more apparent to those skilled in the art from the following detailed description of the example embodiments with reference to the accompanying drawings, in which:

FIG. 11 is a graphical user interface for labeling a data point, according to an exemplary embodiment;

FIG. 12 is another graphical user interface for labeling a data point, according to an exemplary embodiment;

FIG. 19 is a graphical user interface for visualizing data points, according to an exemplary embodiment;

DETAILED DESCRIPTION

Figure 1A:
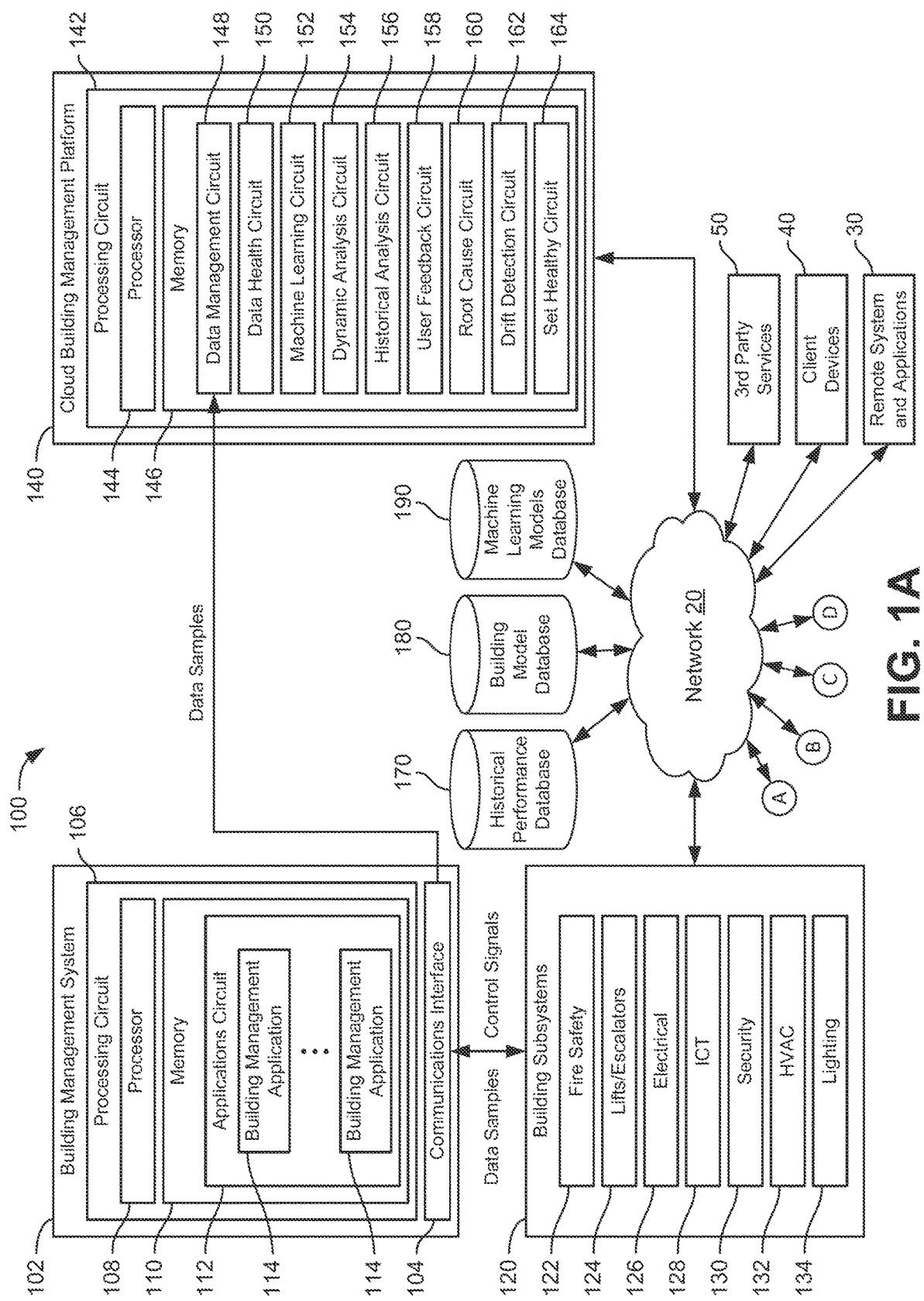
FIG. 1A is a block diagram of a smart building environment, according to an exemplary embodiment.

Hereinafter, example embodiments will be described in more detail with reference to the accompanying drawings.

In various embodiments, building management platforms such as a building management system include digital representations of physical spaces. For example, a building management system may include a digital twin of a building that represents the people, places, assets, and events within the building. In various embodiments, digital twins are generated during the construction of a building. For example, an architect may generate a building information model (BIM) that is used by builders to construct a building and service personnel to maintain the building. Additionally or alternatively, digital representations such as digital twins may be generated for existing buildings. For example, a building management system of an existing building may generate a digital representation of the building. However, it may be difficult to generate a digital representation of a building (new, existing, or otherwise). For example, manually identifying the assets in a building may be difficult and time consuming. As a further example, some sources of existing building data may not be easily translatable to a digital representation and may require manual transfer. Further, configuring the devices of the buildings/spaces to work properly with one another and with the building management system can be difficult and time-consuming as well. In general, it may be desirable to avoid manually generating digital representations of buildings (e.g., to reduce input errors, because of the amount of data to be input, etc.). Therefore, systems and methods of configuring a building management system are needed. Specifically, system and methods to facilitate ingesting building data, generating a digital representation, verifying and validating data in the digital representation, and deriving new information based on the digital representation are needed. Virtual representations, digital representations, smart entities, and digital twins are used interchangeably in the present disclosure; in other words, where the present disclosure refers to virtual representations or smart entities, it should be understood that the features discussed could be implemented using digital twins or any other digital counterpart (e.g., updated in real-time, near real-time, periodically, in response to events, or in any other fashion). Additionally, in various embodiments, the systems and methods of the present disclosure can utilize digital twins for higher-level entities (e.g., such as buildings or campuses that include or are otherwise related to particular spaces, assets such as building equipment, people, and/or events) and/or for lower-level entities, such as digital twins of particular spaces (e.g., rooms, floors, etc.), people, assets (e.g., particular pieces of building equipment or groups of building equipment), and events. All such implementations are contemplated within the scope of the present disclosure.

One solution may include a building management platform such as a cloud building management platform. The building management platform may automatically tag data points associated with a digital representation of a building (e.g., using context data associated with the data points, etc.). In various embodiments, the tags associate one or more data points with one or more entities such as building equipment, building spaces, people, and/or events. In various embodiments, the building management platform identifies data points for manual review. For example, the building management platform may identify a data point having a low confidence tag (e.g., a tag with a low probability of being valid, etc.) and may surface the data point to a user along with a suggested tag for the data point. In various embodiments, data points refer to one or more data elements (e.g., measurements, etc.) associated with an entity. For example, a data point may include a sensor measurement generated by a temperature sensor. As another example, a data point may include timeseries sensor measurements representing temperature measurements generated by a temperature sensor over the course of the temperature sensor's operation.

In various embodiments, the building management platform executes one or more models (e.g., machine learning models, linear regression models, etc.) to perform the various operations described herein. In various embodiments, the building management platform updates the one or more models based on user feedback. For example, the building management platform may surface a data point to a user as potentially having an incorrect tag, the user may verify that the tag is correct, and the building management platform may update a model for predicting the validity of data points based on the user feedback (e.g., such that the building management platform doesn't surface similar data points as potentially having an incorrect tag in the future, etc.).

In various embodiments, the building management platform trains a machine learning algorithm on historical information to generate tag suggestions for data points. For example, the building management platform may retrieve historical operating information for a building, may train a machine learning algorithm using the historical operating information, and may execute the trained machine learning algorithm on context data associated with a data point to generate a suggested tag for the data point. In various embodiments, the building management platform analyzes descriptive information describing an entity to extract semantic information describing one or more attributes of the entity. For example, the building management platform may execute a natural language processing (NLP) algorithm on descriptive information associated with an embedded building controller to extract a name and/or identifier for the building controller. In various embodiments, the building management platform performs signal analysis on operational data associated with a data point to determine a validity of a tag associated with the data point. For example, the building management platform may analyze thermostat control data and temperature measurements to verify a tag linking the thermostat to a particular space (e.g., by identifying a change in a temperature of the space corresponding to a change in temperature setpoint included in the control data, etc.).

In various embodiments, the building management platform displays a confidence metric describing a likelihood that a suggested tag is valid to a user. For example, the building management platform may generate a suggested tag, may generate a confidence metric associated with the suggested tag (e.g., where a higher confidence level may indicate that the building management platform has more data verifying the suggested tag, etc.), and may display the confidence metric along with the suggested tag to a user (e.g., thereby enabling the user to investigate and/or override tags having low confidences, etc.). In various embodiments, a user may manually adjust information associated with a suggested tag generated by the building management platform. For example, the building management platform may generate a suggested tag associated with a first space and a user may adjust the tag to be associated with a second space. In various embodiments, a user may verify a suggested tag generated by the building management platform. For example, the building management platform may generate a suggested tag, display the suggested tag to a user, and the user may verify that the suggested tag is correct. In some embodiments, the building management platform may update a confidence metric based on user feedback regarding a suggested tag. For example, the building management platform may increase the value of a confidence metric associated with a tag based on a user verifying the tag (e.g., confirming the tag is correct, etc.). In some embodiments, the building management platform generates a data health metric describing a validity of data associated with a building (e.g., how accurate a number of tags in a digital representation of a building are, etc.) based on one or more confidence metrics (e.g., by combining the confidence metrics, etc.). In various embodiments, the building management platform may identify one or more missing data points and/or one or more missing data sources (e.g., missing data that impacts a data health metric, etc.). For example, the building management platform may determine that a digital representation is missing temperature data for a particular floor of a building and may generate a suggestion to obtain the missing temperature data (e.g., by using a substitute/proxy for the data, by modeling the data, etc.).

In various embodiments, the building management platform may dynamically generate a suggested tag. For example, the building management platform may dynamically control an environmental variable of a building, monitor sensor measurements, and generate a suggested tag based on the monitored sensor measurements. Additionally or alternatively, the building management platform may perform a similar process (e.g., dynamically controlling an environmental variable, etc.) to validate one or more tags.

In various embodiments, the building management platform may identify one or more substitutes for unreliable data points. For example, the building management platform may identify a second data point that is similar to a first data point, and may use information from the second data point to control a piece of building equipment associated with the first data point. In various embodiments, the building management platform performs one or more actions in response to identifying a data point as unreliable (e.g., having a low confidence metric, etc.). For example, the building management platform may suppress one or more alarms associated with an unreliable data point.

In various embodiments, the building management platform may perform one or more actions in response to identifying an anomaly associated with a data point. For example, the building management platform may determine whether the anomaly relates to an incorrect tag, a device fault, an unexpected configuration, and/or a change in at least one of a space of a building or a use of a space. Additionally or alternatively, the building management platform may automatically update incorrect tags and/or automatically update a device configuration associated with a data point to address an anomaly. In various embodiments, the building management platform may identify a drift condition associated with a data point. For example, the building management platform may perform signal analysis on temperature data to identify whether the temperature data transitions from an expected range to an unexpected range. As another example, the building management platform may compute a covariance between a number of data points and may identify a drift condition based on a change in the covariance (e.g., such as when two historically correlated equipment measurements begin to diverge, etc.).

In various embodiments, the building management platform may analyze historical operating data to identify an anomaly. For example, the building management platform may compare operating data for a first data point to operating data for a second related data point to identify whether the first and second data points diverge in operation. In some embodiments, the building management platform generates a trend for one or more data points. For example, the building management platform may analyze historical temperature measurements associated with a room to identify a trend in the temperature setpoints associated with the room. In various embodiments, the building management platform generates a root cause (e.g., a reason an event occurred, etc.) associated with detected anomalies.

In various embodiments, the building management platform generates suggestions to modify one or more attributes for triggering a fault. For example, the building management platform may identify a root cause of a high temperature fault as a temperature threshold value that is set incorrectly and may generate a suggestion to update the temperature threshold value to a different value. In various embodiments, the building management platform automates the process of generating and deploying a digital representation of a building, thereby reducing or eliminating a need for manual intervention. In various embodiments, the building management platform may ingest and interpret external data sources (e.g., BIM data, enterprise management data, personnel data, etc.), extract semantic information from external data sources, dynamically determine configuration information, automatically enrich digital representations with derived information, and/or generate digital representations for spaces. In some embodiments, the digital representations may be used to configuration and/or control building equipment and/or other assets contained in buildings/spaces, and may significantly lower the time and expense of commissioning and configuring new buildings and spaces.

Figure 1B:
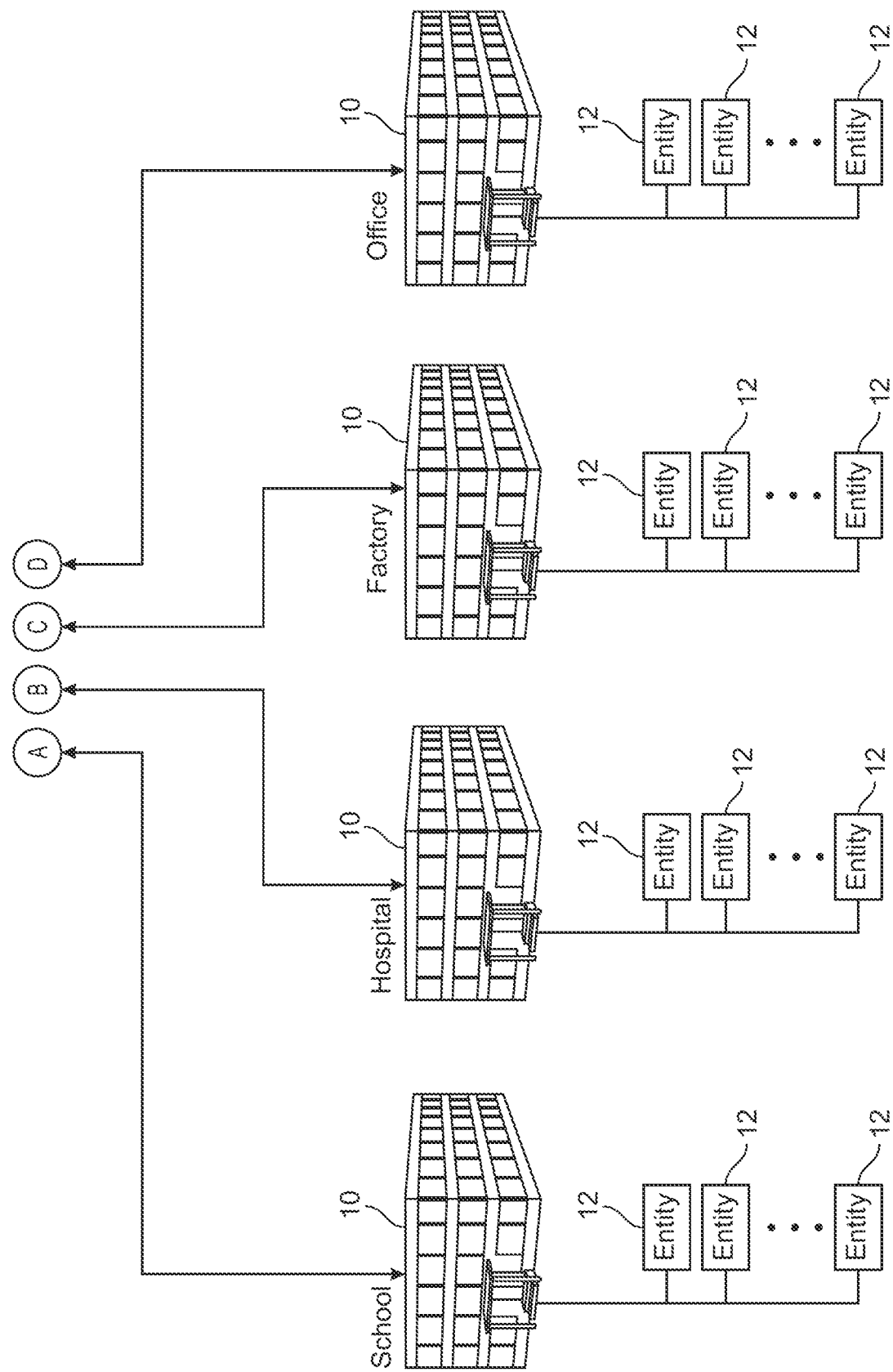
FIG. 1B is another block diagram of the smart building environment of FIG. 1A, according to an exemplary embodiment.

Referring now to FIGS. 1A-1B, a block diagram of a smart building environment 100 is shown, according to an exemplary embodiment. Smart building environment 100 is shown to include cloud building management platform 140. In various embodiments, cloud building management platform 140 facilitates rapid commissioning and/or configuration of building models. Cloud building management platform 140 may be configured to collect information from a variety of different data sources. Cloud management platform 140 may create digital representations, referred to as "digital twins," of physical spaces, equipment, people, and/or events based on the collected information. In various embodiments, the digital representations are stored in an entity graph. In brief overview, an entity graph is a data structure representing entities (e.g., spaces, equipment, people, events, etc.) and relationships between the entities. In various embodiments, the entity graph data structure facilitates advanced artificial intelligence and machine learning associated with the entities. In various embodiments, entities within the entity graph data structure include or are associated with "agents," or software entities configured to take actions with respect to the digital twins/real world entities with which they are associated. In some implementations, the agents may be configured to implement artificial intelligence/machine learning methodologies. The agents may be configured to facilitate communication and collection of information between the varieties of different data sources. Each of the data sources may be implemented as, include, or otherwise use respective agents for facilitating communication amongst or between the data sources and cloud building management platform 140.

In various embodiments, cloud building management platform 140 collects data from buildings 10. For example, cloud building management platform 140 may collect data from buildings 10 such as a school, a hospital, a factory, an office building, and/or the like. It should be understood that the present disclosure is not limited to the number or types of buildings 10 shown in FIG. 1B. As new devices/components/spaces/buildings/events/control loops are added or otherwise incorporated into smart building environment 100, new digital representations (and associated agents, etc.) may be dynamically generated and incorporated into the entity graph data structure. Moreover, it should be understood that while cloud building management platform 140 is described in relation to a cloud/distributed processing system, the functionality of cloud building management platform 140 may be implemented locally. For example, cloud building management platform 140 may be implemented as an off-premises server, set of off-premises servers, and/or one or more on-premises servers. In some implementations, the features of cloud building management platform 140 and/or BMS 102 may be combined in one system. All such permutations are within the scope of the present disclosure.

Buildings 10 may include entities 12. Entities 12 may include spaces, equipment, people, and/or events. In some embodiments, entities 12 include spaces such as floors, rooms, zones, campuses, buildings, and the like. In some embodiments, entities 12 include people such as employees, visitors, pedestrians, staff, and the like. In some embodiments, entities 12 include equipment such as inventory, assets, furniture, vehicles, building components, devices, and the like. For example, entities 12 may include devices such as internet of things (IoT) devices. IoT devices may include any of a variety of physical devices, sensors, actuators, electronics, vehicles, home appliances, and/or other items capable of communicating data over an electronic network (e.g., smart lights, smart appliances, smart home hub devices, etc.). In some embodiments, entities 12 include events such as meetings, fault indications, alarms, and the like. In various embodiments, cloud building management platform 140 receives information associated with buildings 10 and/or entities 12 and generates an entity graph based on the received information. The entity graph may include digital twins that are digital representations of real world spaces, equipment, people, events, and/or the like. Entity graphs are described in greater detail below with reference to FIG. 21.

Smart building environment 100 may include building management system (BMS) 102. In various embodiments, BMS 102 communicates with cloud building management platform 140 to facilitate management and control of buildings 10 and/or the various operations described herein. BMS 102 may be configured to control, monitor, and/or manage equipment in or around a building or building area (e.g., such as buildings 10, etc.). For example, BMS 102 may include a HVAC system, a security system, a lighting system, a fire alerting system, and any other system that is capable of managing building functions or devices, or any combination thereof. Further, each of the systems may include sensors and other devices (e.g., IoT devices) for the proper operation, maintenance, monitoring, and the like of the respective systems. In some embodiments, each of buildings 10 is associated with a BMS 102. Additionally or alternatively, a single BMS 102 may manage multiple buildings 10. For example, a first BMS 102 may manage a first building 10, a second BMS 102 may manage a second building 10, and a third BMS 102 may manage the first and second buildings 10 (e.g., via the first and second BMS 102, in a master-slave configuration, etc.), as well as a third building 10. In various embodiments, BMS 102 communicates with building subsystems 120.

Building subsystems 120 may include fire safety subsystem 122, lift/escalators subsystem 124, building electrical subsystem 126, information communication technology (ICT) subsystem 128, security subsystem 130, HVAC subsystem 132, and/or lighting subsystem 134. In various embodiments, building subsystems 120 include fewer, additional, or alternative subsystems. For example, building subsystems 120 may additionally or alternatively include a refrigeration subsystem, an advertising or signage subsystem, a cooking subsystem, a vending subsystem, a printer or copy service subsystem, or any other type of building subsystem that uses controllable equipment and/or sensors to monitor or control a building 10. In some embodiment each of buildings 10 includes building subsystems 120. Additionally or alternatively, multiple buildings 10 may share at least some of building subsystems 120.

Each of building subsystems 120 may include any number of devices (e.g., IoT devices), sensors, controllers, and connections to facilitate functions and control activities. For example, HVAC subsystem 132 may include a chiller, a boiler, any number of air handling units, economizers, field controllers, supervisory controllers, actuators, temperature sensors, and other devices for controlling the temperature, humidity, airflow, or other variable conditions within buildings 10. Lighting subsystem 134 may include any number of light fixtures, ballasts, lighting sensors, dimmers, or other devices configured to controllably adjust the amount of light provided to a building space. Security subsystem 130 may include occupancy sensors, video surveillance cameras, digital video recorders, video processing servers, intrusion detection devices, access control devices and servers, or other security-related devices.

Cloud building management platform 140 and/or BMS 102 may interact with a variety of external systems. For example, cloud building management platform 140 may interact with remote systems and applications 30, client devices 40, and/or third party services 50. In various embodiments, systems and/or components of smart building environment 100 are configured to communicate using network 20. Network 20 may include hardware, software, or any combination thereof.

BMS 102 is shown to include communications interface 104 and processing circuit 106. Communications interface 104 may facilitate communications between BMS 102 and external systems/applications (e.g., cloud building management platform 140, remote systems and applications 30, client devices 40, third party services 50, building subsystems 120, etc.). Communications interface 104 may be or include wired or wireless communications interfaces (e.g., jacks, antennas, transmitters, receivers, transceivers, wire terminals, etc.) for conducting data communications within smart building environment 100 and/or with other external systems or devices. In various embodiments, communications via communications interface 104 is direct (e.g., local wired or wireless communications). Additionally or alternatively, communications via communications interface 104 may be via network 20 (e.g., a WAN, the Internet, a cellular network, etc.). For example, cloud building management platform 140 may communicate with BMS 102 using a wired connection and may communicate with client devices 40 (e.g., via BMS 102, etc.) using a cellular connection (e.g., a 4G or 5G access point/small cell base station, etc.). As a further example, communications interface 104 may include an Ethernet card and port for sending and receiving data via an Ethernet-based communications link or network. As a further example, communications interface 104 may include a Wi-Fi transceiver for communicating via a wireless communications network. As yet a further example, communications interface 104 may include cellular or mobile phone communications transceivers.

Processing circuit 106 may include processor 108 and memory 110. Processing circuit 106 may be communicably connected to communications interface 104 such that processing circuit 106 and the various components thereof can send and receive data via communications interface 104. Processor 108 may be implemented as a general purpose processor, an application specific integrated circuit (ASIC), one or more field programmable gate arrays (FPGAs), a group of processing components, or other suitable electronic processing components.

Memory 110 (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present application. Memory 110 may be or include volatile memory or non-volatile memory. Memory 110 may include database components, object code components, script components, or any other type of information structure for supporting the various activities and information structures described in the present application. According to some embodiments, memory 110 is communicably connected to processor 108 via processing circuit 106 and includes computer code for executing (e.g., by processing circuit 106 and/or processor 108) one or more of the operations described herein.

In some embodiments, BMS 102 and/or cloud building management platform 140 are implemented within a single computer (e.g., one server, one housing, etc.). In various other embodiments BMS 102 and/or cloud building management platform 140 are distributed across multiple servers or computers (e.g., that can exist in distributed locations). In some embodiments, functions of BMS 102 and/or cloud building management platform 140 are implemented as agents. For example, BMS 102 may include a fault detection agent configured to analyze building data and detect faults associated with building components.

Memory 110 may include applications circuit 112 that may include building management application(s) 114. Building management application(s) 114 may include various systems to monitor and/or control specific processes/events within buildings 10. For example, building management application(s) 114 may include automated measurement and validation (AM&V), demand response (DR), fault detection and diagnostics (FDD), integrated control systems, and/or a building subsystem integration system. Building management application(s) 114 may be configured to receive inputs from building subsystems 120 and/or other data sources, determine improved and/or optimal control actions for building subsystems 120 based on the inputs, generate control signals based on the improved and/or optimal control actions, and provide the generated control signals to building subsystems 120.

Cloud building management platform 140 is shown to include processing circuit 142 having processor 144 and memory 146. In some embodiments, cloud building management platform 140 includes multiple processing circuits 142 each having one or more processors 144 and/or memories 146. Processor 144 may be a general purpose or specific purpose processor, an application specific integrated circuit (ASIC), one or more field programmable gate arrays (FPGAs), a group of processing components, or other suitable processing components. Processor 144 may be configured to execute computer code or instructions stored in memory 146 or received from other computer readable media (e.g., CDROM, network storage, a remote server, etc.).

Memory 146 may include one or more devices (e.g., memory units, memory devices, storage devices, etc.) for storing data and/or computer code for completing and/or facilitating the various processes described in the present disclosure. Memory 146 may include random access memory (RAM), read-only memory (ROM), hard drive storage, temporary storage, non-volatile memory, flash memory, optical memory, or any other suitable memory for storing software objects and/or computer instructions. Memory 146 may include database components, object code components, script components, or any other type of information structure for supporting the various activities and information structures described in the present disclosure. According to some embodiments, memory 146 is communicably connected to processor 144 via processing circuit 142 and includes computer code for executing (e.g., by processing circuit 142 and/or processor 144) one or more of the operations described herein. It should be understood that circuits as described herein may include hardware circuitry, instructions stored on one or more machine-readable storage media and executable by one or more processors to implement functions, or any combination thereof.

Memory 146 may include data management circuit 148, data health circuit 150, machine learning circuit 152, dynamic analysis circuit 154, historical analysis circuit 156, user feedback circuit 158, root cause circuit 160, drift detection circuit 162, and/or self healing circuit 164. Additionally or alternatively, one or more components of memory 146 (e.g., data management circuit 148, etc.) may be implemented by other systems such as locally by building management system 102. Data management circuit 148 may be configured to collect, manage, and/or retrieve data. In various embodiments, data management circuit 148 receives data samples from buildings 10 (e.g., via BMS 102, directly, etc.) and stores the data samples in structured storage. For example, the data samples may include data values for various data points. The data values may be measured and/or calculated values, depending on the type of data point. For example, a data point received from a temperature sensor may include a measured data value indicating a temperature measured by the temperature sensor. Data management circuit 148 may receive data samples from systems, components, and/or devices (e.g., IoT devices, sensors, etc.) within smart building environment 100 (e.g., remote systems and applications 30, client devices 40, third party services 50, BMS 102, building subsystems 120, etc.) and/or from external systems (e.g., the Internet, etc.). For example, data management circuit 148 may receive timeseries data from an occupancy sensor associated with one of buildings 10 and facilitate storage of the timeseries data in structured storage (e.g., in historical performance database 170, etc.). As a further example, data management circuit 148 may receive an electronic calendar event (e.g., a meeting invitation, etc.) from one of client devices 40 and facilitate storage of the electronic calendar event in structure storage. In some embodiments, data management circuit 148 uses or retrieves an entity graph when organizing received data (e.g., to store data in the entity graph, etc.).

Data health circuit 150 may analyze information associated with one or more data points to determine a metric describing a validity of/confidence in information associated with the one or more data points. For example, data health circuit 150 may retrieve context data associated with a data point and may generate a confidence metric describing a likelihood that a tag of the data point is valid. As another example, data health circuit 150 may analyze a covariance between HVAC operational information and temperature data associated with a space to determine a confidence metric for a tag of a data point associated with the space. In various embodiments, the confidence metric describes a likelihood that a tag associated with a data point is correct.

In some embodiments, data health circuit 150 generates a data health metric. For example, data health circuit 150 may retrieve a number of confidence metrics associated with data points of a building and may aggregate the confidence metrics to generate a data health metric describing a validity of information associated with the building. In various embodiments, data health circuit 150 performs one or more actions to generate confidence metrics and/or data health metrics. For example, data health circuit 150 may update a confidence metric associated with a tag of a data point based on a user confirming the tag as valid. As another example, data health circuit 150 may dynamically alter an environmental condition of a space, monitor a sensor measurement associated with the space, and update a confidence metric based on the monitored sensor measurement (e.g., increasing the confidence if the sensor measurement reflects behavior that would be expected based on the change in the environmental variable, etc.). In various embodiments, data health circuit 150 displays a confidence metric and/or a data health metric to a user.

Machine learning circuit 152 may train one or more machine learning models and/or may execute one or more machine learning models to generate output. For example, machine learning circuit 152 may train a neural network using historical operating data to generate predicted operating data that cloud building management platform 140 may compare to operating data in real time to identify deviations from expected behavior. In various embodiments, machine learning circuit 152 interacts with machine learning models database 190. For example, machine learning circuit 152 may train a machine learning model stored in machine learning models database 190. Machine learning circuit 152 may implement supervised machine learning, unsupervised machine learning, semi-supervised machine learning, reinforcement learning, and/or the like. In various embodiments, machine learning circuit 152 trains one or more machine learning models such as an artificial neural network, a decision tree, a support-vector machine, a regression analysis model, a Bayesian network, a genetic algorithm, and/or the like. Additionally or alternatively, machine learning circuit 152 may execute one or more semantic extraction models such as a LSTM model with character embedding to extract semantic information from strings. In various embodiments, machine learning circuit 152 executes one or more machine learning models to identify a fault, determine a root cause, generate suggested tags, generate equipment templates, dynamically update device/equipment configurations, and/or the like. In various embodiments, machine learning circuit 152 updates one or more machine learning models based on user feedback.

Dynamic analysis circuit 154 may perform one or more actions and generate configuration information based on the one or more actions. For example, dynamic analysis circuit 154 may adjust a temperature setpoint associated with a space, monitor a temperature sensor associated with the space, and update a device configuration of the temperature sensor based on the monitoring. In various embodiments, dynamic analysis circuit 154 adjusts an environmental variable associated with a space and determines whether an observed measurement behaves as expected given the adjusted environmental variable. In various embodiments, dynamic analysis circuit 152 may verify a tag associated with a data point. For example, dynamic analysis circuit 152 may retrieve a data point having a tag associated with a space, modify an environmental parameter of the space, and verify the tag is valid in response to observing the data point behave as expected based on the modified environmental parameter. In some embodiments, dynamic analysis circuit 152 may generate suggested tags. For example, dynamic analysis circuit may generate a suggested tag for an untagged data point to associate the untagged data point with a space in response to observing the untagged data point behave as expected of a data point associated with the space. In various embodiments, dynamic analysis circuit 154 compares operational data (e.g., sensor measurements, etc.) to historical operational data to determine whether the operational data reflects expected behavior. For example, dynamic analysis circuit 154 may compare a response to a change in temperature setpoint of a sensor associated with a space to historical response data associated with similar sensors deployed in similar spaces having similar changes in temperature setpoints.

Historical analysis circuit 156 may analyze historical operational data to determine one or more outputs. For example, historical analysis circuit 156 may compare operational data associated with a first thermostat to real time operational data associated with a second thermostat to determine whether the second thermostat is operating as expected. In various embodiments, historical analysis circuit 156 compares operational data of a piece of equipment/device/sensor to operational data from a similar piece of equipment/device/sensor. For example, historical analysis circuit 156 may compare operational data from a first AHU to historical operational data from a second AHU having a number of shared characteristics with the first AHU (e.g., model number, operational load, runtime, etc.). In various embodiments, historical analysis circuit 156 generates one or more suggestions. For example, historical analysis circuit 156 may generate a suggested tag for a data point based on analysis of historical operating data for a similar data point. In various embodiments, historical analysis circuit 156 interacts with historical performance database 170. For example, historical analysis circuit 156 may retrieve historical operating data from historical performance database 170.

User feedback circuit 158 may send and/or receive information from a user. For example, user feedback circuit 158 may present a suggested tag to a user and may receive a user validation of the suggested tag. In various embodiments, user feedback circuit 158 updates operation of cloud building management platform 140 based on the user feedback. For example, user feedback circuit 158 may receive user feedback indicating an adjustment to one or more parameters associated with a suggested tag (e.g., a manual change to an entity a data point is tagged to, etc.) and may update a machine learning model used to generate the suggested tag based on the user feedback. In various embodiments, user feedback circuit 158 may update a confidence metric and/or a data health metric in response to user feedback. For example, user feedback circuit 158 may receive a user validation of a data point tag and may update a confidence metric associated with the tag based on the user validation.

Root cause circuit 160 may identify a root cause associated with an anomaly and/or a fault. For example, root cause circuit 160 may analyze context information associated with an anomaly to determine a reason the anomaly occurred. In various embodiments, root cause circuit 160 performs signal analysis to identify a root cause. In various embodiments, root cause circuit analyzes historical information (e.g., from historical performance database 170, etc.) to identify a root cause (e.g., by identifying a root cause that was determined for a similar anomaly in the historical information, etc.). In some embodiments, root cause circuit 160 executes a rules engine to determine a root cause. For example, root cause circuit 160 may include a rules engine that receives context information associated with an anomaly and evaluates one or more rules to determine a root cause. For example, root cause circuit 160 may include a rule stating that a temperature anomaly for a space is caused by a malfunctioning air intake fan when the air intake fan is of a particular part number, is greater than 5 years old, and when no other temperature anomalies are detected in the same space. In some embodiments, root cause circuit 160 uses a machine learning model to generate root cause information. For example, root cause circuit 160 may execute a deep-learning model to generate a root cause for a temperature anomaly.

Drift detection circuit 162 may analyze operational data to detection one or more drift conditions. For example, drift detection circuit 162 may compare real-time operational data from a building to predicted operational data to determine whether the real-time operational data differs from the predicted operational data. In various embodiments, drift detection circuit 162 detects unsafe or unexpected conditions (e.g., events, event sequences, etc.) associated with an entity. For example, drift detection circuit 162 may detect that a room is normally 70° F. but suddenly dropped to 50° F. As another example, drift detection circuit 162 may detect that a user normally enters a room through a first entry point but suddenly started entering the room through a second entry point. In various embodiments, drift detection circuit 162 executes one or more Markov models to identify drift states. For example, drift detection circuit 162 may populate nodes of a Markov model using historical operating data and may detect drift conditions as events where an entity transitions to an unsafe node (e.g., a node of the Markov model identified as an unsafe state, etc.).

Self healing circuit 164 may identify missing information within a model of cloud building management platform 140 (e.g., such as missing data points within a digital representation of a building, etc.) and may perform one or more actions to address the missing information. For example, self healing circuit 164 may identify that temperature data is missing for a particular room in a building and may generate a suggestion for a user to obtain a substitute/proxy for the missing temperature data (e.g., using a nearby temperature sensor, etc.). In various embodiments, self healing circuit 164 generates one or more suggestions for a user to address missing information. Additionally or alternatively, self healing circuit 164 may automatically (e.g., without human intervention and/or with limited human intervention, etc.) perform one or more actions to address missing information. For example, self healing circuit 164 may replace missing occupancy data for a room with modeled data generated based on a historical record of the lighting controls for the room (e.g., where the model assumes that the room was occupied when the lights were on, etc.).

In various embodiments, cloud building management platform 140 interacts with historical performance database 170, building model database 180, and/or machine learning models database 190. In various embodiments, historical performance database 170 includes historical operating data such as HVAC temperature setpoints represented as time-series data, damper levels, occupancy data, energy usage information, and/or the like. Building model database 180 may store one or more building models. For example, building model database 180 may store a digital representation of a building as a graph data structure. In various embodiments, building model database 180 may store digital representations for multiple buildings and cloud building management platform 140 may use a digital representation from a first building to inform actions related to a second building. For example, cloud building management platform 140 may identify a root cause from a first building model that may explain an anomaly associated with a building associated with a second building model. Machine learning models database 190 may include one or more machine learning models such as an artificial intelligence algorithm. In various embodiments, machine learning models database 190 stores machine learning models trained by cloud building management platform 140. For example, cloud building management platform 140 may train a neural network using historical operating data to predict HVAC faults and may store the trained neural network in machine learning models database 190.

Figure 2:
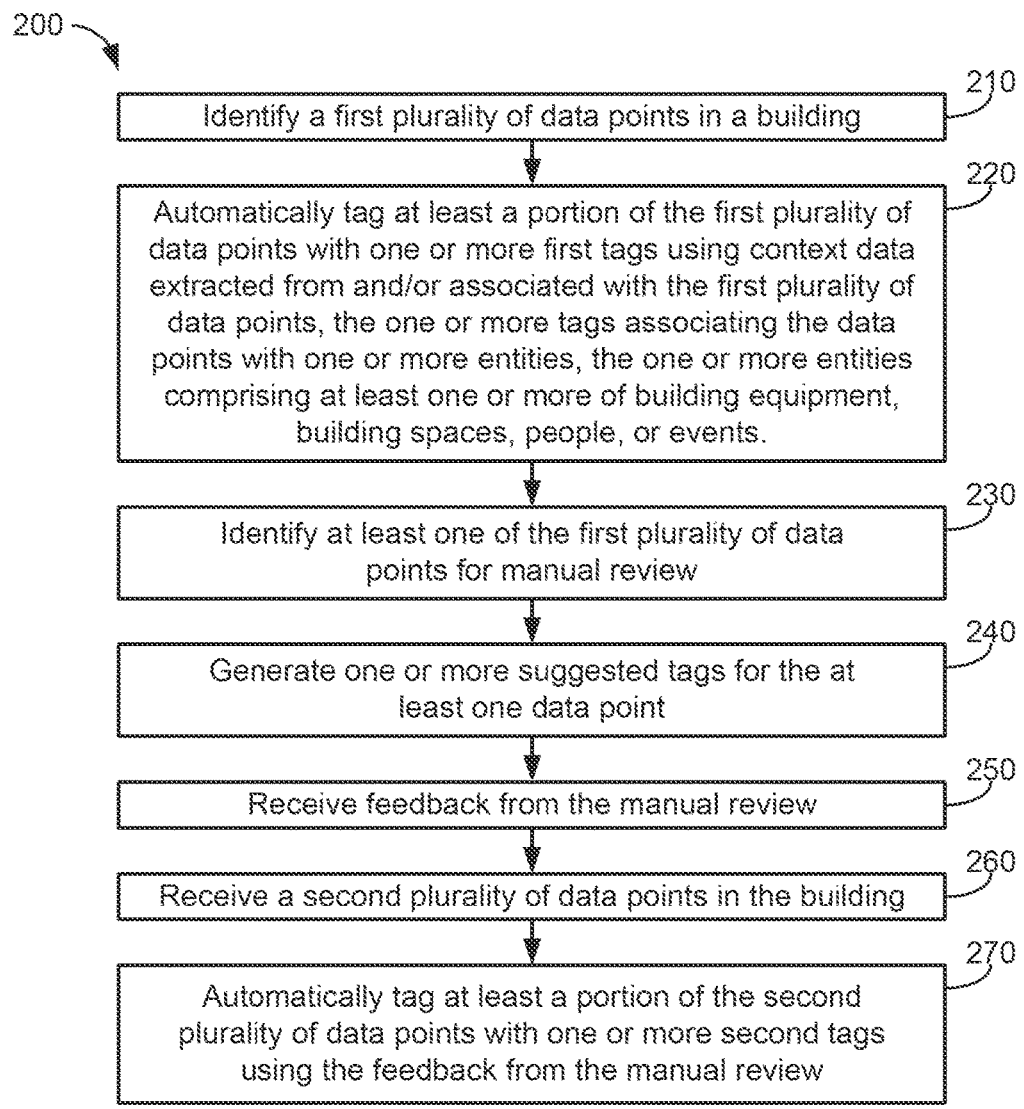
FIG. 2 is a flowchart of a method of automatically tagging a plurality of data points, according to an exemplary embodiment.

Referring now to FIG. 2, method 200 for automatically tagging a number of data points is shown, according to an exemplary embodiment. In various embodiments, cloud building management platform 140 performs method 200. Additionally or alternatively, method 200 may be performed by another system such as building management system 102. At step 210, cloud building management platform may identify a first number of data points in a building. In some embodiments, step 210 includes performing semantic extraction on one or more elements such as strings to extract a number of data points from the elements. For example, cloud building management platform 140 may execute a GPT-2 model on text strings to identify one or more data points representing devices from within the text strings.

At step 220, cloud building management platform 140 may automatically tag at least a portion of the first number of data points with one or more first tags using context data extracted from and/or associated with the first number of data points. In various embodiments, the one or more first tags associate the portion of the first number of data points with one or more entities. In various embodiments, the one or more entities include at least one of building equipment, building spaces, people, and/or events. In various embodiments, the context data includes information related to similar data points and/or entities that interact with the first number of data points. For example, cloud building management platform 140 may retrieve a number of data points that are related to a first data point (e.g., through a relationship tag, etc.) and may use the number of data points to generate a location tag for the first data point (e.g., a tag associating the first data point with a space such as a room, etc.).

In various embodiments, step 220 includes generating a tag using machine learning. For example, cloud building management platform 140 may execute an AI model on an identifier of a data point to determine one or more tags relating to the data point. In some embodiments, step 220 includes perturbing one or more attributes associated with a data point to validate the one or more first tags. For example, cloud building management platform 140 may dynamically control an environmental variable associated with a data point to determine whether the data point behaves as expected given a change in the environmental variable to validate the data point. As another example, cloud building management platform 140 may change a temperature setpoint associated with a room, receive feedback from one or more individuals located in the room (e.g., feedback regarding the temperature, etc.), and may determine whether a tag for a temperature controller indicating that the temperature controller relates to the room is valid.

At step 230, cloud building management platform 140 may identify at least one of the first plurality of data points for manual review. For example, cloud building management platform 140 may identify a data point having a low confidence metric (e.g., low confidence that the data point is correctly tagged, etc.) and may surface the data point for manual review by a user. In various embodiments, step 230 includes identifying a data point for manual review using signal analysis. For example, cloud building management platform 140 may compare sensor values from an AHU to expected sensor values generated by an machine learning model to determine whether the sensor values deviate from the expected sensor values, thereby indicating that the AHU may be incorrectly configured (e.g., tagged incorrectly, etc.). In some embodiments, step 230 includes identifying a tag for manual review. For example, cloud building management platform 140 may identify a tag based on a confidence metric associated with the tag falling outside an acceptable range. For example, a confidence metric for a tag of a data point may be at a 20% level and cloud building management platform 140 may identify the tag as falling below a 40% confidence metric threshold. In various embodiments, cloud building management platform 140 identifies one or more data points and/or tags for manual review based on a confidence metric associated with the data points and/or tags. In various embodiments, cloud building management platform 140 generates confidence metrics for data points and/or tags using context data associated with the data points and/or tags. For example, cloud building management platform 140 may assign a low confidence metric value to a data point that frequently deviates from expected behavior (e.g., based on a model for predicting the behavior of the data point, etc.). In various embodiments, cloud building management platform 140 displays a confidence metric alongside a data point. For example, cloud building management platform 140 may identify a data point for manual review and may display a confidence metric associated with the data point when displaying a suggestion to review the data point to a user.

At step 240, cloud building management platform 140 may generate one or more suggested tags for the at least one data point. For example, cloud building management platform 140 may identify from a name of the data point a building the data point is associated with and may generate a suggested tag to associate the data point with the building. In various embodiments, the one or more suggested tags associate a data point with an entity such as a building space. In various embodiments, step 240 includes executing a machine learning model to generate the one or more suggested tags. For example, cloud building management platform 140 may execute an AI model using an identifier associated with a data point to generate a suggested tag for the data point. In some embodiments, step 240 includes dynamically controlling one or more environmental variables to determine a suggested tag. For example, cloud building management platform 140 may control an environmental variable for a space, may observe that sensor measurements associated with a data point reflect a change in the environmental variable, and may generate a suggestion to tag the data point as being associated with the space based on the observation. In some embodiments, the one or more suggested tags include a new tag. For example, a data point may be missing one or more tags and cloud building management platform 140 may generate one or more tags to fill the missing one or more tags. Additionally or alternatively, the one or more suggested tags may include an adjustment to an existing tag. For example, cloud building management platform 140 may generate a suggestion to change an existing tag from associating a HVAC component with a first space to associating the HVAC component with a second space. In some embodiments, step 240 includes surfacing the one or more suggested tags for manual review (e.g., displaying a GUI element to a user, etc.).

At step 250, cloud building management platform 140 may receive feedback from the manual review. For example, cloud building management platform 140 may receive an indication that a user has confirmed a suggested tag (e.g., by a user selecting a "confirmation" option in a GUI, etc.). In various embodiments, step 250 includes receiving a manual adjustment of a suggested tag from a user. For example, cloud building management platform 140 may suggest a tag having a first attribute to a user and may receive feedback from the user indicating that the tag should have a second attribute instead of the first attribute (e.g., associate a piece of equipment with a second building space rather than a first building space, etc.). In some embodiments, step 250 includes receiving a user validation of the one or more suggested tags. For example, a user may confirm that a suggested tag is correct. In various embodiments, step 250 may include increasing a confidence metric associated with a data point and/or a tag based on the received feedback. For example, cloud building management platform 140 may increase a confidence metric value associated with a data point in response to receiving a user confirmation that a tag of the data point is valid. In various embodiments, step 250 includes updating a machine learning model based on the received feedback. For example, a machine learning model may determine that data points having a first name are generally associated with equipment of a first type, cloud building management platform 140 may receive user feedback indicating that a data point having the first name is associated with equipment of a second type and may update the machine learning model based on the user feedback (e.g., such that a confidence of the machine learning model associating data points having the first name with equipment of a first type is reduced, etc.).

At step 260, cloud building management platform 140 may receive a second number of data points in the building. For example, cloud building management platform 140 may identify one or more data points based on a machine learning model that was updated based on user feedback during step 250 (e.g., where updating the machine learning model caused a number of confidence metrics associated with previously tagged data points to fall below a threshold, etc.). At step 270, cloud building management platform 140 may automatically tag at least a portion of the second number of data points with one or more second tags using the feedback from the manual review. For example, cloud building management platform 140 may receive feedback indicating that equipment that was previously tagged as being located in a first building is actually located in a second building and may update a number of tags associated with data points to reflect that the data points are associated with the second building instead of the first building. In various embodiments, step 270 includes updating one or more data points associated with a different building. For example, cloud building management platform 140 may perform method 200 for a first building and may use feedback received during execution of method 200 for the first building to update one or more tags for a second building (e.g., generate suggested tags for the second building based on the feedback received for the first building, etc.).

In some embodiments, method 200 includes identifying unreliable data and/or determining a substitute/proxy for unreliable data. For example, cloud building management platform 140 may detect a drift condition associated with a piece of equipment (e.g., using a fault detection and diagnosis system, etc.), may identify a root cause of the drift condition (e.g., using a machine learning model trained on historical operating data, using a rules engine, etc.), and may identify a substitute for sensor data associated with the piece of equipment based on the identified root cause. In some embodiments, identifying unreliable data includes analyzing a confidence metric and/or data health metric associated with an entity. For example, cloud building management platform 140 may identify that energy consumption data associated with a first building may be unreliable based on the first building having a low data health metric value. In some embodiments, method 200 includes analyzing a covariance between one or more entities. For example, cloud building management platform 140 may determine that a first piece of building equipment and a second piece of building equipment that historically have high covariance values suddenly became decoupled (e.g., are no longer correlated, etc.) and may identify the change a drift condition.

In some embodiments, method 200 includes suppressing one or more alarms. For example, cloud building management platform 140 may receive user feedback (e.g., during step 250, etc.) indicating that a piece of building equipment has been configured improperly (e.g., has an incorrect tag, etc.) and may suppress a number of alarms associated with the piece of building equipment because the alarms were based on the incorrect configuration of the piece of building equipment. In some embodiments, method 200 includes identifying an anomaly associated with an entity and/or determining a cause of the anomaly. For example, cloud building management platform 140 may identify a change in a trend associated with temperature measurements of a room (e.g., where the temperature measurements deviate from historical temperature measurements, etc.) and may determine a root cause of the change in the trend (e.g., a malfunctioning damper, an incorrectly configured temperature controller, etc.). In various embodiments, cloud building management platform 140 may automatically fix identified anomalies. For example, cloud building management platform 140 may automatically correct an incorrectly configured temperature controller that is causing a temperature anomaly in a room. Additionally or alternatively, cloud building management platform 140 may surface the anomalies to a user (e.g., via a GUI, etc.).

In some embodiments, method 200 includes adjusting one or more rules associated with a building management system. For example, a building management system may include a fault detection and diagnosis (FDD) system configured to generate alarms based on equipment faults and cloud building management platform 140 may dynamically adjust one or more rules used by the FDD system to generate alarms. In some embodiments, method 200 includes generating one or more templates. For example, cloud building management platform 140 may generate an equipment template for a piece of HVAC equipment specifying one or more attributes of the HVAC equipment (e.g., tags associated with the HVAC equipment, normal operating ranges of the HVAC equipment, an operational schedule for the HVAC equipment, etc.).

Figure 3:
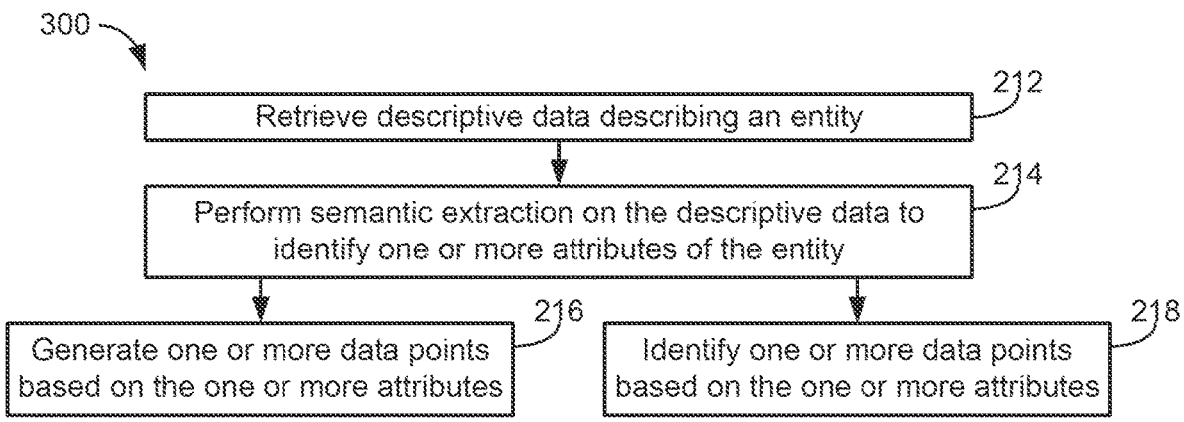
FIG. 3 is a flowchart of a method of extracting semantic information from descriptive data, according to an exemplary embodiment.

Referring now to FIG. 3, step 210 is shown in greater detail, according to an exemplary embodiment. At step 212, cloud building management platform 140 may retrieve descriptive data describing an entity. For example, cloud building management platform 140 may perform a "BACnet scan" to retrieve identifiers associated with one or more building controllers located in a building. At step 214, cloud building management platform 140 may perform semantic extraction on the descriptive data to identify one or more attributes of the entity. For example, cloud building management platform 140 may execute a NLP algorithm on an equipment identifier to determine a portion of a building that a piece of equipment is associated with. At step 216, cloud building management platform 140 may generate one or more data points based on the one or more attributes. For example, cloud building management platform 140 may generate a data structure, within a graph data structure representing a digital twin of a building, representing a data point associated with a thermostat based on identifying a thermostat identifier from within the descriptive data. As another example, cloud building management platform 140 may generate a data point representing an occupancy sensor and associate the data point with a room (e.g., via a tag, etc.) based on identifying a room identifier in the descriptive data. In various embodiments, step 216 occurs in response to determining that no existing data point relates to the entity (e.g., therefore a new data point must be created, etc.). At step 218, cloud building management platform 140 may identify one or more data points based on the one or more attributes. For example, cloud building management platform 140 may perform a lookup within a graph data structure using an identifier identified during step 214 to retrieve a data point associated with the entity. In various embodiments, step 218 includes identifying one or more existing data points associated with a building. For example, cloud building management platform 140 may identify an equipment identifier from within the descriptive data and may use the equipment identifier to retrieve a data point associated with the equipment identifier from within a building model such as a digital twin.

Figure 4:
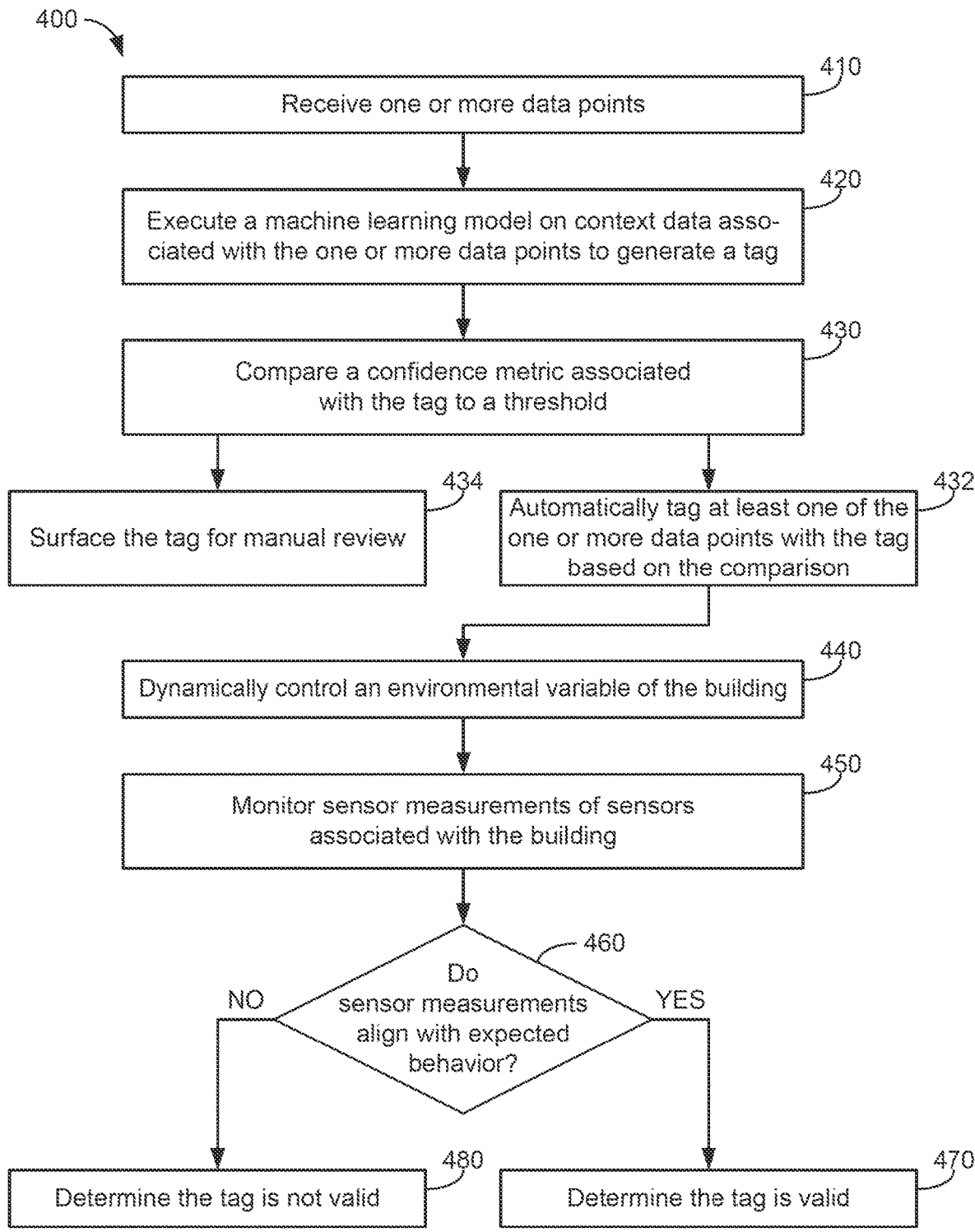
FIG. 4 is flowchart of a method of surfacing a tag for manual review and/or determining a validity of a tag, according to an exemplary embodiment.

Referring now to FIG. 4, step 220 is shown in greater detail, according to an exemplary embodiment. At step 410, cloud building management platform 140 may receive one or more data points. For example, cloud building management platform 140 may receive a data point from a user (e.g., via selection of the data point using a GUI, etc.). At step 420, cloud building management platform 140 may execute a machine learning model on context data associated with the one or more data points to generate a tag. For example, cloud building management platform 140 may execute a GPT-2 model trained using data mapping data points to their associated tags to generate a tag for the one or more data points. In some embodiments, step 420 includes generating multiple tags. In various embodiments, the context data includes information such as a location of a data point, a piece of equipment associated with a data point, historical operating parameters associated with a data point, an identifier of the data point, and/or the like. In some embodiments, the context data includes a confidence metric (e.g., a confidence metric associated with a likelihood that an existing tag of a data point is valid, etc.). In some embodiments, step 420 includes generating a confidence metric for the generated tag (e.g., based on the machine learning model, etc.).

At step 430, cloud building management platform 140 may compare a confidence metric associated with the tag to a threshold. For example, cloud building management platform 140 may compare a tag having a confidence metric value of 30% to a threshold. In some embodiments, the threshold is static (e.g., a fixed value, etc.). Additionally or alternatively, the confidence metric may be dynamic (e.g., change based on a type of data point, or type of equipment associated with the data point, etc.). At step 434, cloud building management platform 140 may surface the tag for manual review. For example, cloud building management platform 140 may surface a tag generated during step 420 for manual review in response to determining that the tag has a confidence metric value that is below a threshold value. In various embodiments, step 434 includes displaying a graphical user interface (GUI) to a user. GUIs relating to data points and/or tags are described in greater detail below.

At step 432, cloud building management platform 140 may automatically tag at least one of the one or more data points with the tag based on the comparison. For example, cloud building management platform 140 may automatically tag a data point with the tag generated by the machine learning model in response to determining that a confidence metric associated with the tag exceeds a threshold value. At step 440, cloud building management platform 140 may dynamically control an environmental variable of the building. For example, cloud building management platform 140 may override a temperature setpoint for a space to change a temperature of the space. In various embodiments, the environmental variable is associated with the one or more data points and/or the tag. For example, the one or more data points may include a data point associated with a thermostat in a space and step 440 may include adjusting a temperature of the space (e.g., by controlling HVAC equipment, etc.).

At step 450, cloud building management platform 140 may monitor sensor measurements of sensors associated with the building. For example, cloud building management platform 140 may monitor a temperature sensor associated with a room (e.g., located within the room, etc.). At step 460, cloud building management platform 140 may determine whether the sensor measurements align with expected behavior. For example, cloud building management platform 140 may compare an expected covariance of the sensor measurements and the change in the environmental variable to an actual covariance of the sensor measurements and the change in the environmental variable. At step 470 (YES), cloud building management platform 140 may determine the tag is valid. For example, cloud building management platform 140 may automatically close the blinds in a room, may measure (e.g., via a camera, etc.) an amount of ambient light in the room, and may determine whether a controller for the blinds is mapped to the correct room within a building model based on observing that the amount of ambient light in the room decreases in response to the blinds being closed. At step 480 (NO), cloud building management platform 140 may determine the tag is not valid. For example, cloud building management platform 140 may automatically disconnect a router from an Internet connection, may monitor user devices located in an area served by the router to determine whether they lose their Internet connection, and may determine that the router is incorrectly configured (e.g., has an incorrect tag associating the router with the location, etc.) based on observing that none of the user devices lose their Internet connection as would be expected.

Figure 5:
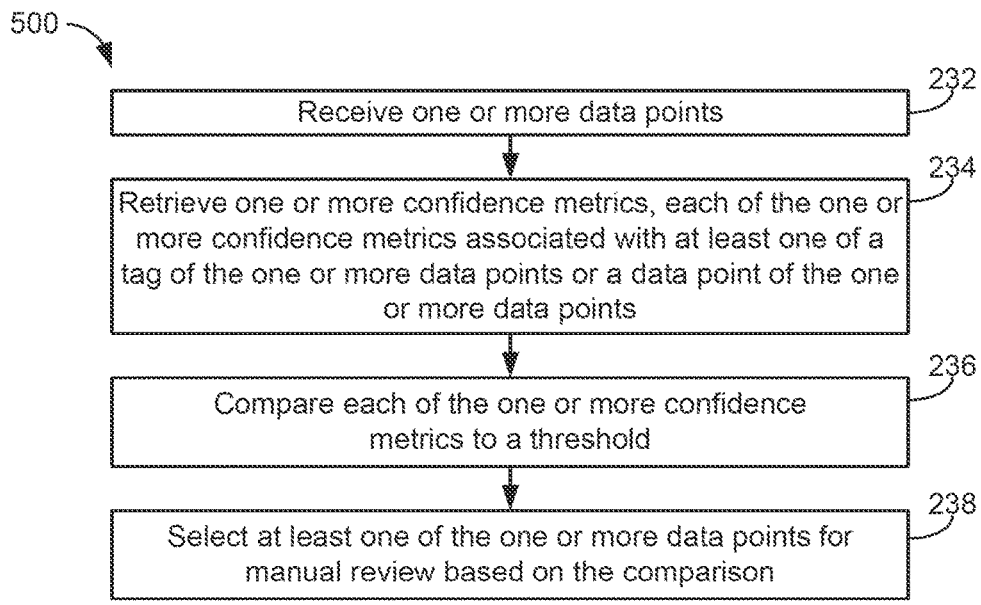
FIG. 5 is a flowchart of a method of selecting data points for manual review based at least in part on a confidence metric, according to an exemplary embodiment.

Referring now to FIG. 5, step 230 is shown in greater detail, according to an exemplary embodiment. At step 232, cloud building management platform 140 may receive one or more data points. At step 234, cloud building management platform 140 may retrieve one or more confidence metrics, each of the one or more confidence metrics associated with at least one of a tag of the one or more data points or a data point of the one or more data points. For example, cloud building management platform 140 may retrieve a confidence metric describing a likelihood (e.g., expressed as a percentage, etc.) that a HVAC damper is configured correctly (e.g., is tagged as serving the correct building space, etc.).

At step 236, cloud building management platform 140 may compare each of the one or more confidence metrics to a threshold. For example, cloud building management platform 140 may compare a confidence metric to a threshold range representing an acceptable range (e.g., a range at which a tag is more likely than not to be correct, etc.). In some embodiments, step 236 includes comparing the confidence metric to a number of ranges. At step 238, cloud building management platform 140 may select at least one of the one or more data points for manual review based on the comparison. For example, cloud building management platform 140 may determine that a number of data points having associated confidence metrics that are below a 50% threshold should be manually reviewed for accuracy.

Figure 6:
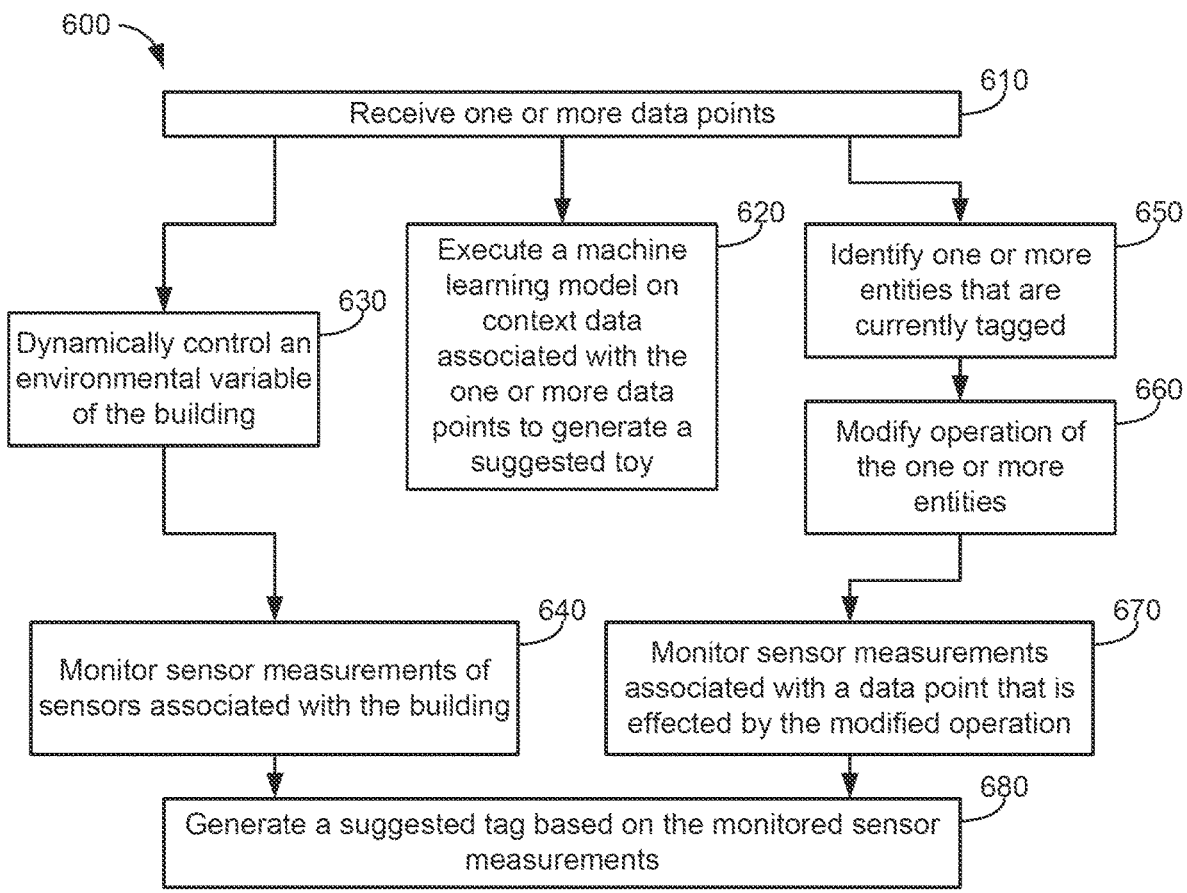
FIG. 6 is a flowchart of a method of generating suggested tags for one or more data points, according to an exemplary embodiment.

Referring now to FIG. 6, step 240 is shown in greater detail, according to an exemplary embodiment. At step 610, cloud building management platform 140 may receive one or more data points. At step 620, cloud building management platform 140 may execute a machine learning model on context data associated with the one or more data points to generate a suggested tag. For example, cloud building management platform 140 may execute an AI classifier on operational data associated with the one or more data points to generate a suggested tag describing a type of equipment the one or more data points are associated with. Additionally or alternatively, at step 630, cloud building management platform 140 may dynamically control an environmental variable of the building. For example, cloud building management platform 140 may automatically turn off lights in a particular space of a building associated with the one or more data points. At step 640, cloud building management platform 140 may monitor sensor measurements of sensors associated with the building. For example, cloud building management platform 140 may monitor a light sensor positioned in a room.

Additionally or alternatively, at step 650, cloud building management platform 140 may identify one or more entities that are correctly tagged. For example, cloud building management platform 140 may retrieve one or more data points that a user has previously validated (e.g., validating one or more tags associated with the one or more data points, etc.). As another example, cloud building management platform 140 may retrieve a data point having a high confidence metric value (e.g., 90%, 100%, etc.). At step 660, cloud building management platform 140 may modify operation of the one or more entities. For example, cloud building management platform may retrieve a data structure representing a thermostat that is correctly tagged (e.g., tagged as controlling a particular component of an HVAC system, etc.) and may modify a temperature setpoint associated with the thermostat. At step 670, cloud building management platform 140 may monitor sensor measurements associated with a data point that is effected by the modified operation. For example, cloud building management platform 140 may monitor a temperature sensor in a room effected by a change in temperature setpoint.

At step 680, cloud building management platform 140 may generate a suggested tag based on the monitored sensor measurements. For example, cloud building management platform 140 may generate a suggestion to tag a light controller as being associated with a particular room in response to observing a correlation between light measurements in the room and a command to change lighting conditions in the room. As another example, cloud building management platform 140 may generate a suggestion to adjust a tag for a temperature sensor from being associated with a first room to being associated with a second room in response to measuring a correlation between a change in a temperature setpoint associated with a thermostat that is known to be correctly tagged as relating to the first room and temperature measurements associated with the temperature sensor (e.g., where the temperature measurements do not reflect the change in the temperature setpoint, etc.).

Figure 7:
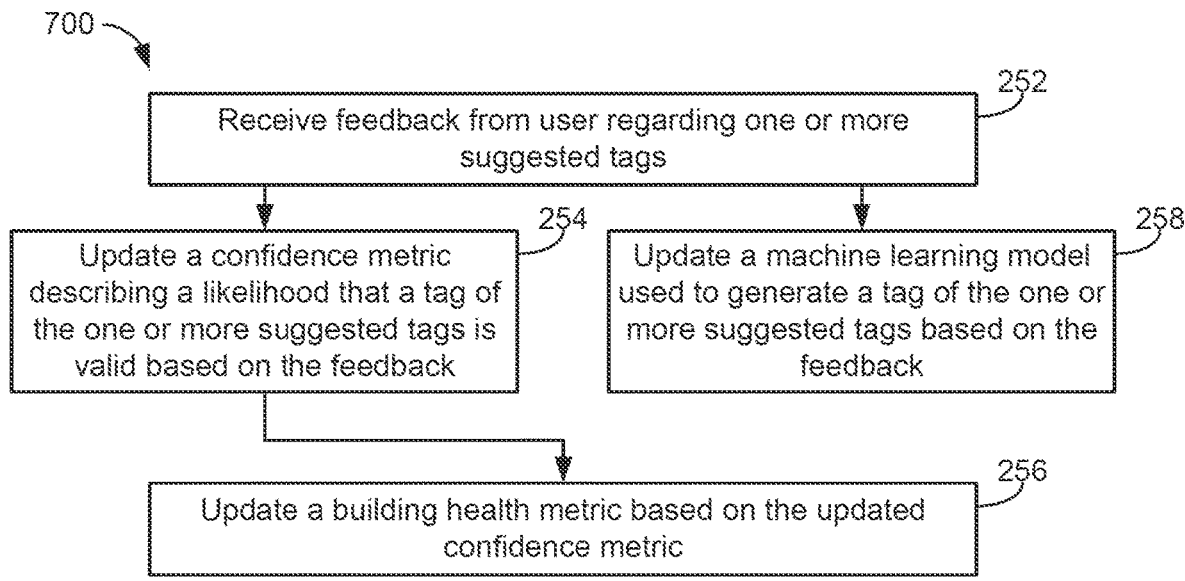
FIG. 7 is a flowchart of a method of updating a building health metric, according to an exemplary embodiment.

Referring now to FIG. 7, step 250 is shown in greater detail, according to an exemplary embodiment. At step 252, cloud building management platform 140 may receive feedback from one or more users regarding one or more suggested tags. For example, cloud building management platform 140 may receive a user validation of a suggested tag. As another example, cloud building management platform 140 may receive an adjustment of a suggested tag from a user (e.g., a user changing a tag associating a piece of HVAC equipment with a first space to associating the piece of HVAC equipment with a second space, etc.). At step 254, cloud building management platform 140 may update a confidence metric describing a likelihood that a tag of the one or more suggested tags is valid based on the feedback. For example, cloud building management platform 140 may increase a confidence metric value associated with the tag in response to receiving user feedback verifying the tag. As another example, cloud building management platform 140 may decrease a confidence metric value associated with a tag in response to a user indicating that the suggested tag is not valid.

At step 256, cloud building management platform 140 may update a building health metric based on the updated confidence metric. For example, cloud building management platform 140 may update a building health metric describing an aggregate level of confidence in the likelihood that tags in a building model relating to a building are correct. In various embodiments, step 256 includes computing an aggregate value using a number of confidence metrics associated with data points and/or tags in a building model. For example, cloud building management platform 140 may aggregate 10,000 confidence metrics associated with data points included in a building model for an office building. At step 258, cloud building management platform 140 may update a machine learning model used to generate a tag of the one or more suggested tags based on the feedback. For example, cloud building management platform 140 may at least partially retrain a machine learning model using the feedback. As another example, cloud building management platform 140 may update one or more weights associated with nodes in an AI neural network based on the feedback.

Figure 8:
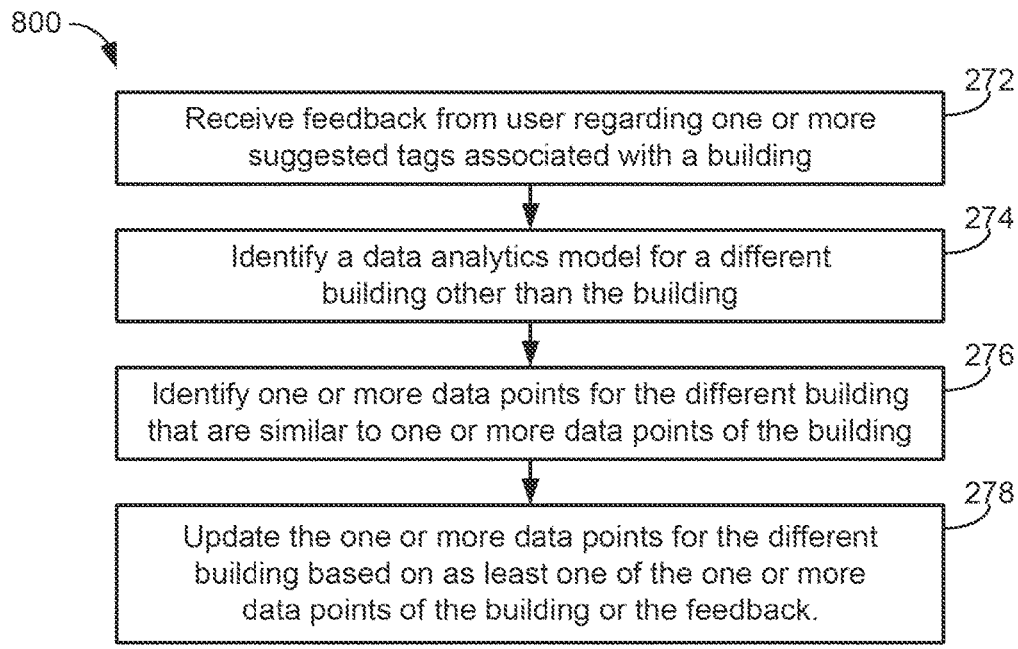
FIG. 8 is a flowchart of a method of updating one or more data points, according to an exemplary embodiment.

Referring now to FIG. 8, step 270 is shown in greater detail, according to an exemplary embodiment. At step 272, cloud building management platform 140 may receive feedback from one or more users regarding one or more suggested tags associated with a building. For example, cloud building management platform 140 may receive user feedback validating a suggested tag (e.g., confirming the suggested tag is correct, etc.). At step 274, cloud building management platform 140 may identify a data analytics model for a different building other than the building. For example, cloud building management platform 140 may retrieve a building model relating to a different building that is similar to the building (e.g., sharing one or more characteristics such as size, location, use, etc.). In some embodiments, cloud building management platform 140 identifies the data analytics model from within building model database 180.

At step 276, cloud building management platform 140 may identify one or more data points for the different building that are similar to the one or more data points of the building. For example, cloud building management platform 140 may retrieve, from the data analytics model for the different building, one or more data points associated with a thermostat that is of a similar type as a thermostat in the building. At step 278, cloud building management platform 140 may update the one or more data points for the different building based on at least one of the one or more data points of the building or the feedback. For example, cloud building management platform 140 may receive feedback indicating that HVAC equipment that was previously tagged as being of a first type is actually of a second type and may update the one or more data points for the different building based on the feedback. As another example, cloud building management platform 140 may determine that data points associated with a first type of equipment are tagged as relating to a first supplier in a first building model and may update a second building model to align the data points of the second building model that are associated with the first type of equipment to reflect the relation to the first supplier.

Figure 9:
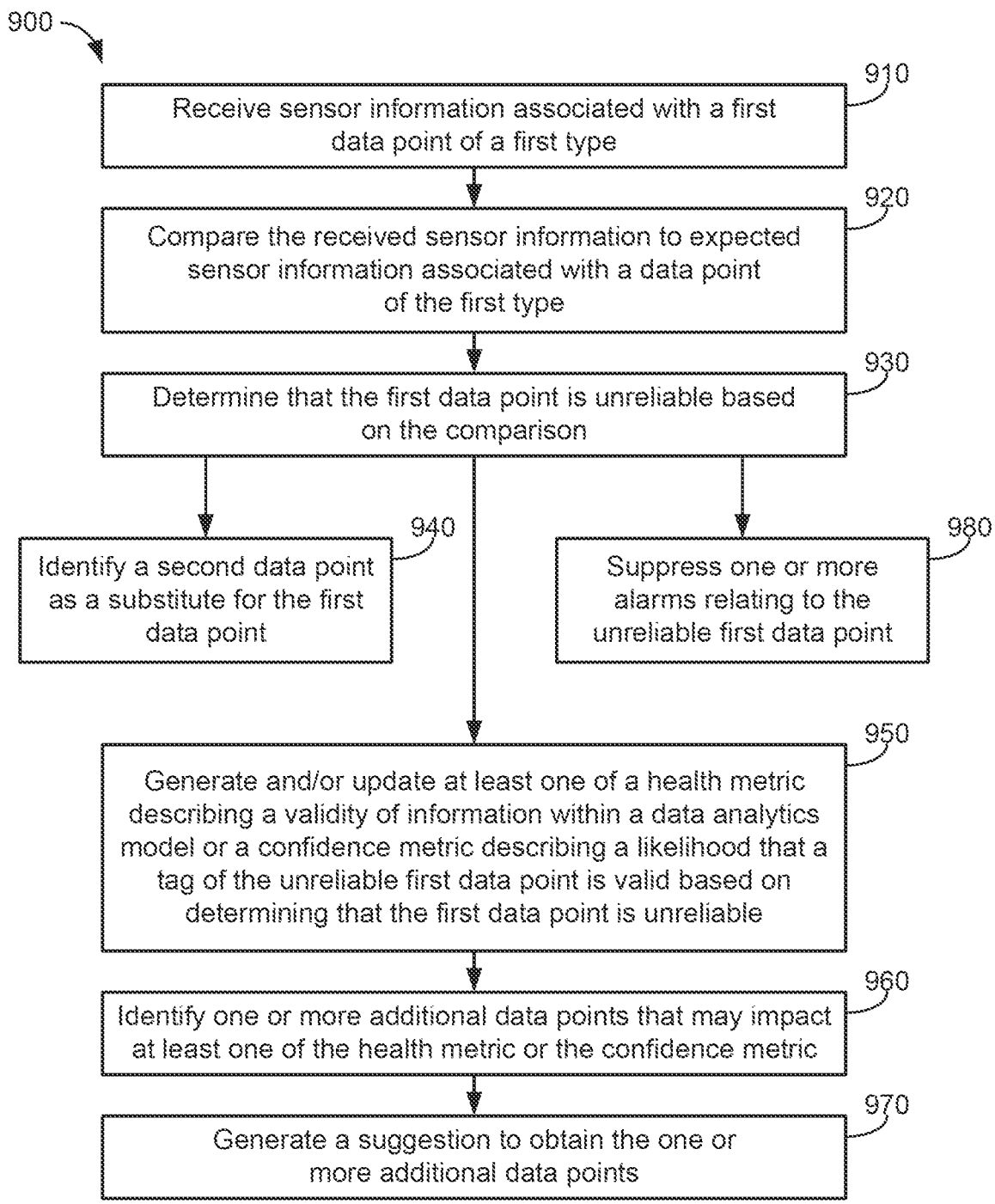
FIG. 9 is a flowchart of a method of generating a suggestion relating to one or more data points, according to an exemplary embodiment.

Referring now to FIG. 9, method 900 for generating a suggestion relating to one or more data points is shown, according to an exemplary embodiment. In various embodiments, cloud building management platform 140 performs method 900. Additionally or alternatively, any other system such as building management system 102 may perform method 900. At step 910, cloud building management platform 140 may receive sensor information associated with a first data point of a first type. For example, cloud building management platform 140 may receive temperature sensor measurements associated with a data point relating to a thermostat of a first model. At step 920, cloud building management platform 140 may compare the received sensor information to expected sensor information associated with a data point of the first type. For example, cloud building management platform 140 may compare the received temperature measurements associated with a space to expected temperature measurements associated with the space generated by a machine learning model trained on historical temperature data for the space. In some embodiments, the expected sensor information includes a measure of variance and/or statistical spread. For example, cloud building management platform 140 may compare the received sensor information to a mean value associated with similar sensor information in a historical database to determine how many standard deviations from the mean the received sensor information is.

At step 930, cloud building management platform 140 may determine that the first data point is unreliable based on the comparison. For example, cloud building management platform 140 may determine that the received sensor information deviates by a threshold amount (e.g., a threshold covariance, etc.), thereby indicating that the first data point is unreliable. In some embodiments, step 930 includes comparing a measure of variance and/or statistical spread associated with the received sensor information to a threshold value for statistical spread such as a threshold number of standard deviations.

At step 940, cloud building management platform 140 may identify a second data point as a substitute for the first data point. For example, cloud building management platform 140 may identify a second temperature sensor that is in the same room as a first temperature sensor that may serve as a substitute/proxy for the first temperature sensor (e.g., where temperature measurements from the second temperature sensor may be used to replace temperature measurements from the first temperature sensor in a building model, etc.). In various embodiments, step 940 includes identifying a second data point sharing one or more characteristics with the first data point. For example, cloud building management platform 140 may identify a second data point having a tag indicating that a piece of equipment associated with the second data point is in the same building space as a first data point for which the second data point will act as a substitute for. In various embodiments, step 940 includes identifying a second data point having a higher confidence metric value than a confidence metric of the first data point. For example, cloud building management platform 140 may identify a second data point having an associated confidence metric value of 80% which is greater than the confidence metric value of 20% for a first data point.

At step 950, cloud building management platform 140 may generate and/or update at least one of a health metric describing a validity of information within a data analytics model or a confidence metric describing a likelihood that a tag of the unreliable first data point is valid based on determining that the first data point is unreliable. For example, cloud building management platform 140 may update a confidence metric of the first data point to indicate that the first data point is unreliable (e.g., has a low confidence metric value, etc.). At step 960, cloud building management platform 140 may identify one or more additional data points that may impact at least one of the health metric or the confidence metric. For example, cloud building management platform 140 may identify a data point relating to a temperature sensor in the same room as a thermostat and may retrieve a confidence metric associated with the data point. As another example, cloud building management platform 140 may identify a data point that has yet to be set up but would be expected to exist given context parameters associated with a space. For example, cloud building management platform 140 may identify a data point associated with a thermostat that cloud building management platform 140 would predict exists in a room but has not yet been set up (e.g., established within a building model, etc.).

At step 970, cloud building management platform 140 may generate a suggestion to obtain the one or more additional data points. For example, cloud building management platform 140 may generate a suggestion to integrate a security subsystem with a building model to increase a confidence associated with a number of tags related to occupancy sensors. In various embodiments, step 970 includes displaying a GUI to a user. For example, step 970 may include displaying a GUI to a user listing one or more additional data points that the user may configure (e.g., add to the building model, etc.) in order to increase a confidence metric value associated with a data point.

In some embodiments, at step 980, cloud building management platform 140 may suppress one or more alarms relating to the unreliable data point. For example, cloud building management platform 140 may automatically suppress a number of FDD alarms that were generated using sensor measurements obtained from the unreliable data point. In various embodiments, suppressing an alarm includes removing the alarm from a user interface. For example, cloud building management platform 140 may delete an alarm notification relating to a piece of equipment associated with the unreliable data point.

Figure 10A:
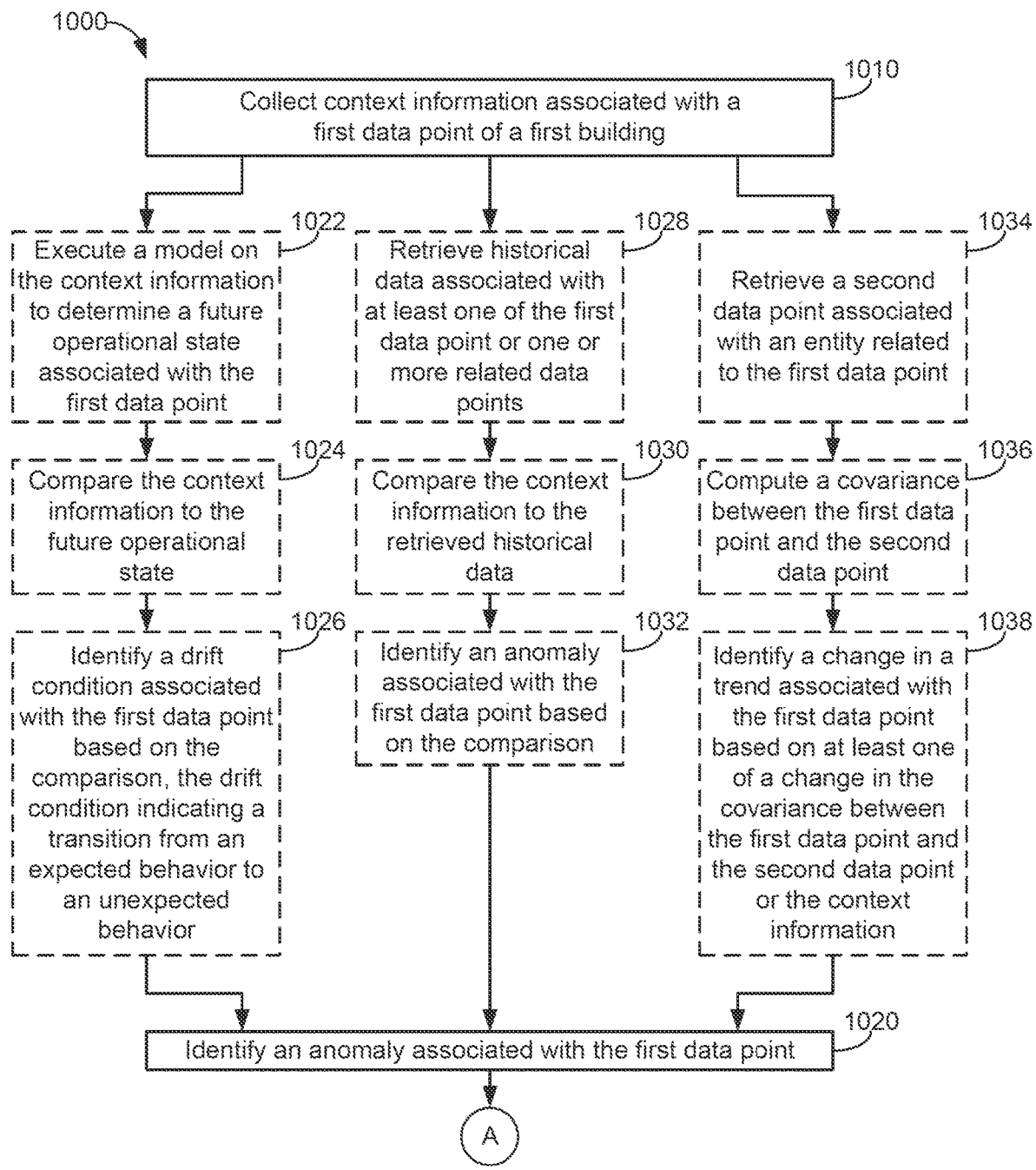
FIGS. 10A-10B are a flowchart of a method of identifying an anomaly and/or performing an action based at least in part on an anomaly, according to an exemplary embodiment.
Figure 10B:
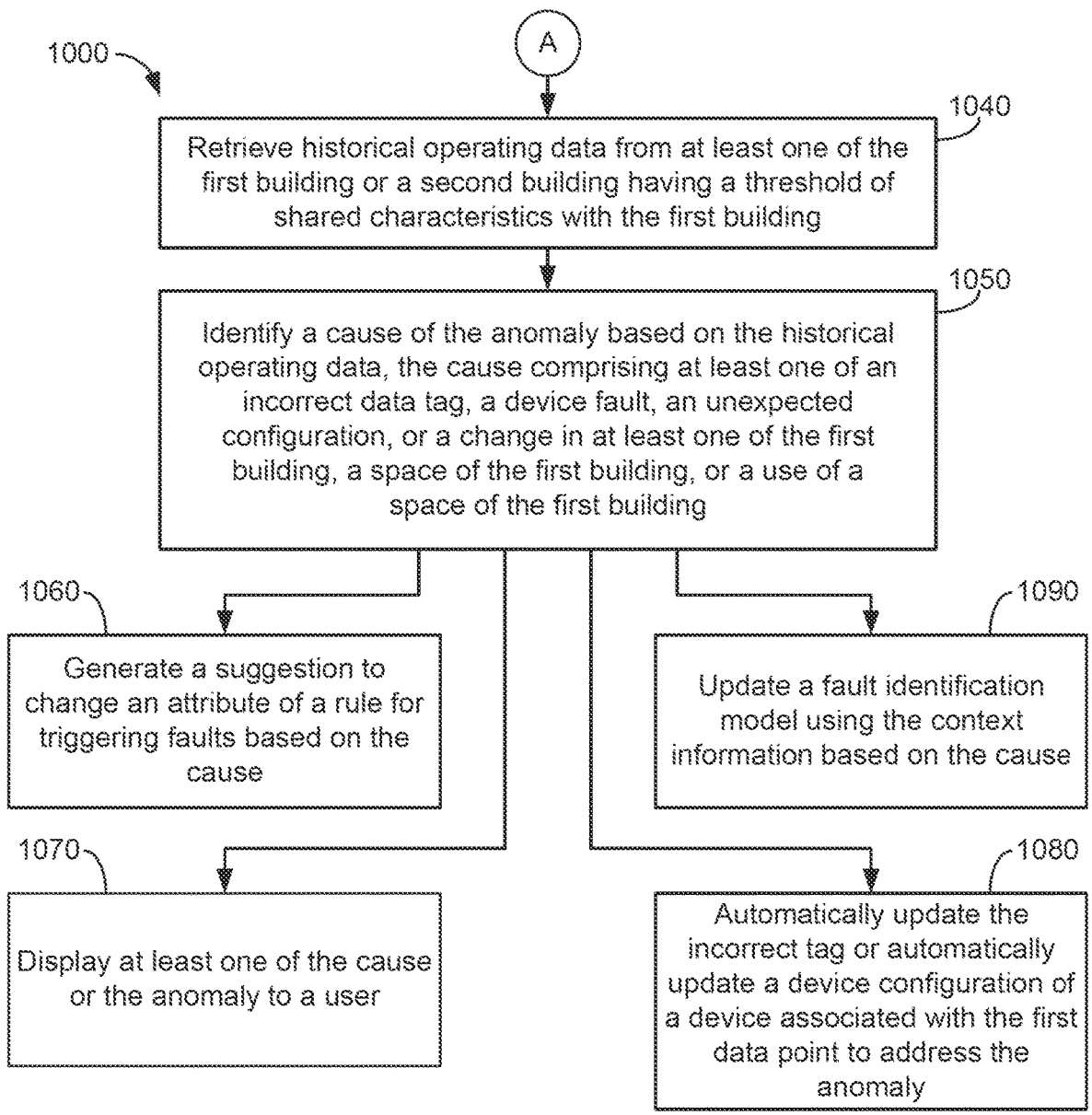

Referring now to FIGS. 10A-10B, method 1000 for identifying an anomaly and/or performing an action based at least in part on the identified anomaly is shown, according to an exemplary embodiment. In various embodiments, cloud building management platform 140 performs method 1000. At step 1010, cloud building management platform 140 may collect context information associated with a first data point of a first building. For example, cloud building management platform 140 may retrieve air flow measurements associated with an air-handling unit (AHU). As another example, cloud building management platform 140 may retrieve a temperature setpoint schedule associated with a space. In some embodiments, the context information includes historical operating data. For example, cloud building management platform 140 may retrieve damper settings for a HVAC system of a first type from a building model for a different building having the HVAC system of the first type. At step 1022, cloud building management platform 140 may execute a model on the context information to determine a future operational state associated with the first data point. For example, cloud building management platform 140 may execute a machine learning model to predict a number of temperature measurements associated with a space in the future based on the temperature setpoint schedule for the space.

At step 1024, cloud building management platform 140 may compare the context information to the future operational state. For example, cloud building management platform 140 may compare a measured temperature from a space to a predicted temperature generated by an AI model. In some embodiments, step 1024 includes determining an operation sequence for the first data point. For example, cloud building management platform 140 may determine that a smoke detector transitioned through state A, state B, and state C in sequence. At step 1026, cloud building management platform 140 may identify a drift condition associated with the first data point based on the comparison. For example, cloud building management platform 140 may identify a drift condition in response to determining that a measured temperature for a space deviates from a predicted temperature by a threshold amount (e.g., based on the comparison in step 1024, etc.). In various embodiments, the drift condition indicates a transition from an expected behavior to an unexpected behavior. In some embodiments, step 1026 includes identifying a drift condition based on a state transition sequence. For example, a building model may include a matrix of state transition sequences labeled as representing safe sequences and drift sequences and cloud building management platform 140 may identify a drift condition in response to identifying the first data point experiences one of the drift sequences.

Additionally or alternatively to steps 1022-1026, at step 1028, cloud building management platform 140 may retrieve historical data associated with at least one of the first data point or one or more related data points. For example, cloud building management platform 140 may retrieve historical security access requests associated with a data point representing an access control device (e.g., a smart door lock, a door controller, etc.). At step 1030, cloud building management platform 140 may compare the context information to the retrieved historical data. For example, cloud building management platform 140 may compare a proximity of employees workspaces to a control access device in a historical log to the proximity of employees workspaces to the control access device over the last week (e.g., to determine whether the group of individuals using a particular door has changed over time, etc.).

At step 1032, cloud building management platform 140 may identify an anomaly associated with the first data point based on the comparison. For example, cloud building management platform 140 may identify an anomaly in response to determining that a temperature of a space exceeds the historical temperature for the space by several standard deviations. In various embodiments, the anomaly relates to the first data point. For example the first data point may be related to a temperature sensor for a room and the first anomaly may be a high temperature anomaly.

Additionally or alternatively to step 1022-1026 and/or steps 1028-1032, at step 1034, cloud building management platform 140 may retrieve a second data point associated with an entity related to the first data point. For example, cloud building management platform 140 may retrieve a data point associated with a temperature sensor of a same type as a temperature sensor associated with a second data point. In various embodiments, the entity related to the first data point shares one or more characteristics (e.g., entity type, entity location, etc.) with an entity related to the second data point.

At step 1036, cloud building management platform 140 may compute a covariance between the first data point and the second data point. For example, cloud building management platform 140 may compute a covariance between temperature measurements of a first thermostat associated with the first data point and a temperature measurements of a second thermostat associated with the second data point. At step 1038, cloud building management platform 140 may identify a change in a trend associated with the first data point based on at least one of a change in the covariance between the first data point and the second data point or the context information. For example, cloud building management platform 140 may determine that two lighting controllers generally have the same schedule (e.g., there is a high covariance in the schedules of the two lighting controllers, etc.) and suddenly the schedules of the two lighting controllers differ dramatically and may identify the change as a change in a trend associated with a data point associated with one of the lighting controllers.

At step 1020, cloud building management platform 140 may identify an anomaly associated with the first data point. In various embodiments, step 1020 includes performing one of steps 1022-1038. Additionally or alternatively, step 1020 may include other processes as described herein. In various embodiments, the anomaly may include a drift condition and/or a change in a trend. At step 1040, cloud building management platform 140 may retrieve historical operating data from at least one of the first building or a second building having a threshold of shared characteristics with the first building. In various embodiments, step 1040 includes retrieving information from a building model (e.g., a building model such as a digital twin of the first building and/or the second building, etc.). For example, cloud building management platform 140 may retrieve historical carbon monoxide measurements from a building model associated with the second building.

At step 1050, cloud building management platform 140 may identify a cause of the anomaly based on the historical operating data. For example, cloud building management platform 140 may determine that a faulty HVAC damper is causing a high temperature anomaly associated with a space. In various embodiments, the cause includes at least one of an incorrect tag, a device fault, an unexpected configuration, or a change in at least one of the first building, a space of the first building, or a use of a space of the first building. For example, the cause may be a thermostat tagged as relating to a first room when in reality it is actually related with a second room. As another example, the cause may be a faulty piece of equipment. As another example, the cause may be an access control device configured to use an access whitelist (e.g., a database indicating who has access to spaces within a building, etc.) for a building other than the building the access control device is associated with (e.g., the wrong building, etc.). As another example, the cause may be a room of a building used to be used as a conference room but is now being used as a workspace.

In various embodiments, method 1000 includes performing one or more actions. For example, at step 1060, cloud building management platform 140 may generate a suggestion to change an attribute of a rule for triggering faults based on the cause. For example, cloud building management platform 140 may determine that an acceptable temperature range for a room was set too narrowly and may generate a suggestion to increase the range of acceptable temperatures for the space (e.g., to reduce future false alarms, etc.). At step 1070, cloud building management platform 140 may display at least one of the cause or the anomaly to a user. For example, cloud building management platform 140 may display a GUI to a user including the message: "Air filter needs replacing, please replace to reduce air particulate alarms." At step 1080, cloud building management platform 140 may automatically update the incorrect tag or automatically update a device configuration of a device associated with the first data point to address the anomaly. For example, cloud building management platform 140 may update tag included in a building model to change a data point from being associated with a first space to being associated with a second space. At step 1090, cloud building management platform 140 may update a fault identification model using the context information based on the cause. For example, cloud building management platform 140 may update a FDD model to change one or more parameters associated with identifying an HVAC alarm based on determining the cause to be an incorrect lower temperature alarm threshold.

Referring now to FIG. 11, user interface 1100 for labeling a data point is shown, according to an exemplary embodiment. In various embodiments, cloud building management platform 140 displays user interface 1100 in response to receiving data representing one or more entities to be incorporated into a building model such as a digital twin. For example, cloud building management platform 140 may receive a table including strings and data and may perform semantic extraction on the strings to identify a building equipment identifier within a string, generate a data point corresponding to a piece of building equipment identified by the building equipment identifier, and map the data to the data point. In various embodiments, user interface 1100 includes data point 1110 and one or more parameters 1120. For example, user interface 1100 may include a data point such as an equipment identifier representing a piece of HVAC equipment. Parameters 1120 may correspond to one or more tags associated with data point 1110. For example, a data point associated with a thermostat may include a first parameter describing an entity type (e.g., thermostat, etc.), a second parameter describing a space within a building (e.g., room 2) and a third parameter describing a building (e.g., building 4E). In various embodiments, parameters 1120 correspond to one or more tags associated with data point 1110.

In various embodiments, user interface 1100 includes a recommendation for parameters 1120. For example, cloud building management platform 140 may execute a machine learning model on context information associated with data point 1110 to identify one or more suggested tags for data point 1110 and may display the one or more suggested tags as parameters 1120. Additionally or alternatively, user interface 1100 may facilitate a user to manually adjust parameters 1120. For example, a user may select a different parameter from a dropdown associated with parameters 1120. In various embodiments, user interface 1100 includes confidence metric 1130 describing a likelihood that parameters 1120 associated with data point 1110 are accurate. For example, cloud building management platform 140 may analyze context information associated with data point 1110 to generate confidence metric 1130. In various embodiments, confidence metric 1130 is updated based on the combination/selection of parameters 1120. In various embodiments, confidence metric 1130 is an interactive element. For example, a user may hover a cursor over confidence metric 1130 to view additional information associated with how the confidence metric was generated and/or how to increase a value of the confidence metric.

In various embodiments, user interface 1100 includes one or more options 1140. Options 1140 may facilitate a user to update a building model. For example, options 1140 may include a "Yes" option and/or a "No" option to tag data point 1110 using parameters 1120. In various embodiments, in response to a user selection of a "Yes" option, cloud building management platform 140 may update a building model to tag data point 1110 using parameters 1120. In various embodiments, in response to a user selection of a "No" option, cloud building management platform 140 may not update a building model. Additionally or alternatively, cloud building management platform 140 may update a confidence metric associated with data point 1110 and/or one or more tags associated with data point 1110 based on a user interaction with options 1140.

Referring now to FIG. 12, user interface 1200 for labeling a data point is shown, according to an exemplary embodiment. In various embodiments, cloud building management platform 140 displays user interface 1200 in response to receiving data representing one or more entities to be incorporated into a building model such as a digital twin. User interface 1200 is shown to include data point 1210 and one or more configurations 1220. Each of configurations 1220 may include one or more parameters 1224 and confidence metric 1226. In various embodiments, cloud building management platform 140 generates configurations 1220 based on a machine learning model. For example, cloud building management platform 140 may generate configurations 1220 representing a number of possible tags associated with data point 1210. In various embodiments, a user may select one of configurations 1220 to indicate that the user wishes to apply the selected configuration to data point 1210.

In various embodiments, parameters 1224 may correspond to one or more tags associated with data point 1210. For example, a data point associated with a thermostat may include a first parameter describing an entity type (e.g., thermostat, etc.), a second parameter describing a space within a building (e.g., room 2) and a third parameter describing a building (e.g., building 4E). In various embodiments, parameters 1224 are interactive elements. For example, a user may click on one of parameters 1224 to open a template associated with the selected parameter (e.g., a device template for a thermostat, etc.). Additionally or alternatively, hovering over parameters 1224 may display additional information associated with the parameter. In various embodiments, confidence metric 1226 describes a likelihood that each of configurations 1220 are accurate.

In various embodiments, user interface 1200 includes one or more options 1230. For example, options 1230 may include an "Accept" option, a "Reanalyze" option, and/or a "Skip" option. In various embodiments, cloud building management platform 140 performs one or more actions in response to a user selection of options 1230. For example, cloud building management platform 140 may update a building model to tag data point 1210 with one or more tags based on a selected configuration 1220 according to the associated parameters 1224. As another example, cloud building management platform 140 may update a machine learning model based on user feedback to increase an accuracy of future configuration suggestions. In some embodiments, a user selection of a "Reanalyze" option may cause cloud building management platform 140 to reanalyze information associated with data point 1210 (e.g., context information, etc.) to generate one or more new configurations 1220. In some embodiments, a user selection of a "Skip" option may cause user interface 1200 to skip configuration of the current data point 1210.

Figure 13:
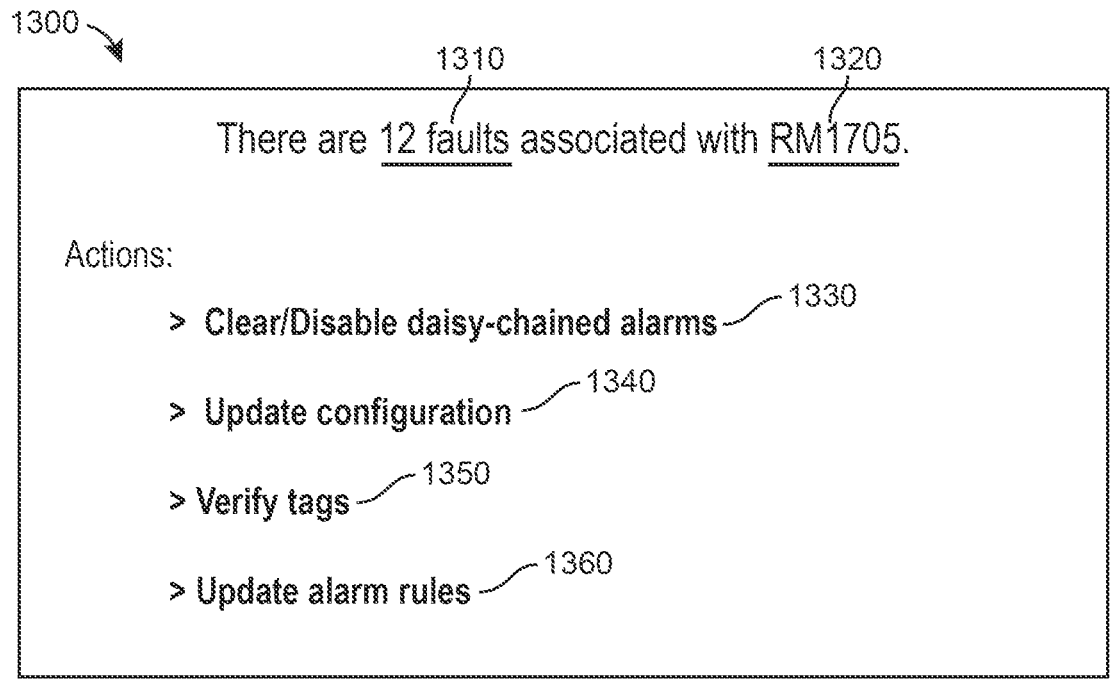
FIG. 13 is a graphical user interface for addressing a fault associated with a piece of equipment, according to an exemplary embodiment.

Referring now to FIG. 13, user interface 1300 for addressing a fault associated with an entity is shown, according to an exemplary embodiment. In various embodiments, cloud building management platform 140 generates user interface 1300. For example, cloud building management platform 140 may generate user interface 1300 in response to identifying an unusual number of faults associated with a piece of equipment. User interface 1300 is shown to include faults 1310, entity 1320, and options 1330-1360. In various embodiments, user interface 1300 presents a number of options for addressing faults associated with an entity. For example, an incorrectly configured data point may be causing a number of device faults and user interface 1300 may suggest a number of options to fix the incorrect configuration and/or remove the nuisance device faults. In various embodiments, faults 1310 describe one or more faults that are associated with entity 1320. In some embodiments, faults 1310 is an interactive element. For example, a user may select faults 1310 to display a faults user interface listing the faults associated with entity 1320. Entity 1320 may include an entity identifier and/or a data point associated with an entity such as a piece of building equipment. In various embodiments, entity 1320 is an interactive element. For example, a selection of entity 1320 may open a GUI map of a building and highlight a piece of equipment associated with entity 1320.

Options 1330-1360 may include one or more actions a user may take to resolve faults associated with entity 1320. For example, options 1330-1360 may include first action 1330 to clear/disable daisy-chained alarms, second action 1340 to update a configuration (e.g., of a data point, etc.), third option 1350 to verify tags (e.g., tags associated with a data point of entity 1320, etc.), and fourth option 1360 to update alarm rules (e.g., alarm rules associated with generating an alarm for entity 1320. In various embodiments, first action 1330 may disable one or more alarms and/or faults that are daisy-chained. For example, cloud building management platform 140 may disable (e.g., silence, etc.) a number of alarms that all stem from a single sensor measurement. Second action 1340 may cause cloud building management platform 140 to update a device configuration associated with entity 1320. For example, cloud building management platform 140 may update one or more tags associated with entity 1320 stored in a building model. Third action 1350 may verify one or more tags associated with entity 1320. For example, cloud building management platform 140 may execute a machine learning model on context information associated with entity 1320 to determine whether one or more tags associated with entity 1320 are valid. As another example, cloud building management platform 140 may dynamically control one or more environmental variables associated with entity 1320 to determine a validity of one or more tags associated with entity 1320.

Fourth action 1360 may cause cloud building management platform 140 to update one or more alarm rules associated with generating alarms/faults for entity 1320 and/or entities of a similar type as entity 1320. For example, fourth action 1360 may cause cloud building management platform 140 to update a lower temperature threshold associated with an acceptable temperature range used for generating temperature faults for an HVAC system.

Figure 14:
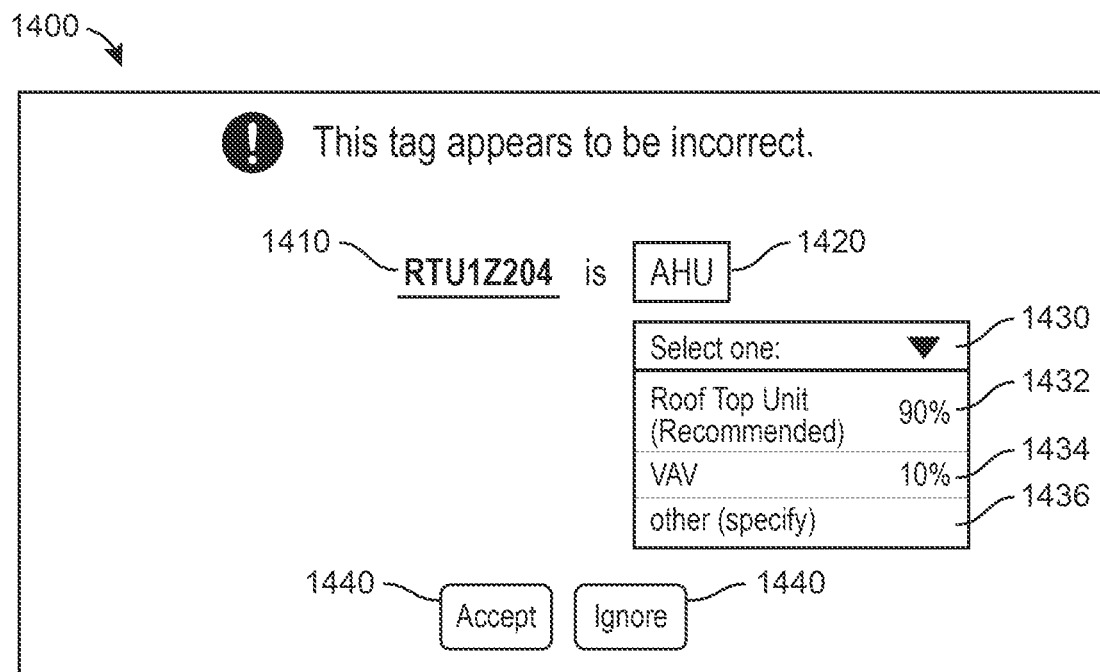
FIG. 14 is a graphical user interface for correcting a tag associated with an entity, according to an exemplary embodiment.

Referring now to FIG. 14, user interface 1400 for correcting a tag associated with an entity is shown, according to an exemplary embodiment. In various embodiments, cloud building management platform 140 generates user interface 1400. For example, cloud building management platform 140 may generate user interface 1400 in response to determining that a confidence metric associated with a data point falls below a threshold. In some embodiments, cloud building management platform continuously analyzes a building model to determine a health of one or more data points (e.g., a validity of tags associated with the data points, a validity of sensor measurements associated with the data points, etc.) and surfaces "unhealthy" data points to a user. For example, cloud building management platform 140 may determine that a tag relating to an entity type is likely incorrect (e.g., based on a low confidence metric associated with the tag, etc.) and may surface the tag and/or the data point to a user for review/correction.

User interface 1400 is shown to include entity 1410, tag 1420, parameters 1430-1436, and options 1440. In various embodiments, entity 1440 represents a data point or an entity such as a piece of building equipment represented within a building model such as a digital twin. In various embodiments, entity 1410 is an interactive element. For example, a user may select entity 1410 to display additional information associated with entity 1410 such as sensor data associated with a temperature sensor or a temperature setpoint schedule associated with a thermostat. In various embodiments, entity 1410 is represented using an identifier, however other representations are possible. In various embodiments, tag 1420 is a tag associated with a data point associated with entity 1410. For example, tag 1420 may describe a building equipment type tag associated with a data point representing a HVAC controller. In various embodiments, tag 1420 is identified as an incorrect tag.

Parameters 1430-1436 may include one or more options for different tags to replace tag 1420. In various embodiments, each of parameters 1430-1436 includes an associated confidence metric describing a likelihood that the particular tag is correct. In some embodiments, parameters 1430-1436 include a recommended parameter (e.g., roof top unit, etc.). In various embodiments, the recommended parameter includes a tag having the highest associated confidence metric value. In various embodiments, cloud building management platform 140 generates parameters 1430-1436 using a machine learning model. In some embodiments, a user may manually enter a parameter. For example, a user may select an option to manually enter a tag and may type in a tag for entity 1410 (e.g., parameter 1436, etc.). In various embodiments, selection of options 1440 cause cloud building management platform 140 to perform one or more actions. For example, options 1440 may include a first "Accept" option and a second "Ignore" option. In some embodiments, selection of an "Accept" option may cause cloud building management platform 140 to update one or more parameters (e.g., tags) associated with entity 1410 such as a tag of a data point related to entity 1410. In some embodiments, cloud building management platform 140 updates one or more models based on a user selection using user interface 1400. For example, cloud building management platform 140 may update a confidence metric associated with tag 1420 in response to a user selection to ignore the request to update tag 1420 (e.g., selection of "Ignore" option, etc.).

Figure 15:
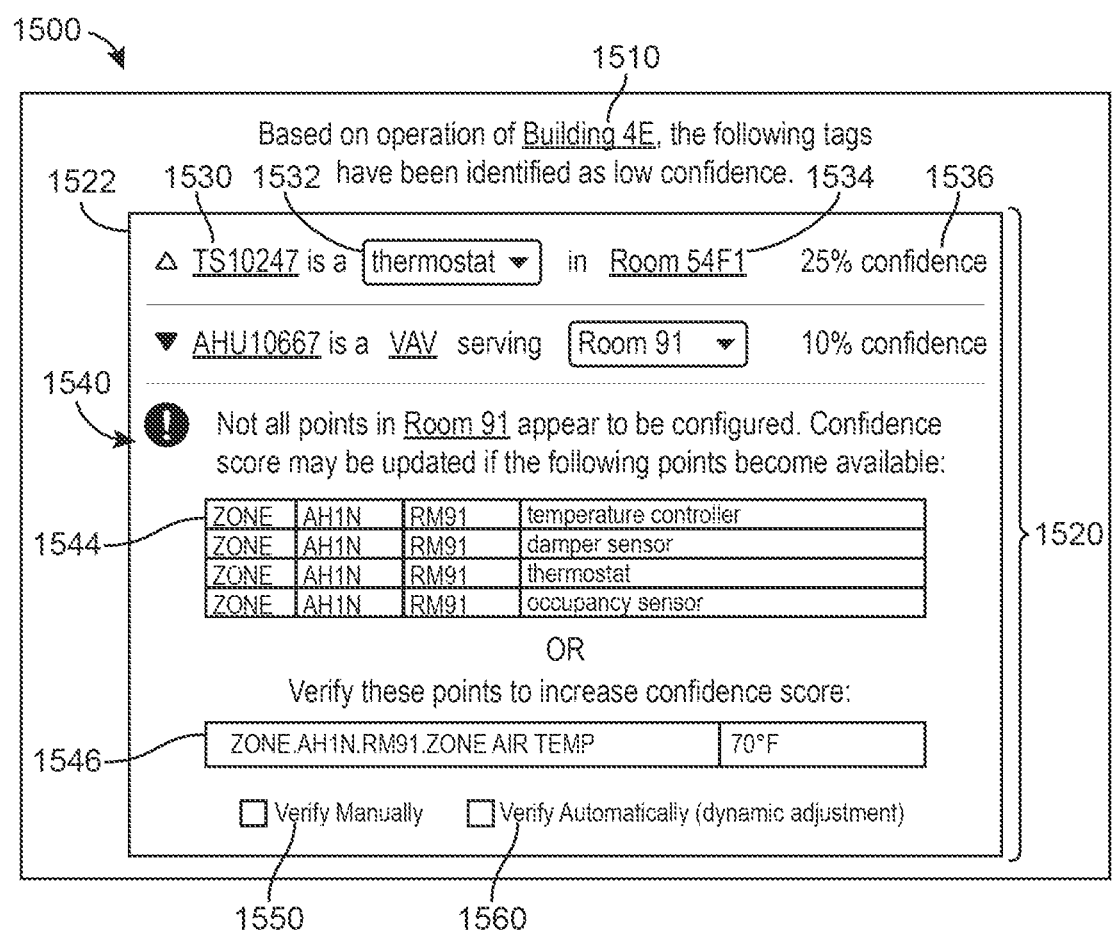
FIG. 15 is a graphical user interface for increasing a confidence associated with an entity tag, according to an exemplary embodiment.

Referring now to FIG. 15, user interface 1500 for increasing a confidence associated with a tag is shown, according to an exemplary embodiment. In various embodiments, cloud building management platform 140 displays user interface 1500. For example, cloud building management platform 140 may display user interface 1500 in response to identifying a number of data points having low confidence metric values. In various embodiments, cloud building management platform 140 generates user interface 1500 based on an operation of a building. For example, cloud building management platform 140 may determine that, based on operational data from operation of a building, one or more tags associated with data points in a building model representing the building may be incorrect, and may display user interface 1500 in response.

In various embodiments, user interface 1500 includes entity 1510 and list 1520. Entity 1510 may identify an entity such as a building. In various embodiments, entity 1510 is an interactive element. For example, a user may select entity 1510 to display additional information associated with entity 1510. List 1520 may identify one or more data points that may have incorrect configurations such as incorrect tags. For example, cloud building management platform 140 may determine that, based on operation of entity 1510, a data point that was tagged as relating to a thermostat appears to instead relate to an AHU and may display the data point in list 1520. List 1520 may include elements 1522. Each of elements 1522 to relate to a data point. In various embodiments, elements 1522 include a dropdown option to display additional information associated with the element. Each of elements 1522 may include data point 1530, first parameter 1532, second parameter 1534, and/or confidence metric 1536. In some embodiments, elements 1522 include great, fewer, or a different combination of features (e.g., three parameters rather than two, etc.). In various embodiments, each parameter (e.g., first parameter 1532, second parameter 1534, etc.) relates to a different tag associated with data point 1530. For example, first parameter 1532 may relate to a tag describing an entity type of data point 1530.

In various embodiments, each of elements 1522 includes a parameter associated with a low confidence. For example, "TS10547" includes a "thermostat" parameter having a low confidence and "AHU10667" includes a "Room 91" parameter having a low confidence. In various embodiments, cloud building management platform 140 identifies parameters (e.g., tags, etc.) for review based on an associated confidence metric falling below a threshold value. In various embodiments, a user may select a dropdown option to view additional information associated with a parameter for review. For example, a user may select a dropdown option associated with "AHU10667" to display menu 1540. Menu 1540 may display second entity 1542 describing a space associated with entity 1510 for which additional data would improve a confidence metric value associated with one or more associated data points. For example, cloud building management platform 140 may be able to generate a more accurate model of a space if data from a HVAC controller serving the space became available and may generate a suggestion to configure the HVAC controller so that cloud building management platform 140 may use the data to verify a tag of a piece of equipment in the space, thereby increasing a confidence metric associated with the tag.

In various embodiments, menu 1540 includes data point list 1544. Data point list 1544 may include a number of data points that, if configured (e.g., if integrated into a building model, etc.), would increase an accuracy of a model used to verify a validity of data points and/or tags of the building model. Additionally or alternatively, menu 1540 may include validation data points 1546 describing one or more data points, that if validated (e.g., validating a configuration of the data points such as the tags of the data point, etc.), would increase a confidence associated with data point 1530. In various embodiments, validation data points 1546 are associated with data point 1530. For example, validation data points 1546 may be in a similar space as data point 1530 and/or share one or more characteristics with data point 1530. In various embodiments, menu 1540 includes options 1550 and 1560 for verifying validation data points 1546. For example, a user may select option 1550 to manually verify a data point of validation data points 1546. Additionally or alternatively, a user may select option 1560 to automatically verify a data point of validation data points 1546. For example, selection of option 1560 may cause cloud building management platform 140 to perform a dynamic adjustment process including controlling one or more environmental parameters, receiving one or more sensor measurements, and verifying a data point of validation data points 1546 based on the one or more sensor measurements.

Figure 16:
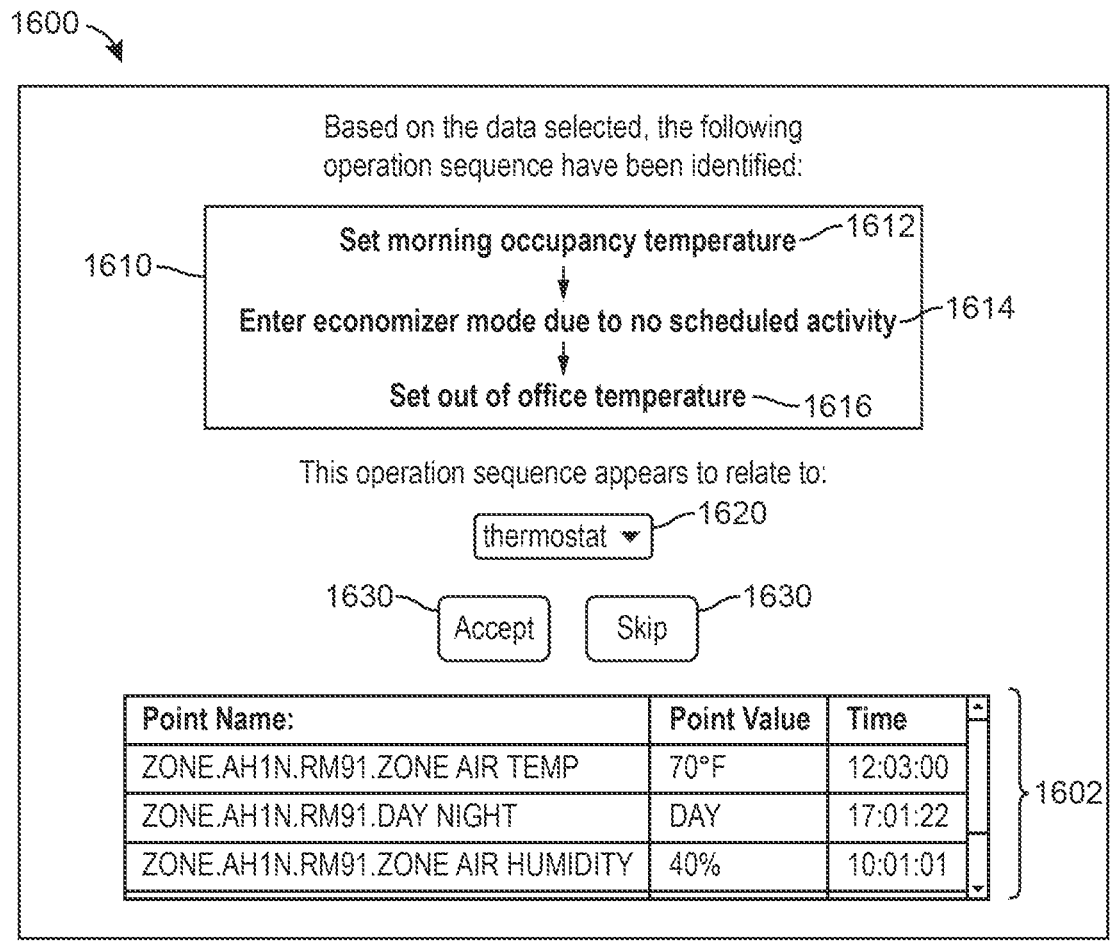
FIG. 16 is a graphical user interface for tagging data, according to an exemplary embodiment.

Referring now to FIG. 16, user interface 1600 for tagging data is shown, according to an exemplary embodiment. In various embodiments, cloud building management platform 140 generates user interface 1600. User interface 1600 is shown to include data 1602, operation sequence 1610, parameter 1620, and options 1630. In various embodiments, user interface 1600 facilitates a user to determine a tag for a data point based on a selection of data (e.g., data 1602). For example, a user may select a portion of data, cloud building management platform 140 may identify one or more operation sequences associated with the data, and may generate a suggested tag associated with a data point related to the data based on the identified operation sequences. In various embodiments, cloud building management platform 140 executes a machine learning model to generate operation sequence 1610. In various embodiments, hovering a cursor over an element in operation sequence 1610 may highlight one or more data elements in data 1602 that are associated with the particular operation sequence element. For example, using a cursor to hover over an operation sequence element of "Set morning occupancy temperature" may highlight a command in data 1602 relating to changing a temperature setpoint of a space at 9:00 AM in the morning.

In various embodiments, operation sequence 1610 includes one or more elements, shown as elements 1612-1616. For example, operation sequence 1610 may include a first element "Set morning occupancy temperature," a second element "Enter economizer mode due to no scheduled activity," and a third element "Set out of office temperature." In various embodiments, cloud building management platform 140 maps operation sequence 1610 to one or more parameters such as tags associated with a data point associated with data 1602. For example, cloud building management platform 140 may determine that typically operation sequences of a particular type are associated with thermostat entities and may generate a recommendation to create a data point from the data and tag the data point with a thermostat type tag. In various embodiments, user interface 1600 displays a recommended parameter (e.g., a tag, etc.) using parameter 1620. In various embodiments, parameter 1620 facilitates a user to change a tag. For example, a user may select a different entity type tag using a dropdown of parameter 1620. In various embodiments, options 1630 facilitate accepting or denying a suggested parameter. For example, a first option may include "Accept tag" and a second option may include "Skip." In various embodiments, in response to a user selecting an "Accept tag" option, cloud building management platform 140 may update a building model to include a data point tagged with parameter 1620.

Figure 17:
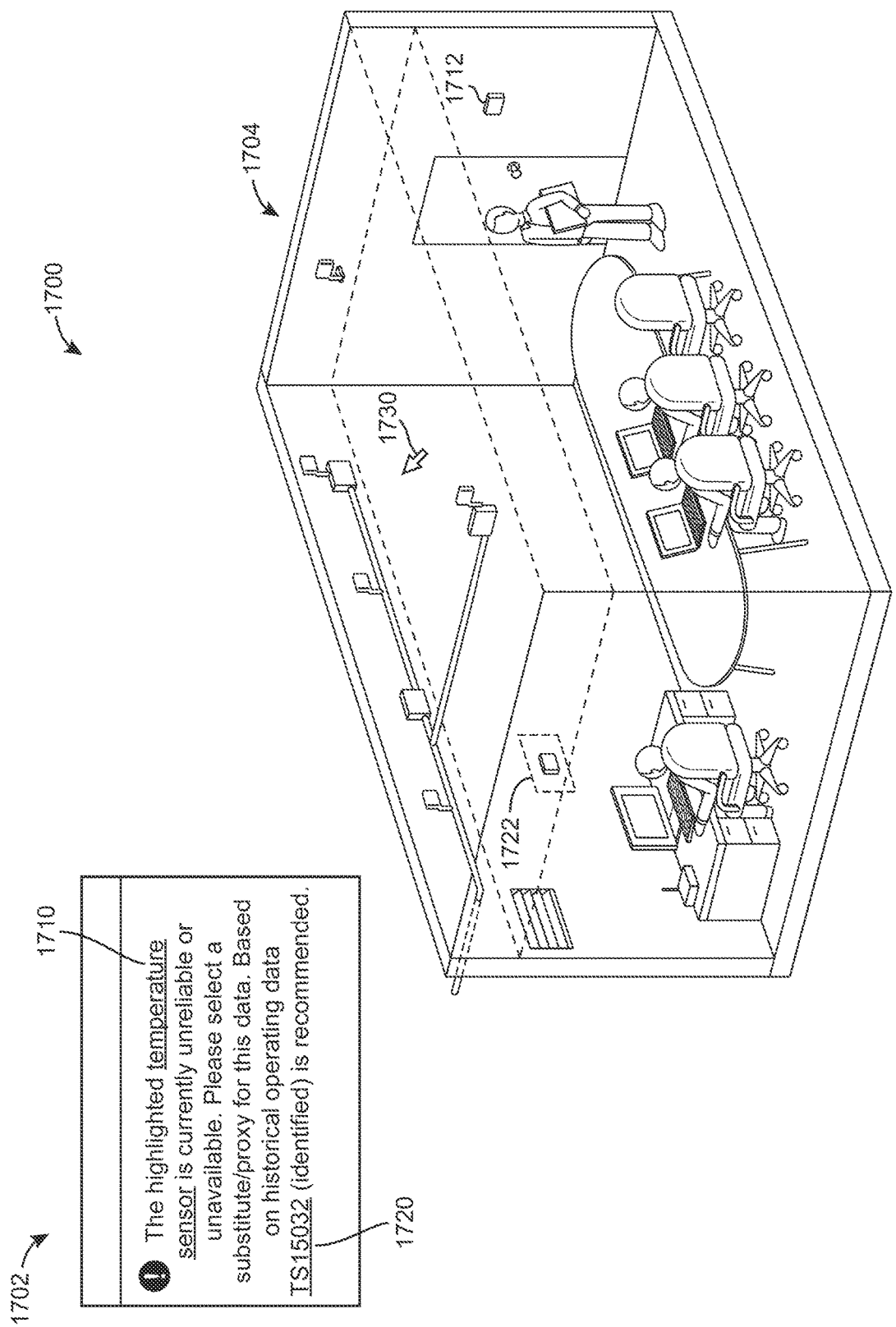
FIG. 17 is a graphical user interface for identifying a substitute/proxy for a data source, according to an exemplary embodiment.

Referring now to FIG. 17, user interface 1700 for identifying a substitute/proxy for a data source is shown, according to an exemplary embodiment. In various embodiments, cloud building management platform 140 generates user interface 1700. For example, cloud building management platform 140 may generate user interface 1700 in response to identifying a data point as unreliable (e.g., based on a confidence metric associated with the unreliable data point, etc.). In various embodiments, user interface 1700 may facilitate a user to select a substitute for data within a building model. For example, a building model may use temperature measurements associated with a space to determine future operating parameters and a temperature sensor that supplies the temperature measurements may go offline (e.g., be unplugged, malfunction, etc.) and cloud building management platform 140 may generate user interface 1700 to facilitate a user to identify an alternate source of temperature measurements that the building model may use to determine the future operating parameters (e.g., another temperature sensor in the same room as the temperature sensor that went offline, etc.). In various embodiments, user interface 1700 includes GUI 1704 representing a space such as a 3-dimensional model of a room in a building. In various embodiments, user interface 1700 includes popup 1702 identifying entity 1710 that is unreliable or unavailable. In various embodiments, entity 1710 is identified on GUI 1704 as unreliable entity 1712. In various embodiments, user interface 1700 may facilitate identifying entities in a similar space as an unreliable or unavailable entity.

In various embodiments, cloud building management platform 140 generates recommended substitute 1720. For example, cloud building management platform 140 may identify an entity sharing one or more characteristics with entity 1710 (e.g., generates the same type of data, relates to the same type of entity, is located in the same space, etc.). In various embodiments, recommended substitute 1720 is identified on GUI 1704 as identified entity 1722. In various embodiments, a user may user cursor 1730 to select (e.g., by clicking, etc.) an entity within GUI 1704 to select the entity as a replacement for entity 1710.

Figure 18:
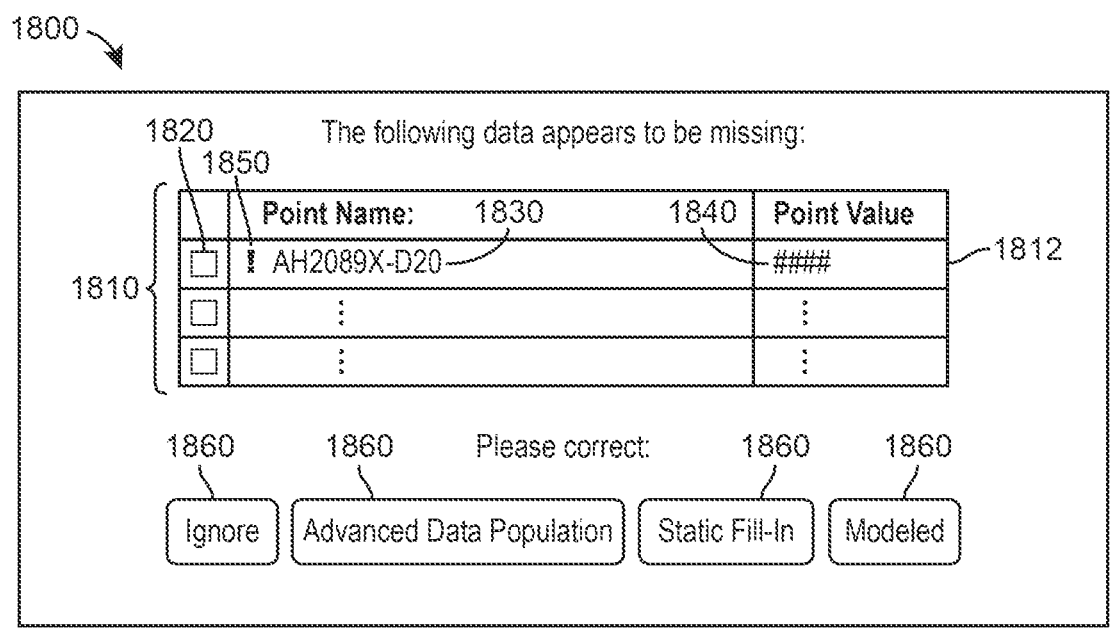
FIG. 18 is a graphical user interface for performing an action related to missing data, according to an exemplary embodiment.

Referring now to FIG. 18, user interface 1800 for performing an action related to missing data is shown, according to an exemplary embodiment. In various embodiments, cloud building management platform 140 generates user interface 1800. In various embodiments, user interface 1800 facilitates a user to perform one or more actions to fill-in missing data in a building model. For example, a building model may ingest setup data to generate one or more data points and the setup data may include a reference to timeseries sensor values associated with an entity but may be missing the sensor values and cloud building management platform 140 may facilitate a user to take one or more actions to resolve the missing data (e.g., fill in the missing data with modeled data, etc.), thereby improving the operation of the building model. In various embodiments, user interface 1800 includes point list 1810 and options 1860. In various embodiments, point list 1810 includes one or more points that are associated with missing data. For example, a data point may include a reference to timeseries sensor measurements associated with the data point and the time-series sensor measurements may be missing values for a time period and point list 1810 may include a table listing the missing values and/or the data points associated with the missing values. In various embodiments, point list 1810 includes elements 1812 having checkbox 1820, point name 1830, point value 1840, and indicator 1850.

In various embodiments, each of elements 1812 relates to a data point having missing point values (e.g., sensor measurements, etc.). Checkbox 1820 may facilitate a user to select one or more of elements 1812. For example, a user may select a number of elements 1812 using checkboxes 1820 and may select one of options 1860 to perform an action on the selected elements 1812. In various embodiments, point name 1830 includes an identifier of a data point. For example, point name 1830 may include an identifier of a piece of equipment associated with a data point. In various embodiments, point value 1840 includes a point value (if available). For example, a data point may be missing an element in a series of sensor measurements and may display values for sensor measurements that are available but display a placeholder (e.g., "####," etc.) for missing values. In some embodiments, point value 1840 displays the filled-in values. For example, a user may select for a data point to be filled-in using "Advanced data population" and point value 1840 may update to display the filled-in data generated using advanced data population. In various embodiments, indicator 1850 display additional information such as information regarding how cloud building management platform 140 generated data for point value 1840. In various embodiments, indicator 1850 is an interactive element.

In various embodiments, options 1860 are associated with a number of actions. For example, a first "Ignore" option may cause cloud building management platform 140 to ignore missing data associated with selected data points. As another example, a second "Advanced data population" option may cause cloud building management platform 140 to fill in missing data associated with selected data points using a machine learning model. As another example, a third "Static fill-in" option may cause cloud building management platform 140 to fill in missing data associated with selected data points using template data. Additionally or alternatively, cloud building management platform 140 may pull the data from a similar data point (e.g., a data point representing a similar entity, etc.). In some embodiments, cloud building management platform 140 may pull the data from historical operating information (e.g., may duplicate previous data associated with the data point to fill-in the missing portion, etc.). As another example, a fourth "Modeled" option may cause cloud building management platform 140 to fill in missing data associated with selected data points using modeled data. For example, cloud building management platform 140 may execute a machine learning model trained using historical data on any data that is available for the data point to infer the missing data.

Figure 19:
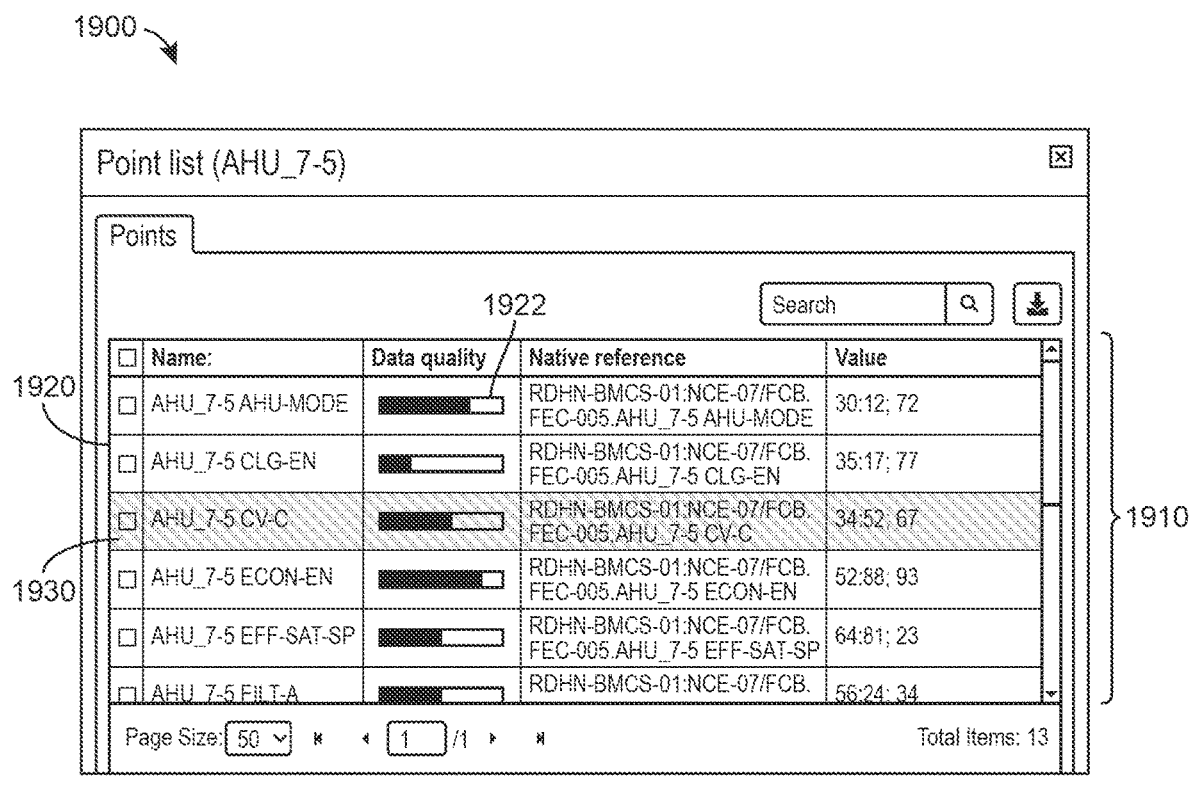

Referring now to FIG. 19, user interface 1900 for visualizing data points is shown, according to an exemplary embodiment. In various embodiments, cloud building management platform 140 generates user interface 1900. For example, cloud building management platform 140 may generate user interface 1900 to facilitate a user to review data points updated using user interface 1800. In various embodiments, user interface 1900 includes list 1910. List 1910 may include elements 1920 displaying a data point and/or additional information such as associated sensor measurements. For example, list 1910 may include a number of elements 1920 including data points associated with a particular space. In some embodiments, user interface 1900 displays elements associated with generated data as identified elements 1930. For example, user interface 1900 may highlight a data point having filled-in data generated using user interface 1800. In various embodiments, each of elements 1920 includes data quality metric 1922. Data quality metric 1922 may describe a data quality associated with a data point related to element 1920. For example, data quality metric 1922 may be an aggregate of one or more confidence metric values associated with tags of a data point associated with element 1920.

Figure 20:
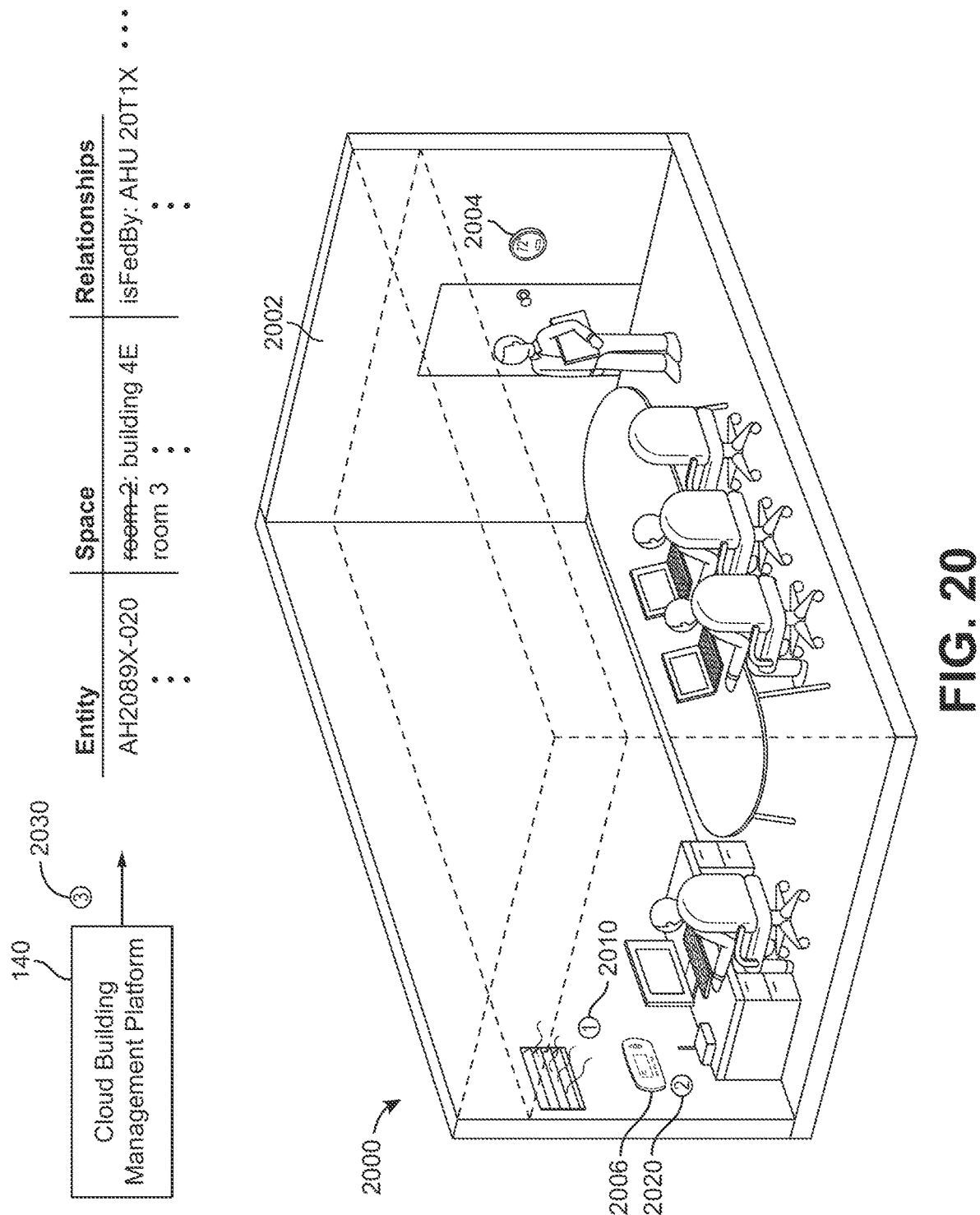
FIG. 20 is a diagram illustrating a process of dynamically verifying one or more data points, according to an exemplary embodiment.

Referring now to FIG. 20, system 2000 for dynamically verifying one or more data points in a space, shown as room 2002, is shown, according to an exemplary embodiment. In various embodiments, cloud building management platform 140 verifies one or more data points associated with room 2002. Additionally or alternatively, cloud building management platform 140 may auto-configure one or more data points associated with room 2002. For example, cloud building management platform 140 may analyze a data analytics model such as a graph data structure representing room 2002, identify information in the graph data structure that needs completing/updating, and perform one or more operations to derive information to at least partially complete and/or update the graph data structure. As a general example, cloud building management platform 140 may receive a data analytics model with a number of unlabeled sensors (e.g., sensors not associated with a specific space, etc.) and may operate one or more HVAC systems within a building while measuring operation of the number of unlabeled sensors to determine a location within the building that each of the number of unlabeled sensors is associated with. Room 2002 is shown to include thermostat 2004 and temperature sensor 2006. In some embodiments, room 2002 includes one or more users. In some embodiments, the one or more users having devices (e.g., mobile devices, etc.) that may be used to provide feedback to cloud building management platform 140.

At step 2010, cloud building management platform 140 may modify an operation of room 2002 and/or one or more entities (e.g., building assets, data points, etc.) associated with room 2002. For example, cloud building management platform 140 may modify operation of an HVAC system serving room 2002, may modify operation of one or more smart lights located in room 2002, and/or the like. In various embodiments, step 2010 modifies one or more environmental parameters associated with room 2002. For example, step 2010 may modify a temperature of room 2002, a lighting in room 2002, a sound level in room 2002, an asset within room 2002 (e.g., turning on/off a television, etc.), and/or the like.

At step 2020, cloud building management platform 140 may measure an effect of step 2010. Additionally or alternatively, cloud building management platform 140 may receive measurements from another system. Step 2020 may include receiving sensor information from one or more sensors. For example, step 2020 may include receiving a temperature measurement from at least one of thermostat 2004 and/or temperature sensor 2006.

At step 2030, cloud building management platform 140 may modify a data analytics model. For example, cloud building management platform 140 may modify a data point to replace a tag indicating that an entity is associated with "room 2" to indicate that the entity is associated with "room 3." In various embodiments, step 2030 includes analyzing received data to determine relationships between various entities. For example, cloud building management platform 140 may determine that thermostat 2004 is located in room 2002 because thermostat 2004 measured a temperature increase corresponding to what would be expected based on operation of a HVAC system during step 2010. In some embodiments, step 2030 includes generating data to fill in gaps in an existing data analytics model (e.g., a digital representation of room 2002, etc.). For example, cloud building management platform 140 may generate relationship data (e.g., a tag, etc.) describing a location of a sensor for an existing sensor that is missing a location. In various embodiments, step 2030 includes analyzing data from various sources. For example, step 2030 may include analyzing user feedback from one or more users located in a room. For example, cloud building management platform 140 may operate a HVAC system that is not linked to which rooms it serves and may receive user feedback indicating that a specific room suddenly changed temperature (or became uncomfortable, etc.) and may determine that the HVAC system serves the specific room. As another example, cloud building management platform 140 may turn on/off a television that has not been associated with a specific space in a digital representation of a building and may receive user feedback that a television in a specific room turned on/off and may determine that the television is located in the specific room. In various embodiments, step 2030 includes generating one or more nodes and/or one or more edges.

Additionally or alternatively, step 2030 may include generating one or more data health metrics. For example, cloud building management platform 140 may generate a data health metric associated with thermostat 2004 that indicates that data from thermostat 2004 may not be valid. As a brief example, cloud building management platform 140 may determine that thermostat 2004 is supposedly located in room 2002, however upon changing a temperature of room 2002, cloud building management platform 140 may only observe a change in temperature measurements from temperature sensor 2006 (e.g., and/or one or more other temperature sensors, etc.) and may determine that thermostat 2004 may be malfunctioning (e.g., not producing reliable data) and may generate a health metric associated with thermostat 2004. Additionally or alternatively, cloud building management platform 140 may determine that thermostat 2004 is in fact not located in room 2002 (e.g., which would explain why thermostat 2004 did not register a change in temperature, etc.). In various embodiments, data health metrics may be used to reduce nuisance alarms and/or prevent alarm fatigue. For example, cloud building management platform 140 may suppress alarms associated with data points having a data health metric that indicates that the data may be unreliable.

Figure 21:
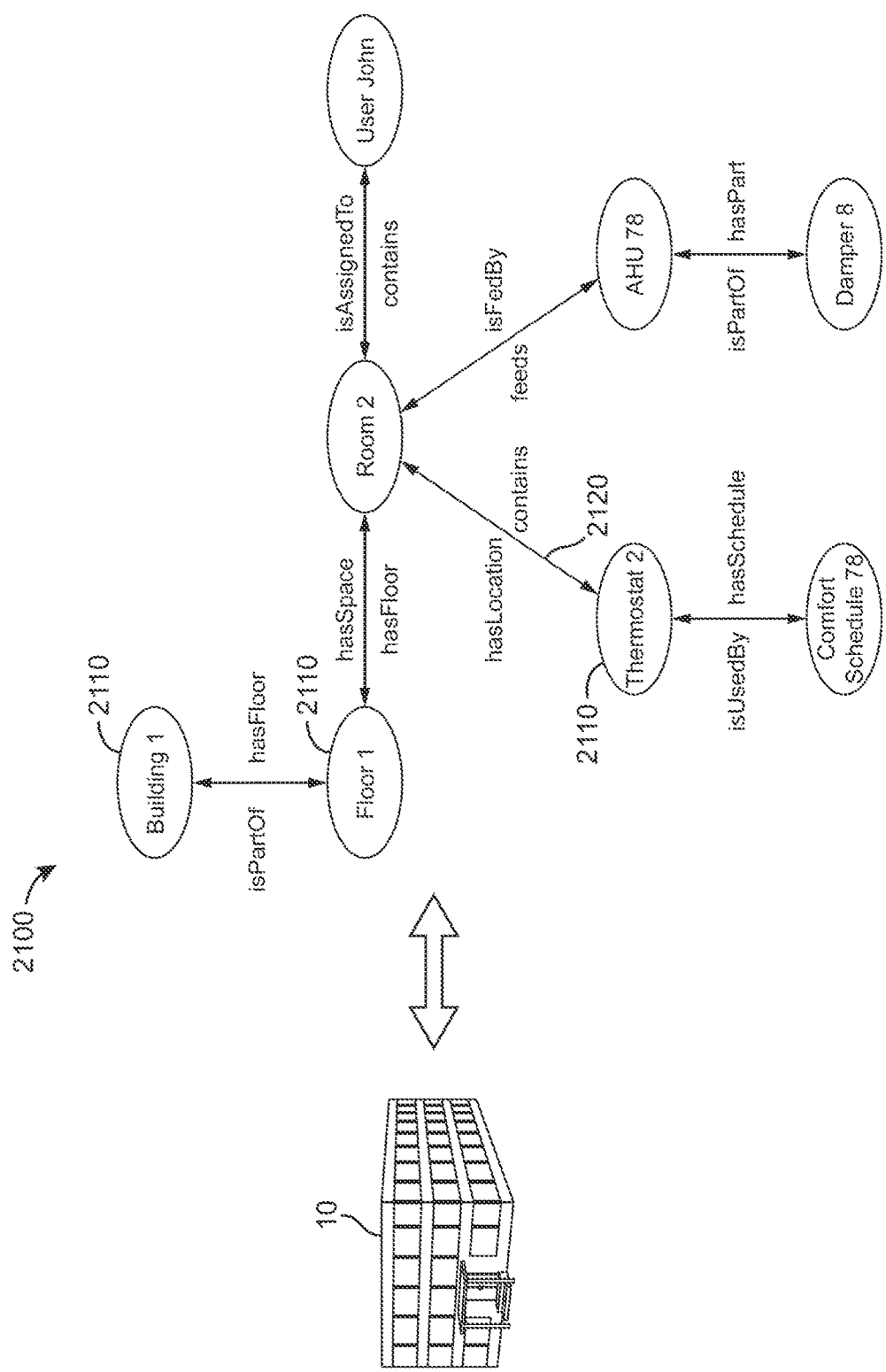
FIG. 21 is a diagram illustrating a building represented as a digital twin using a graph data structure, according to an exemplary embodiment.

Referring now to FIG. 21, entity graph 2100 is shown, according to an exemplary embodiment. In various embodiments, cloud building management platform 140 represents building 10 as entity graph 2100. For example, cloud building management platform 140 may generate a digital representation for a building and may use the digital representation as a data analytics model to perform various functions. In various embodiments, entity graph 2100 includes one or more data points having tags. For example, a data point may be represented as a node and a tag may be represented as an edge connecting two nodes. In brief overview, entity graphs such as entity graph 2100 are structured data stored in memory (e.g., a database, etc.). Entity graph 2100 may include digital twins. Digital twins may be digital representations of real world spaces, equipment, people, and/or events. In various embodiments, digital twins represent buildings, building equipment, people associated with buildings, and/or events associated with buildings (e.g., buildings 10, etc.). An entity graph may include nodes and edges, where each node of the entity graph represents an entity and each edge is directed (e.g., from a first node to a second node) and represents a relationship between entities (e.g., indicates that the entity represented by the first node has a particular relationship with the entity represented by the second node). For example, an entity graph may be used to represent a digital twin of a person.

Entities can be things and/or concepts related to spaces, people, and/or asset. For example, the entities could be "B7F4 North", "Air Handling Unit," and/or "meeting room." The nodes can represent nouns while the edges can represent verbs. For example, the edges can be "isA," "hasPart," and/or "feeds." In various embodiments, the edges represent relationships. While the nodes represent the building and its components, the edges describe how the building operates. The nodes and edges together create a digital twin of a particular building. In some embodiments, the entities include properties or attributes describing the entities (e.g., a thermostat may have a particular model number attribute). The components of the entity graph form large networks that encode semantic information for a building.

The entity graph is configured to enable flexible data modeling for advanced analytics, control, and/or artificial intelligence applications, in some embodiments. These applications may require, or benefit from information modeling including interconnected entities. Other data modeling techniques based on a table, a hierarchy, a document, and/or a relational database may not be applicable. The entity graph can be a foundational knowledge management layer to support other higher level applications, which can be, complex root cause, impact analysis, building powerful recommendation engines, product taxonomy information services, etc. Such a multilayer system, a system of system topologies, can benefit from an underlying entity graph.

The entity graph can be a data contextualization layer for all traditional and/or artificial intelligence applications. The entity graph can be configured to capture evidence that can be used to attribute the strengths of entity relationships within the entity graph, providing the applications which utilize the entity graph with context of the systems they are operating. Without context (e.g., who the user is, what the user is looking for, what the target of a user request is, e.g., find a meeting room, increase a temperature in my office) these applications may never reach their full potential. Furthermore, the entity graph provides a native data structure for constructing question and answer type systems, e.g., a chatbot, that can leverage and understand intent.

In various embodiments, the entity graph includes data from various sources. For example, the entity graph may include data associated with people, places, assets, and/or the like. In various embodiments, the data source(s) represent a heterogenous source data schema such as an open source common data model (e.g., a Brick Schema/extensions, etc.).

In various embodiments, entity graph includes digital twins and/or context information. A digital twin is a digital representation of spaces, assets, people, events, and/or anything associated with a building or operation thereof. In various embodiments, digital twins are modeled in the entity graph. In various embodiments, digital twins include an active compute process. For example, a digital twin may communicate with other digital twins to sense, predict and act. In various embodiments, digital twins are generated dynamically. For example, a digital twin corresponding to a conference room may update its status by looking at occupancy sensors or an electronic calendar (e.g., to turn its status "available" if there is no show, etc.). In various embodiments, digital twins and/or the entity graph include context information. Context information may include real-time data and a historical record of each system in the environment (e.g., campus, building, facility, space, etc.). Context information may be stored in the entity graph. In various embodiments, context information facilitates flexible data modeling for advanced analytics and AI application in scenarios that model highly interconnected entities.

The entity graph may not be a configuration database but may be a dynamic representation of a space, person, event, and the like. The entity graph can include operational data from entities which it represents, e.g., sensors, actuators, card access systems, occupancy of a particular space, thermodynamics of the space as a result of actuation, etc. The entity graph can be configured to continually, and/or periodically, ingest new data of the space and thus the entity graph can represent a near real-time status of cyber-physical entities and their inter-relationships. For this reason, artificial intelligence can be configured to introduce a virtual entity and new semantic relationships among entities, in some embodiments.

The entity graph is configured to facilitate adaptive controls, in some embodiments. The entity graph can be configured to adapt and learn over time. The entity graph can be configured to enable dynamic relationships between building information and other facility and enterprise systems to create new insights and drive new optimization capabilities for artificial intelligence systems. As relationships can be learned over time for the entity graph, the artificial intelligence systems and also learn overtime based on the entity graph. Entity graphs (e.g., space graphs, etc.) are described in greater detail with reference to U.S. patent application Ser. No. 16/260,078, filed on Jan. 28, 2019, the entire disclosure of which is incorporated by reference herein.

Entity graph 2100 includes entities 2110 (stored as nodes within entity graph 2100) describing spaces, equipment, events, and people (e.g., business employees, etc.). In various embodiments, entities 2110 are associated with or otherwise include agents (e.g., agents may be assigned to/associated with entities, etc.). Additionally or alternatively, agents may be represented as nodes in entity graph 2100 (e.g., agent entities, etc.). Furthermore, edges 2120 are shown between entities 2110 directionally describing relationships between two of entities 2110 (stored as edges within entity graph 2100). In various embodiments, cloud building management platform 140 may traverse entity graph 2100 to retrieve a description of what types of actions to take for a certain device, what the current status of a room is (e.g., occupied or unoccupied), etc.

As an example, entity graph 2100 illustrates a building called "Building 1." Building 1 has a directional relationship to a floor called "Floor 1." The relationship may be an edge "hasFloor" indicating that the building (e.g., the building represented by entity 2110) has a floor (e.g., the floor represented by entity 2110). Furthermore, a second edge "isPartOf" from Floor 1 to Building 1 indicates that the floor (e.g., the floor represented by entity 2110) is part of Building 1 (e.g., the building represented by entity 2110).

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

The term "client or "server" include all kinds of apparatus, devices, and machines for processing data, including by way of example a programmable processor, a computer, a system on a chip, or multiple ones, or combinations, of the foregoing. The apparatus may include special purpose logic circuitry, e.g., a field programmable gate array (FPGA) or an application specific integrated circuit (ASIC). The apparatus may also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment may realize various different computing model infrastructures, such as web services, distributed computing and grid computing infrastructures.

The systems and methods of the present disclosure may be completed by any computer program. A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform actions by operating on input data and generating output. The processes and logic flows may also be performed by, and apparatus may also be implemented as, special purpose logic circuitry (e.g., an FPGA or an ASIC).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data (e.g., magnetic, magneto-optical disks, or optical disks). However, a computer need not have such devices. Moreover, a computer may be embedded in another device (e.g., a mobile telephone, a personal digital assistant (PDA), a mobile audio or video player, a game console, a Global Positioning System (GPS) receiver, or a portable storage device (e.g., a universal serial bus (USB) flash drive), etc.). Devices suitable for storing computer program instructions and data include all forms of non-volatile memory, media and memory devices, including by way of example semiconductor memory devices (e.g., EPROM, EEPROM, and flash memory devices; magnetic disks, e.g., internal hard disks or removable disks; magneto-optical disks; and CD ROM and DVD-ROM disks). The processor and the memory may be supplemented by, or incorporated in, special purpose logic circuitry.

In various implementations, the steps and operations described herein may be performed on one processor or in a combination of two or more processors. For example, in some implementations, the various operations could be performed in a central server or set of central servers configured to receive data from one or more devices (e.g., edge computing devices/controllers) and perform the operations. In some implementations, the operations may be performed by one or more local controllers or computing devices (e.g., edge devices), such as controllers dedicated to and/or located within a particular building or portion of a building. In some implementations, the operations may be performed by a combination of one or more central or offsite computing devices/servers and one or more local controllers/computing devices. All such implementations are contemplated within the scope of the present disclosure. Further, unless otherwise indicated, when the present disclosure refers to one or more computer-readable storage media and/or one or more controllers, such computer-readable storage media and/or one or more controllers may be implemented as one or more central servers, one or more local controllers or computing devices (e.g., edge devices), any combination thereof, or any other combination of storage media and/or controllers regardless of the location of such devices.

To provide for interaction with a user, implementations of the subject matter described in this specification may be implemented on a computer having a display device (e.g., a CRT (cathode ray tube), LCD (liquid crystal display), OLED (organic light emitting diode), TFT (thin-film transistor), or other flexible configuration, or any other monitor for displaying information to the user and a keyboard, a pointing device, e.g., a mouse, trackball, etc., or a touch screen, touch pad, etc.) by which the user may provide input to the computer. Other kinds of devices may be used to provide for interaction with a user as well; for example, feedback provided to the user may be any form of sensory feedback (e.g., visual feedback, auditory feedback, or tactile feedback), and input from the user may be received in any form, including acoustic, speech, or tactile input. In addition, a computer may interact with a user by sending documents to and receiving documents from a device that is used by the user; for example, by sending web pages to a web browser on a user's client device in response to requests received from the web browser.

Implementations of the subject matter described in this disclosure may be implemented in a computing system that includes a back-end component (e.g., as a data server), or that includes a middleware component (e.g., an application server), or that includes a front end component (e.g., a client computer) having a graphical user interface or a web browser through which a user may interact with an implementation of the subject matter described in this disclosure, or any combination of one or more such back end, middleware, or front end components. The components of the system may be interconnected by any form or medium of digital data communication (e.g., a communication network). Examples of communication networks include a LAN and a WAN, an inter-network (e.g., the Internet), and peer-to-peer networks (e.g., ad hoc peer-to-peer networks).

The present disclosure may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated. Further, features or aspects within each example embodiment should typically be considered as available for other similar features or aspects in other example embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. A system for providing a data analytics model for a building, comprising:
   one or more processing circuits each including one or more processors and memories, the memories having instructions stored thereon that, when executed by the one or more processors, cause the one or more processing circuits to:
   generate one or more tags for at least a portion of a first plurality of data points associated with the building based on context data associated with the first plurality of data points;
   determine that at least one data point of the first plurality of data points satisfies a manual review condition;
   generate, responsive to determining that the at least one data point satisfies the manual review condition, one or more suggested tags for the at least one data point;
   receive feedback from a manual review; and
   generate one or more second tags for a second plurality of data points based on the feedback from the manual review.

2. The system of claim 1, wherein generating the one or more tags for at least the portion of the first plurality of data points includes executing a machine learning model trained using historical information on the context data.

3. The system of claim 1, wherein the instructions further cause the one or more processing circuits to retrieve descriptive data describing an entity and analyze the descriptive data to extract semantic information from the descriptive data.

4. The system of claim 1, wherein the instructions further cause the one or more processing circuits to perform signal analysis on operational data associated with a first data point of the first plurality of data points to determine a validity of a tag associated with the first data point.

5. The system of claim 1, wherein the instructions further cause the one or more processing circuits to generate a confidence metric describing a likelihood that a suggested tag of the one or more suggested tags is valid and provide the confidence metric with the suggested tag for review.

6. The system of claim 5, wherein the instructions further cause the one or more processing circuits to compare the confidence metric to a threshold and tag the at least one data point of the first plurality of data points based on the comparison.

7. The system of claim 5, wherein the instructions further cause the one or more processing circuits to compare the confidence metric to a threshold and identify the at least one data point of the first plurality of data points based on the comparison.

8. The system of claim 1, wherein the feedback includes a manual adjustment of information associated with the one or more suggested tags.

9. The system of claim 1, wherein the feedback includes a selection of a tag of the one or more suggested tags.

10. The system of claim 9, wherein the instructions further cause the one or more processing circuits to increase a confidence metric describing a likelihood that the tag of the one or more suggested tags is valid based on the selection.

11. The system of claim 1, wherein the instructions further cause the one or more processing circuits to generate the one or more suggested tags using a machine learning model and to update the machine learning model responsive to the feedback from the manual review.

12. The system of claim 1, wherein generating the one or more suggested tags includes (i) dynamically controlling an environmental variable of the building, (ii) monitoring sensor measurements, and (iii) generating the one or more suggested tags based on the monitored sensor measurements.

13. The system of claim 1, wherein the instructions further cause the one or more processing circuits to validate at least one of the one or more tags by (i) dynamically controlling an environmental variable of the building, (ii) monitoring sensor measurements, and (iii) determining a validity of the at least one of the one or more tags based on the monitored sensor measurements.

14. The system of claim 1, wherein the instructions further cause the one or more processing circuits to identify a first data point of at least one of the first or second plurality of data points as unreliable and identify a second data point of at least one of the first or second plurality of data points as a substitute for the first data point to control of a piece of building equipment or assess operation of at least a portion of the building.

15. The system of claim 14, wherein the instructions further cause the one or more processing circuits to generate a data health metric describing a validity of at least a portion of the first or second plurality of data points, the data health metric determined based in part on identifying the first data point as unreliable.

16. The system of claim 14, wherein the instructions further cause the one or more processing circuits to suppress an alarm relating to the unreliable first data point.

17. The system of claim 1, wherein the instructions further cause the one or more processing circuits to:
identify an anomaly associated with a first data point of at least one of the first or second plurality of data points; and
determine a cause of the anomaly, the cause comprising at least one of an incorrect tag, a device fault, an unexpected configuration, or a change in at least one of a space of the building or a use of the space.

18. The system of claim 17, wherein the instructions further cause the one or more processing circuits to at least one of (i) automatically update the incorrect tag or (ii) automatically update a device configuration of a device associated with the first data point to address the anomaly.

19. The system of claim 17, wherein determining the cause of the anomaly includes prompting a user to review a tag associated with the first data point.

20. The system of claim 1, wherein the instructions further cause the one or more processing circuits to:
identify, from the first plurality of data points, one or more devices that are correctly tagged;
modify operation of the one or more devices;
monitor sensor measurements associated with a data point that is affected by the modified operation of the one or more devices; and
determine a new suggested tag for the data point based on the monitored sensor measurements.

\* \* \* \* \*